(12) United States Patent
Kumazawa et al.

(10) Patent No.: US 12,516,139 B2
(45) Date of Patent: Jan. 6, 2026

(54) RESIN COMPOSITION, RESIN SHEET, MULTILAYER PRINTED WIRING BOARD, AND SEMICONDUCTOR DEVICE

(71) Applicant: MITSUBISHI GAS CHEMICAL COMPANY, INC., Tokyo (JP)

(72) Inventors: Yune Kumazawa, Tokyo (JP); Takuya Suzuki, Tokyo (JP); Shunsuke Katagiri, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 255 days.

(21) Appl. No.: 18/567,523

(22) PCT Filed: Jun. 14, 2022

(86) PCT No.: PCT/JP2022/023705
§ 371 (c)(1),
(2) Date: Dec. 6, 2023

(87) PCT Pub. No.: WO2022/264984
PCT Pub. Date: Dec. 22, 2022

(65) Prior Publication Data
US 2024/0287219 A1    Aug. 29, 2024

(30) Foreign Application Priority Data

Jun. 15, 2021 (JP) .................. 2021-099110

(51) Int. Cl.
*C08F 22/40* (2006.01)
*B32B 15/08* (2006.01)
(Continued)

(52) U.S. Cl.
CPC .............. *C08F 22/40* (2013.01); *B32B 15/08* (2013.01); *B32B 27/281* (2013.01); *G03F 7/029* (2013.01);
(Continued)

(58) Field of Classification Search
CPC .......... C08F 22/40; C08F 2/50; C08F 222/40; B32B 15/08; B32B 27/281;
(Continued)

(56) References Cited

U.S. PATENT DOCUMENTS

2013/0188270 A1* 7/2013 Nishimae ............... G02B 5/223
430/7
2016/0214966 A1* 7/2016 Kunimoto ............... G03F 7/033
(Continued)

FOREIGN PATENT DOCUMENTS

CN          106569389 A      4/2017
JP          2015-229734 A   12/2015
(Continued)

OTHER PUBLICATIONS

International Search Report issued in International Patent Application No. PCT/JP2022/023705, dated Aug. 23, 2023, along with an English translation thereof.
(Continued)

*Primary Examiner* — John D Freeman
(74) *Attorney, Agent, or Firm* — GREENBLUM & BERNSTEIN, P.L.C.

(57) ABSTRACT

An object of the present invention is to provide a resin composition which has excellent photocurability for various active energy rays, in particular, an active energy ray including an h-line at a wavelength of 405 nm, without inhibiting photocuring reaction in an exposure step, and can confer excellent alkaline developability in a development step, when used in the fabrication of a multilayer printed wiring board; and a resin sheet, a multilayer printed wiring board, and a semiconductor device. The resin composition of the present invention is a resin composition containing: a maleimide compound (A) containing a constituent unit represented by the formula (1), and maleimide groups at both ends of the molecular chain; a photo initiator (B1) represented by the formula (2) and/or a photo initiator (B2) represented by the formula (3); and a photo initiator (C) represented by the formula (4):

(Continued)

-continued

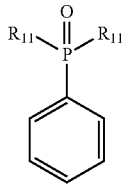
(4)

8 Claims, 5 Drawing Sheets

(51) Int. Cl.
 *B32B 27/28* (2006.01)
 *G03F 7/029* (2006.01)
 *G03F 7/031* (2006.01)
 *H05K 1/03* (2006.01)
 *H05K 3/46* (2006.01)
(52) U.S. Cl.
 CPC .............. *G03F 7/031* (2013.01); *H05K 1/03* (2013.01); *H05K 1/0346* (2013.01); *H05K 3/46* (2013.01); *B32B 2307/206* (2013.01); *B32B 2457/08* (2013.01); *H05K 1/0373* (2013.01)
(58) Field of Classification Search
 CPC .......... B32B 2307/206; B32B 2457/08; B32B 27/34; G03F 7/029; G03F 7/031; G03F 7/027; H05K 1/03; H05K 1/0346; H05K 3/46; H05K 1/0373; C09D 4/00
 See application file for complete search history.

(56) References Cited

U.S. PATENT DOCUMENTS

| | | |
|---|---|---|
| 2019/0281697 A1 | 9/2019 | Abe et al. |
| 2019/0309130 A1 | 10/2019 | Nagai et al. |
| 2020/0225576 A1 | 7/2020 | Okawara et al. |
| 2020/0356003 A1 | 11/2020 | Kitajima et al. |
| 2022/0204694 A1 | 6/2022 | Kumazawa et al. |
| 2022/0204695 A1 | 6/2022 | Kumazawa et al. |
| 2023/0057045 A1 | 2/2023 | Katagiri et al. |
| 2023/0066153 A1 | 3/2023 | Kumazawa et al. |

FOREIGN PATENT DOCUMENTS

| | | |
|---|---|---|
| JP | 2019-45742 A | 3/2019 |
| JP | 2020-52071 A | 4/2020 |
| WO | 2017/149563 A1 | 9/2017 |
| WO | 2018/037913 A1 | 3/2018 |
| WO | 2018/056466 A1 | 3/2018 |
| WO | 2019/065476 A1 | 4/2019 |
| WO | 2019/167886 A1 | 9/2019 |
| WO | 2020/262577 A1 | 12/2020 |
| WO | 2020/262579 A1 | 12/2020 |
| WO | 2021/117760 A1 | 6/2021 |
| WO | 2021/117762 A1 | 6/2021 |

OTHER PUBLICATIONS

Written Opinion of the International Searching Authority issued in International Patent Application No. PCT/JP2022/023705, dated Aug. 23, 2023, along with an English translation thereof.

\* cited by examiner

RESIN COMPOSITION, RESIN SHEET, MULTILAYER PRINTED WIRING BOARD, AND SEMICONDUCTOR DEVICE

TECHNICAL FIELD

The present invention relates to a resin composition, and a resin sheet, multilayer printed wiring board, and semiconductor device.

BACKGROUND ART

Due to the downsizing and densification of multilayer printed wiring boards, studies to make the laminate used for multilayer printed wiring boards thinner have been actively carried out. Along with the thinning, the insulation layer also needs to be made thinner, and a resin sheet not containing glass cloth has been demanded. The resin composition used as the material of the insulation layer is mainly a thermosetting resin, and drilling of holes between insulation layers to obtain conduction is generally carried out by laser processing.

Meanwhile, the drilling of holes by laser processing has a problem that the processing time becomes longer as the number of holes in a high density substrate becomes larger. In recent years, therefore, there has been a demand for a resin sheet that enables batch drilling in the exposure and development steps by using a resin composition in which an exposed portion is cured by irradiation of rays of light or the like (exposure step) and an unexposed portion can be removed (development step).

As the method of exposure, a method in which a mercury lamp is used as a light source and the exposure is carried out via a photomask is used. A material which can be suitably exposed in the method using a mercury lamp as a light source has been demanded. In the exposure method using a mercury lamp as a light source, a ghi-line (a g-line with a wavelength of 436 nm, an h-line with a wavelength of 405 nm and an i-line with a wavelength of 365 nm) or the like is used, and a general-purpose photo initiator can be selected. Also, in recent years, the introduction of a direct imaging method, in which a pattern is directly drawn on the photosensitive resin composition layer without using a photomask, based on digital data of the pattern, has also been progressing as the exposure method. Since this direct imaging method provides better alignment accuracy than the exposure method using a photomask and produces a more detailed pattern, the introduction of this method has been progressing, especially for substrates that require the formation of high density wiring. The light source for this method is a monochromatic light source such as a laser, and in particular, a light source with a wavelength of 405 nm (h-line) is used in devices based on the DMD (Digital Micromirror Device) system, which is capable of forming highly detailed resist patterns.

As a development method, alkaline development is employed because a highly detailed pattern can be obtained.

Patent Document 1 describes a resin composition containing a bismaleimide compound (a curable resin) and a photo radical polymerization initiator (a curing agent) as a photosensitive resin composition for use in laminates or resin sheets.

Patent Document 2 describes a resin composition containing a curable resin such as an epoxy resin and a polyvalent carboxy group-containing compound obtained by reacting bismaleimide with a monoamine, and then reacting an acid anhydride. Patent Document 2 describes a polyvalent carboxy group-containing compound which enables production of a cured product having alkaline-developability.

CITATION LIST

Patent Document

Patent Document 1: International Publication No. WO 2018/56466 (A1)
Patent Document 2: Japanese Patent Laid-Open No. 2015-229734

SUMMARY OF INVENTION

Technical Problem

However, in Patent Document 1, a bismaleimide compound is used as a curable resin, but since the maleimide compound normally has poor light transmissivity, when the maleimide compound is contained, light does not reach the photo initiator sufficiently, the photo initiator has difficulty generating radicals, and its reactivity is very low. Patent Document 1 makes no mention about use of a light source capable of applying an active energy ray including a wavelength of 405 nm (h-line). An additional problem of Patent Document 1 is a low degree of curing due to low h-line transmissivity of a maleimide compound when photocuring is performed using an active energy ray including an h-line at a wavelength of 405 nm. Therefore, in Patent Document 1, the maleimide compound is cured by additional heating before development, and highly detailed resist patterns cannot be obtained because heating is performed. Since originally, the resin composition described in Patent Document 1 does not have sufficient alkaline-developability, an unexposed resin composition remains even after development. Therefore, from this standpoint as well, in Patent Document 1, a highly detailed resist pattern cannot be obtained, and the resin composition cannot be used for production of high density printed wiring boards.

Since a polyvalent carboxy group-containing compound described in Patent Document 2 needs to be obtained through the reaction of bismaleimide with monoamine followed by the reaction of an acid anhydride, the process is complicated. In addition, an aromatic amine compound is used as the monoamine, and therefore the polyvalent carboxy group-containing compound contains an amide group having an aromatic ring in the structure thereof. Thus, the polyvalent carboxy group-containing compound is poor in light transmissivity, hinders photocuring reaction, and is therefore difficult to use for photosensitive resin compositions in reality.

The present invention has been made in view of such problems of the conventional techniques, and an object of the present invention is to provide a resin composition which has excellent photocurability for various active energy rays, in particular, an active energy ray including an h-line at a wavelength of 405 nm, without inhibiting photocuring reaction in an exposure step, and can confer excellent alkaline developability in a development step, when used in the fabrication of a multilayer printed wiring board; and a resin sheet, a multilayer printed wiring board, and a semiconductor device.

Solution to Problem

As a result of intensive studies, the present inventors have found that a resin composition and a resin sheet containing a particular maleimide compound (A), a particular photo initiator (B), and a particular photo initiator (C) have excellent photocurability for various active energy rays, in particular, an active energy ray including an h-line at a wavelength of 405 nm, in an exposure step, and can confer excellent alkaline developability in a development step, in the fabrication of a multilayer printed wiring board; and use thereof produces a high density printed wiring board and semiconductor device having a highly detailed resist pattern, leading to completion of the present invention.

More specifically, the present invention includes the following contents.

[1] A resin composition containing:
  a maleimide compound (A) containing a constituent unit represented by the following formula (1), and maleimide groups at both ends of the molecular chain;
  a photo initiator (B1) represented by the following formula (2) and/or a photo initiator (B2) represented by the following formula (3); and
  a photo initiator (C) represented by the following formula (4):

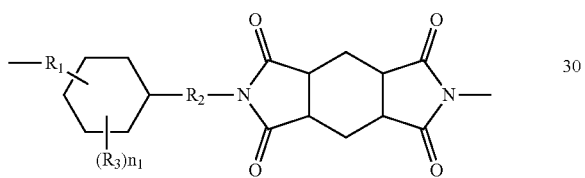

(1)

wherein $R_1$ represents a linear or branched alkylene group having 1 to 16 carbon atoms, or a linear or branched alkenylene group having 2 to 16 carbon atoms; $R_2$ represents a linear or branched alkylene group having 1 to 16 carbon atoms, or a linear or branched alkenylene group having 2 to 16 carbon atoms; each $R_3$ independently represents a hydrogen atom, a linear or branched alkyl group having 1 to 16 carbon atoms, or a linear or branched alkenyl group having 2 to 16 carbon atoms; and each $n_1$ independently represents an integer of 1 to 10, and

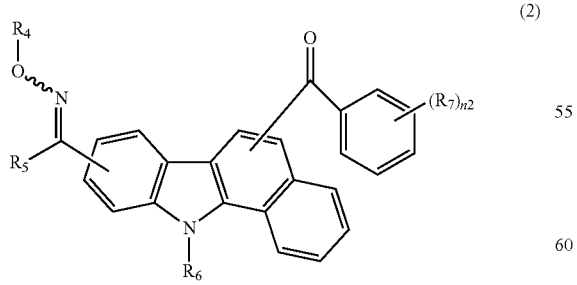

(2)

wherein $R_4$ represents an acetyl group or a benzoyl group; $R_5$ represents a phenyl group or naphthyl group optionally having a substituent; $R_6$ represents a hydrogen atom, or a linear or branched alkyl group having 1 to 16 carbon atoms and optionally having a substituent; each $R_7$ independently represents a hydrogen atom, or a linear or branched alkyl group having 1 to 6 carbon atoms and optionally having a substituent; and each $n_2$ independently represents an integer of 1 to 5,

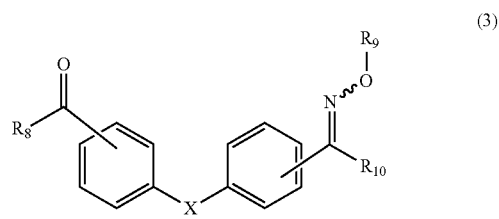

(3)

wherein $R_8$ represents an aryl group having 6 to 24 carbon atoms and optionally having a substituent, or a heteroaryl group having 3 to 24 carbon atoms and optionally having a substituent; $R_9$ represents an acetyl group or a benzoyl group; $R_{10}$ represents a hydrogen atom, or a linear or branched alkyl group having 1 to 16 carbon atoms and optionally having a substituent; and X represents an oxygen atom or a sulfur atom,

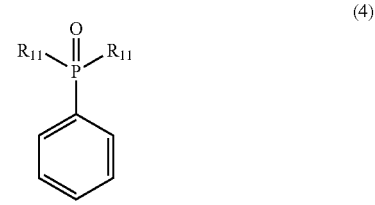

(4)

wherein each $R_{11}$ independently represents a group represented by the following formula (5) or a phenyl group:

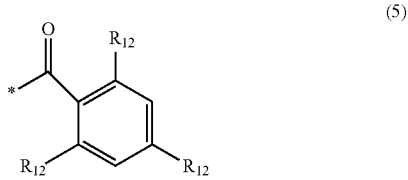

(5)

wherein —* represents a bonding hand, and each $R_{12}$ independently represents a hydrogen atom or a methyl group.

[2] The resin composition according to [1], further containing a compound (D) containing one or more carboxy groups.

[3] The resin composition according to [2], wherein the compound (D) containing one or more carboxy groups contains a compound represented by the following formula (6):

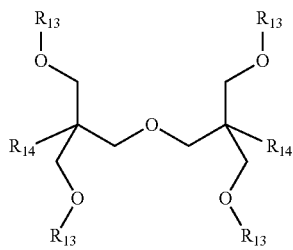

(6)

wherein each $R_{13}$ independently represents a group represented by the following formula (7) or a hydrogen atom; and each $R_{14}$ independently represents a hydrogen atom, or a linear or branched alkyl group having 1 to 6 carbon atoms, provided that at least one $R_{13}$ is a group represented by the following formula (7):

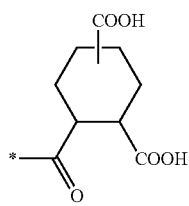

(7)

wherein —* represents a bonding hand.

[4] The resin composition according to any of [1] to [3], further containing at least one maleimide compound (E) selected from the group consisting of a compound represented by the following formula (8), a compound represented by the following formula (9), a compound represented by the following formula (10), a compound represented by the following formula (11), a compound represented by the following formula (12), and a compound represented by the following formula (13):

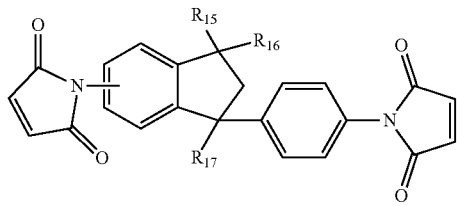

(8)

wherein each of $R_{15}$, $R_{16}$, and $R_{17}$ independently represents a hydrogen atom, or a linear or branched alkyl group having 1 to 8 carbon atoms and optionally having a substituent,

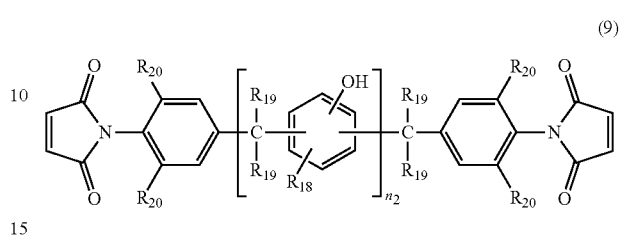

(9)

wherein each of $R_{18}$, $R_{19}$, and $R_{20}$ independently represents a hydrogen atom, a hydroxy group, or a linear or branched alkyl group having 1 to 6 carbon atoms and optionally having a substituent; and $n_2$ represents an integer of 1 to 10,

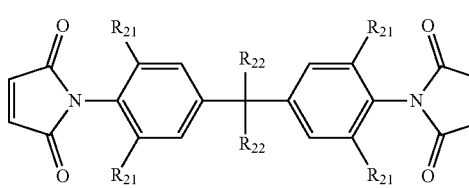

(10)

wherein each $R_{21}$ independently represents a hydrogen atom, a methyl group, or an ethyl group; and each $R_{22}$ independently represents a hydrogen atom or a methyl group,

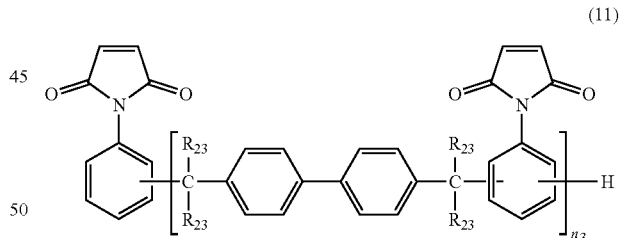

(11)

wherein each $R_{23}$ independently represents a hydrogen atom or a methyl group; and $n_3$ represents an integer of 1 to 10,

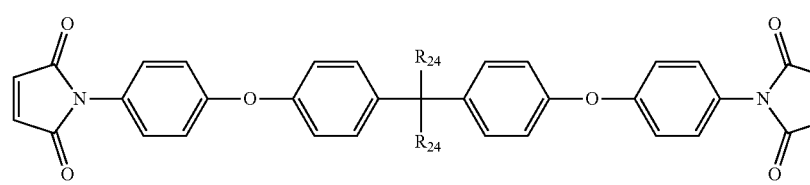

(12)

wherein each $R_{24}$ independently represents a hydrogen atom, a methyl group, or an ethyl group,

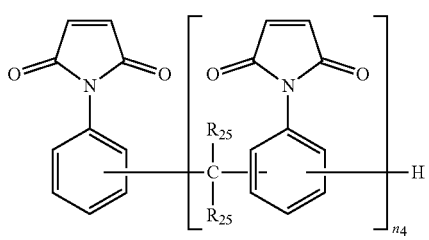

(13)

wherein each $R_{25}$ independently represents a hydrogen atom or a methyl group; and $n_4$ represents an integer of 1 to 10.

[5] A resin sheet containing:
a support; and
a resin layer disposed on one surface or both surfaces of the support,
wherein the resin layer contains the resin composition according to any of [1] to [4].

[6] The resin sheet according to [5], wherein the resin layer has a thickness of 1 to 50 μm.

[7] A multilayer printed wiring board containing:
an insulation layer; and
a conductor layer formed on one surface or both surfaces of the insulation layer,
wherein the insulation layer contains the resin composition according to any of [1] to [4].

[8] A semiconductor device containing the resin composition according to any of [1] to [4].

Advantageous Effects of Invention

The resin composition and the resin sheet of the present invention have excellent photocurability for various active energy rays, in particular, an active energy ray including an h-line at a wavelength of 405 nm, in an exposure step, and can confer excellent alkaline developability in a development step, in the fabrication of a multilayer printed wiring board, and use thereof can provide a high density printed wiring board and semiconductor device having a highly detailed resist pattern.

DESCRIPTION OF EMBODIMENTS

Figure 1:
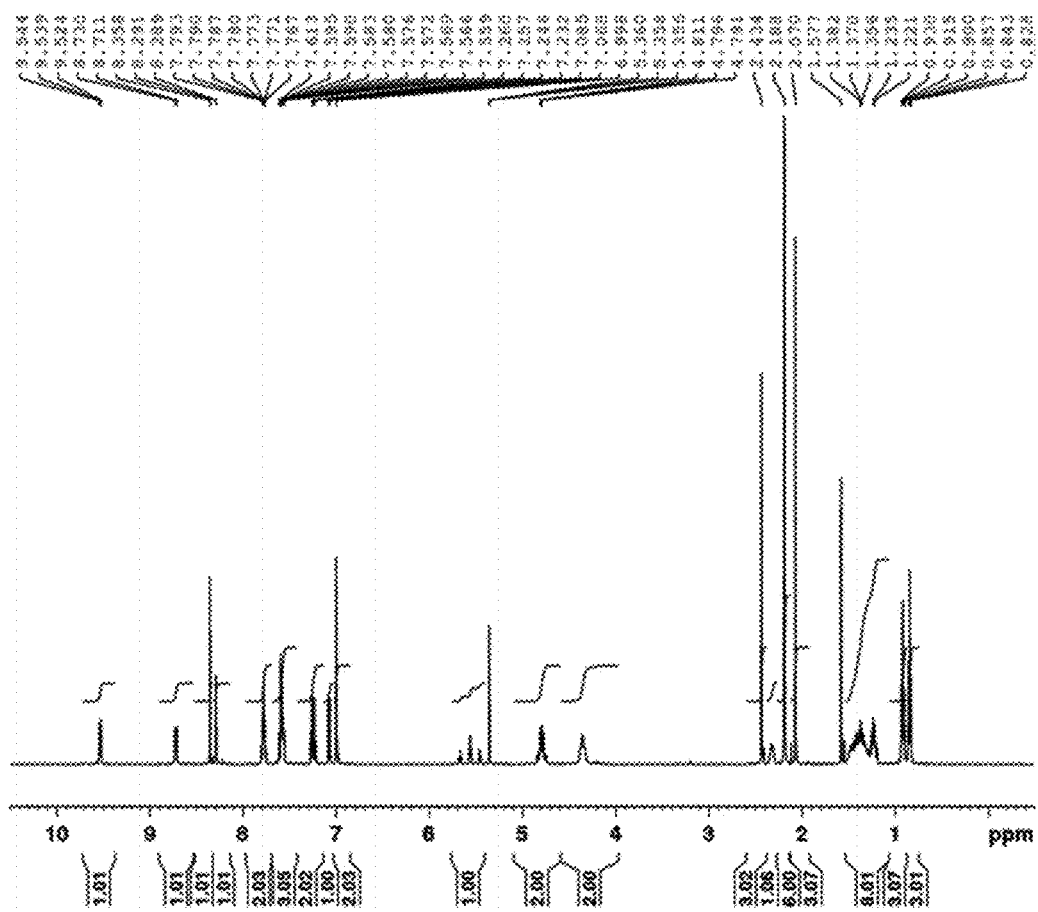
FIG. 1 shows a $^1$H-NMR chart of a photo initiator (B1A) obtained in Synthesis Example 1.

Hereinafter, an embodiment for carrying out the present invention (hereinafter, referred to as the "present embodiment") will be described in detail. The present embodiment described below is only illustrative of the present invention and is not intended to limit the present invention to the contents of the following description. The present invention can be carried out with appropriate modifications falling within the gist of the invention.

Note that, in the present specification, the term "(meth) acryl" refers to both "acryl" and "methacryl" corresponding thereto. In the present specification, the term "resin solid content" or "resin solid content in a resin composition" refers to components except for a photo initiator (B1), a photo initiator (B2), a photo initiator (C), a compound (D) containing one or more carboxy groups, an additive, a solvent, and a filler in the resin composition, and the term "100 parts by mass of the resin solid content" refers to 100 parts by mass in total of components except for a photo initiator (B1), a photo initiator (B2), a photo initiator (C), a compound (D) containing one or more carboxy groups, an additive, an organic solvent, and a filler in the resin composition, unless otherwise specified.

In the present specification, Mw refers to a mass average molecular weight, Mn refers to a number average molecular weight, and Mw/Mn refers to a molecular weight distribution. Mw, Mn, and Mw/Mn can be determined in terms of polystyrene standard by a gel permeation chromatography (GPC) method.

[Resin Composition]

The resin composition of the present embodiment contains a maleimide compound (A) containing a constituent unit represented by the formula (1), and maleimide groups at both ends of the molecular chain (also referred to as a component (A) or a bismaleimide compound (A)); a photo initiator (B1) represented by the formula (2) (also referred to as a component (B1) or an initiator (B1)) and/or a photo initiator (B2) represented by the following formula (3) (also referred to as a component (B2) or an initiator (B2)); and a photo initiator (C) represented by the formula (4) (also referred to as a component (C) or an initiator (C)). The resin composition of the present embodiment contains a particular bismaleimide compound (A), initiator (B1) and/or initiator (B2), and initiator (C) and is suitably used in the fabrication of a multilayer printed wiring board. The resin composition used has excellent photocurability for various active energy rays, in particular, an active energy ray including an h-line at a wavelength of 405 nm, in an exposure step, and can confer excellent alkaline developability in a development step, in the fabrication of a multilayer printed wiring board.

[Bismaleimide Compound (A)]

The resin composition of the present embodiment contains a maleimide compound (A) containing a constituent unit represented by the formula (1), and maleimide groups at both ends of the molecular chain.

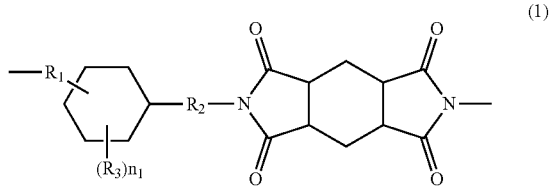

(1)

In the formula (1), $R_1$ represents a linear or branched alkylene group having 1 to 16 carbon atoms, or a linear or branched alkenylene group having 2 to 16 carbon atoms. $R_2$ represents a linear or branched alkylene group having 1 to 16 carbon atoms, or a linear or branched alkenylene group having 2 to 16 carbon atoms. Each $R_3$ independently represents a hydrogen atom, a linear or branched alkyl group having 1 to 16 carbon atoms, or a linear or branched alkenyl group having 2 to 16 carbon atoms. Each $n_1$ independently represents an integer of 1 to 10.

The present inventors estimate the reason why the resin composition has excellent photocurability for various active energy rays, in particular, an active energy ray including an h-line at a wavelength of 405 nm, by containing the bismaleimide compound (A) together with the later-described initiator (B1) and/or the later-described initiator (B2), and the later-described initiator (C) is as follows.

Normally, since maleimide compounds have poor light transmissivity, when the resin composition contains a maleimide compound, light does not sufficiently reach the photo initiator dispersed in the resin composition, and the photo initiator has difficulty generating radicals. Therefore, in general, the photo radical reaction of maleimide compounds is difficult to proceed, and even if radical polymerization or dimerization reaction of single maleimide proceeds, its reactivity is very low.

However, the bismaleimide compound (A) contains a constituent unit represented by the formula (1), that is, an alicyclic backbone, and therefore has superior light transmissivity. Therefore, light reaches the photo initiator sufficiently, so that the photo radical reaction of the maleimide efficiently takes place. Using various active energy rays, photocuring can be achieved together with the later-described compound (D) containing one or more carboxy groups (also referred to as a component (D) or a compound (D)), and the later-described maleimide compound (E) (also referred to as a component (E) or a compound (E)) which are compounded if required.

The bismaleimide compound (A) exhibits superior light transmissivity, with a transmittance of 5% or more, when a chloroform solution containing the bismaleimide compound (A) at 1% by mass is prepared and the transmittance of the chloroform solution containing the bismaleimide compound (A) at 1% by mass is measured using an active energy ray including a wavelength of 405 nm (h-line). Therefore, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The transmittance at a wavelength of 405 nm (h-line) is preferably 8% or more, more preferably 10% or more, from the viewpoint of producing a printed wiring board having a more highly dense and highly detailed wiring formation (pattern). The upper limit of the transmittance at a wavelength of 405 nm (h-line) is, for example, 99.9% or less.

Normally, the absorbance of the photo initiator tends to decrease with respect to a light in a long wavelength region. For example, when an active energy ray (ray of light) including a wavelength of 405 nm (h-line) is used, a usual photo initiator does not absorb the ray because light having such a wavelength has a relatively long wavelength, and polymerization proceeds only when a photo initiator capable of suitably absorbing the light to generate radicals is used. However, when the initiator (B1) and/or the later-described initiator (B2), and the initiator (C) are used in combination in the resin composition, the resin composition containing these initiators has a sufficient absorbance in a long wavelength region including a wavelength of 405 nm (h-line) owing to synergistic effects. The bismaleimide compound (A) has excellent light transmissivity as mentioned above. Therefore, light reaches the photo initiators sufficiently, for example, even when an active energy ray including 405 nm is used. Since the photo initiators of the present embodiment are capable of absorbing a wavelength of 405 nm (h-line) with a high absorbance, radical reaction proceeds efficiently. As a result, even a composition containing a large amount of the bismaleimide compound (A) can be photocured, and a printed wiring board having a more highly dense and highly detailed wiring formation (pattern) can be presumably produced.

As the initiator (B1), a photo initiator is preferably used which exhibits excellent absorption of light with a wavelength of 405 nm (h-line), with an absorbance of 0.01 or more, when the absorbance of a chloroform solution containing the photo initiator (B1) at 0.01% by mass is measured. As the initiator (B2), a photo initiator is preferably used which exhibits excellent absorption of light with a wavelength of 405 nm (h-line), with an absorbance of 0.01 or more, when the absorbance of a chloroform solution containing the photo initiator (B2) at 0.01% by mass is measured. As the initiator (C), a photo initiator is preferably used which exhibits superior absorption of light with a wavelength of 405 nm (h-line), with an absorbance of 0.1 or more, when the absorbance of a chloroform solution containing the photo initiator (C) at 0.01% by mass is measured.

Furthermore, normally, maleimide compounds have extremely low water solubility, do not have reactivity with an alkaline component in an alkaline developing solution, and therefore hardly exhibit alkaline developability. However, the resin composition has superior alkaline-developability while having excellent photocurability, by containing the bismaleimide compound (A). The reason for this is not certain, but the present inventors estimate it as follows.

That is, the bismaleimide compound (A) has a relatively long chain and a flexible structure, and does not have a structure which causes interaction with an alkaline component in the alkaline developing solution. Therefore, the bismaleimide compound (A) can be dissolved in the alkaline developing solution as the compound (D) is dissolved in the alkaline developing solution while the structures of, for example, other components such as the compound (D) are maintained in the alkaline developing solution. When in a development step, the alkaline developing solution flows into an unexposed portion (resin composition), the bismaleimide compound (A) does not inhibit a component that exhibits interaction with the alkaline component in the alkaline developing solution, so that the resin composition presumably has excellent alkaline developability.

Thus, the resin composition of the present embodiment has excellent photocurability for various active energy rays, in particular, an active energy ray including an h-line at a wavelength of 405 nm, in an exposure step, and can confer excellent alkaline developability in a development step, in the fabrication of a multilayer printed wiring board. Therefore, high density printed wiring boards and semiconductor devices having a highly detailed resist pattern can be obtained. The resulting cured product is also excellent in heat resistance, insulation reliability, and thermal stability. Therefore, according to the present embodiment, protective films and insulation layers in multilayer printed wiring boards and semiconductor devices can be suitably formed.

The mass average molecular weight of the bismaleimide compound (A) is not particularly limited as long as the effect of the present invention is achieved, and is preferably 100 to 5000, and more preferably 300 to 4500 because a suitable viscosity can be obtained and an increase in viscosity of varnish can be suppressed.

The structure of the bismaleimide compound (A) will now be described.

In the formula (1) of the bismaleimide compound (A), $R_1$ represents a linear or branched alkylene group having 1 to 16 carbon atoms, or a linear or branched alkenylene group having 2 to 16 carbon atoms. $R_1$ is preferably a linear or branched alkylene group, and more preferably a linear alkylene group because a more suitable viscosity can be obtained and an increase in viscosity of varnish can be more reliably controlled.

The number of carbon atoms in the alkylene group is preferably 2 to 14, and more preferably 4 to 12 because a more suitable viscosity can be obtained and an increase in viscosity of varnish can be more reliably controlled.

Examples of the linear or branched alkylene group include a methylene group, an ethylene group, a propylene group, a 2,2-dimethylpropylene group, a butylene group, a pentylene group, a hexylene group, a heptylene group, an octylene group, a nonylene group, a decylene group, a dodecylene group, an undecylene group, a tridecylene group, a tetradecylene group, a pentadecylene group, a hexadecylene group, a neopentylene group, a dimethylbutylene group, a methylhexylene group, an ethylhexylene group, a dimethylhexylene group, a trimethylhexylene group, a methylheptylene group, a dimethylheptylene group, a trimethylheptylene group, a tetramethylheptylene group, an ethylheptylene group, a methyloctylene group, a methylnonylene group, a methyldecylene group, a methyldodecylene group, a methylundecylene group, a methyltridecylene group, a methyltetradecylene group and a methylpentadecylene group.

The number of carbon atoms in the alkenylene group is preferably 2 to 14, and more preferably 4 to 12 because a more suitable viscosity can be obtained and an increase in viscosity of varnish can be more reliably controlled.

Examples of the linear or branched alkenylene group include a vinylene group, a 1-methylvinylene group, an arylene group, a propenylene group, an isopropenylene group, a 1-butenylene group, a 2-butenylene group, a 1-pentenylene group, a 2-pentenylene group, an isopentylene group, a cyclopentenylene group, a cyclohexenylene group, and a dicyclopentadienylene group.

In the formula (1), $R_2$ represents a linear or branched alkylene group having 1 to 16 carbon atoms, or a linear or branched alkenylene group having 2 to 16 carbon atoms. $R_2$ is preferably a linear or branched alkylene group, and more preferably a linear alkylene group because a more suitable viscosity can be obtained and an increase in viscosity of varnish can be more reliably controlled.

The number of carbon atoms in the alkylene group is preferably 2 to 14, and more preferably 4 to 12 because a more suitable viscosity can be obtained and an increase in viscosity of varnish can be more reliably controlled.

For the linear or branched alkylene group, $R_1$ can be referred to.

The number of carbon atoms in the alkenylene group is preferably 2 to 14, and more preferably 4 to 12 because a more suitable viscosity can be obtained and an increase in viscosity of varnish can be more reliably controlled.

For the linear or branched alkenylene group, $R_1$ can be referred to.

In the formula (1), $R_1$ and $R_2$ may be the same or different, and are preferably the same because the bismaleimide compound (A) can be more easily synthesized.

In the formula (1), each $R_3$ independently represents a hydrogen atom, a linear or branched alkyl group having 1 to 16 carbon atoms, or a linear or branched alkenyl group having 2 to 16 carbon atoms. It is preferable that each $R_3$ be independently a hydrogen atom or a linear or branched alkyl group having 1 to 16 carbon atoms because a more suitable viscosity can be obtained and an increase in viscosity of varnish can be more reliably controlled, it is more preferable that one to five groups ($R_3$s) among $R_3$s be linear or branched alkyl groups each having 1 to 16 carbon atoms, and other groups ($R_3$) be hydrogen atoms, and it is still more preferable that one to three groups ($R_3$s) among $R_3$s be linear or branched alkyl groups each having 1 to 16 carbon atoms, and other groups ($R_3$) be hydrogen atoms.

The number of carbon atoms in the alkyl group is preferably 2 to 14, and more preferably 4 to 12 because a more suitable viscosity can be obtained and an increase in viscosity of varnish can be more reliably controlled.

Examples of the linear or branched alkyl group include a methyl group, an ethyl group, a n-propyl group, an isopropyl group, a 1-ethylpropyl group, a n-butyl group, a 2-butyl group, an isobutyl group, a tert-butyl group, a n-pentyl group, a 2-pentyl group, a tert-pentyl group, a 2-methylbutyl group, a 3-methylbutyl group, a 2,2-dimethylpropyl group, a n-hexyl group, a 2-hexyl group, a 3-hexyl group, a n-heptyl group, a n-octyl group, a 2-methylpentyl group, a 3-methylpentyl group, a 4-methylpentyl group, a 2-methylpentan-3-yl group, and a n-nonyl group.

The number of carbon atoms in the alkenyl group is preferably 2 to 14, and more preferably 4 to 12 because a more suitable viscosity can be obtained and an increase in viscosity of varnish can be more reliably controlled.

Examples of the linear or branched alkenyl group include a vinyl group, an allyl group, a 4-pentenyl group, an isopropenyl group, an isopentenyl group, a 2-heptenyl group, a 2-octenyl group, and a 2-nonenyl group.

In the formula (1), each $n_1$ independently represents an integer of 1 to 10.

The bismaleimide compound (A) has maleimide groups at both ends of the molecular chain. The term "both ends" means both ends of the molecular chain of the bismaleimide compound (A), and for example, when the constituent unit represented by the formula (1) is present at an end of the molecular chain of the bismaleimide compound (A), the maleimide group is present at an end of the molecular chain of $R_1$, at an end of the molecular chain on the N atom of the maleimide ring, or at each of both the ends. The bismaleimide compound (A) may have maleimide groups at positions other than both ends of the molecular chain.

The maleimide group is represented by the formula (14), and the N atom is bonded to the molecular chain of the bismaleimide compound (A). In addition, the maleimide groups bonded to the bismaleimide compound (A) may be all the same or different, and the maleimide groups at both ends of the molecular chain are preferably the same.

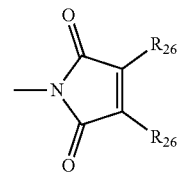

(14)

In the formula (14), each $R_{26}$ independently represents a hydrogen atom, or a linear or branched alkyl group having 1 to 4 carbon atoms. Each $R_{26}$ is preferably a hydrogen atom because photocuring is more suitably performed.

The number of carbon atoms in the alkyl group is preferably 1 to 3, and more preferably 1 or 2 because photocuring is more suitably performed.

For the linear or branched alkyl group, $R_3$ can be referred to.

Examples of such a bismaleimide compound (A) include a maleimide compound represented by the formula (15). One of these bismaleimide compounds can be used, or two or more thereof can be appropriately mixed and used.

tance and thermal stability can be obtained. As the maleimide compound (E), it is preferable to contain at least one selected from the group consisting of a compound represented by the formula (8), a compound represented by the formula (9), a compound represented by the formula (10), a compound represented by the formula (11), a compound represented by the formula (12), and a compound represented by the formula (13), it is more preferable to contain at least one selected from the group consisting of a com-

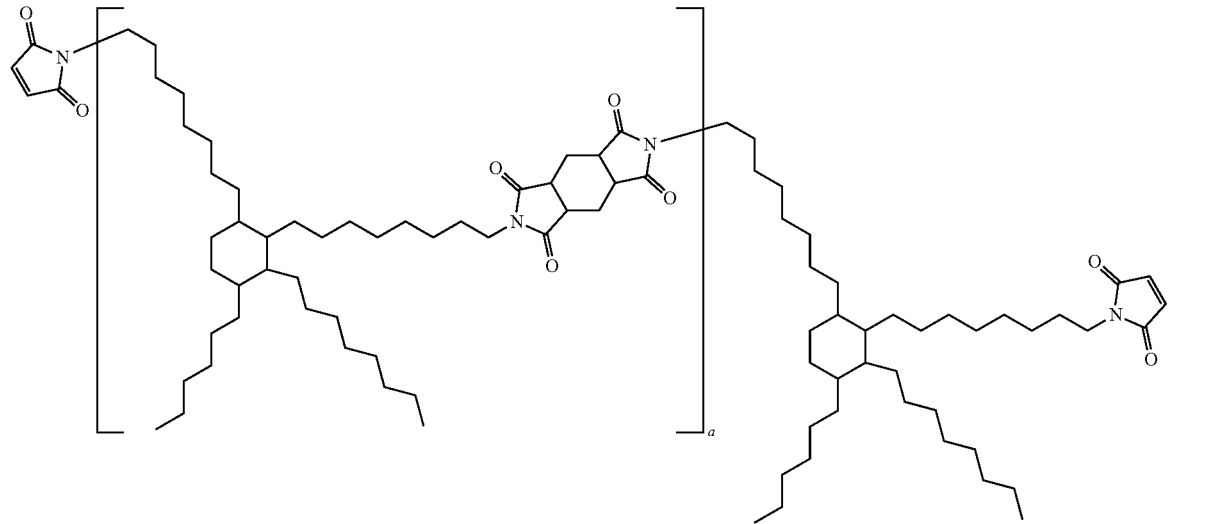

(15)

In the formula (15), a represents an integer of 1 to 10. a is preferably an integer of 1 to 6 because a more suitable viscosity can be obtained and an increase in viscosity of varnish can be more reliably controlled.

As the bismaleimide compound (A), commercial products can also be used. Examples of the commercial products include MIZ-001 manufactured by Nippon Kayaku Co., Ltd. (product name, containing the maleimide compound of the formula (15)).

In the resin composition, the content of the bismaleimide compound (A) is preferably 10 to 90 parts by mass, more preferably 30 to 80 parts by mass, still more preferably 40 to 75 parts by mass, even more preferably 50 to 70 parts by mass, and furthermore preferably 55 to 65 parts by mass based on 100 parts by mass of the resin solid content in the resin composition from the viewpoint that it becomes possible to obtain a cured product mainly composed of the bismaleimide compounds, photocurability can be further improved, and superior heat resistance and thermal stability can be obtained.

When the resin composition contains the bismaleimide compound (A) and the maleimide compound (E) other than the bismaleimide compound (A), the content of the bismaleimide compound (A) is preferably 10 to 90 parts by mass, more preferably 30 to 80 parts by mass, still more preferably 40 to 75 parts by mass, even more preferably 50 to 70 parts by mass, and furthermore preferably 55 to 65 parts by mass based on 100 parts by mass of the total of the bismaleimide compound (A) and the maleimide compound (E) from the viewpoint that it becomes possible to obtain a cured product mainly composed of the bismaleimide compounds, photocurability can be further improved, and superior heat resispound represented by the formula (8), a compound represented by the formula (9), and a compound represented by the formula (10), and it is still more preferable to contain at least one selected from the group consisting of a compound represented by the formula (8) and a compound represented by the formula (9).

When the resin composition contains the compound (D) and the compound (E) together with the bismaleimide compound (A), the initiator (B1) and/or the initiator (B2), and the initiator (C), the content of the bismaleimide compound (A) is preferably 10 to 85 parts by mass, more preferably 15 to 80 parts by mass, still more preferably 40 to 70 parts by mass, and even more preferably 45 to 70 parts by mass based on 100 parts by mass of the total of the bismaleimide compound (A), the initiator (B1), the initiator (B2), the initiator (C), the compound (D), and the compound (E), because superior alkaline developability can be conferred, and better curability can be exhibited without inhibiting the photo initiator in the resin composition.

One of these bismaleimide compounds (A) can be used, or two or more thereof can be appropriately mixed and used.
(Method for Producing Bismaleimide Compound (A))

The bismaleimide compound (A) can be produced by a known method. For example, 1,2,4,5-cyclohexanetetracarboxylic dianhydride, a monomer containing a diamine including a dimer diamine or the like, and maleic anhydride are subjected to a polyaddition reaction at a temperature of normally about 80 to 250° C., preferably about 100 to 200° C. for normally about 0.5 to 50 hours, preferably about 1 to 20 hours to obtain a polyaddition product, and the polyaddition product is then subjected to an imidization reaction, i.e. a ring closure reaction with dehydration at a temperature of normally about 60 to 120° C., preferably about 80 to 100° C. for normally about 0.1 to 2 hours, preferably about 0.1 to 0.5 hours to obtain the bismaleimide compound (A).

The dimer diamine can be obtained by, for example, a reductive amination reaction of a dimer acid, and the amination reaction can be conducted by, for example, a known method such as a reduction method using ammonia and a catalyst (e.g. the method described in Japanese Patent Laid-Open No. 9-12712). The dimer acid is a dibasic acid obtained by dimerization of an unsaturated fatty acid through an intermolecular polymerization reaction or the like. Depending on synthesis conditions and purification conditions, a small amount of monomer acids, trimer acids, or the like are normally contained in addition to the dimer acid. After the reaction, double bonds remain in the obtained molecule, and in the present embodiment, the dimer acids also include those formed into saturated dibasic acids by reduction of double bonds present in the molecule through a hydrogenation reaction. The dimer acid can be obtained by, for example, polymerizing an unsaturated fatty acid using Lewis acid and Broensted acid as catalysts. The dimer acid can be produced by a known method (e.g. the method described in Japanese unexamined Patent Application Publication No. 9-12712). Examples of the unsaturated fatty acid include crotonic acid, myristoleic acid, palmitoleic acid, oleic acid, elaidic acid, vaccenic acid, gadoleic acid, eicosenoic acid, erucic acid, nervonic acid, linoleic acid, pinolenic acid, eleostearic acid, mead acid, dihomo-γ-linolenic acid, eicosatrienoic acid, stearidonic acid, arachidonic acid, eicosatetraenoic acid, adrenic acid, bosseopentaenoic acid, Osbond acid, clupanodonic acid, tetracosapentaenoic acid, docosahexaenoic acid, and Nisinic acid. The number of carbon atoms in the unsaturated fatty acid is normally 4 to 24, and preferably 14 to 20.

In production of the bismaleimide compound (A), it is preferable that the monomer containing a diamine be dissolved or dispersed in a slurry form in an organic solvent in an inert atmosphere of, for example, argon, nitrogen or the like to form a monomer solution containing a diamine in advance. It is preferable that the 1,2,4,5-cyclohexanetetracarboxylic dianhydride be added to the monomer solution containing a diamine after being dissolved or dispersed in a slurry form in an organic solvent, or in a solid state.

A desired bismaleimide compound (A) can be obtained by adjusting the number of moles of the 1,2,4,5-cyclohexanetetracarboxylic dianhydride and the number of moles of the total amount of the monomer containing a diamine and the maleimide compound.

Various known solvents can be used for the polyaddition reaction and the imidization reaction. Examples of the solvent include amides such as N,N-dimethylformamide, N,N-dimethylacetamide and N-methyl-2-pyrrolidone; ketones such as acetone, methyl ethyl ketone, methyl isobutyl ketone, cyclohexanone and isophorone; esters such as γ-butyrolactone, γ-valerolactone, δ-valerolactone, γ-caprolactone, ε-caprolactone, α-methyl-γ-butyrolactone, ethyl lactate, methyl acetate, ethyl acetate and butyl acetate; aliphatic alcohols having 1 to 10 carbon atoms such as methanol, ethanol and propanol; aromatic group-containing phenols such as phenol and cresol; aromatic group-containing alcohols such as benzyl alcohol; glycols such as ethylene glycol and propylene glycol, monoethers or diethers of these glycols and methanol, ethanol, butanol, hexanol, octanol, benzyl alcohol, phenol, cresol and the like, or glycol ethers such as esters of these monoethers; cyclic ethers such as dioxane and tetrahydrofuran; carbonates such as ethylene carbonate and propylene carbonate; aliphatic hydrocarbons and aromatic hydrocarbons such as toluene and xylene; and aprotic polar solvents such as dimethylsulfoxide. One of these solvents can be used, or two or more thereof can be combined and used if required.

It is preferable to use a catalyst in the imidization reaction. As the catalyst, for example, tertiary amines and dehydration catalysts can be used. The tertiary amine is preferably a heterocyclic tertiary amine, and examples thereof include pyridine, picoline, quinoline and isoquinoline. Examples of the dehydration catalyst include acetic anhydride, propionic anhydride, n-butyric anhydride, benzoic anhydride and trifluoroacetic anhydride.

For the amount of the catalyst added, it is preferable that for example, the amount of an imidizing agent be about 0.5 to 5.0 times the amount of amide groups on a molar basis, and the amount of the dehydration catalyst be 0.5 to 10.0 times the amount of amide groups on a molar basis.

After completion of the imidization reaction, the solution may be used as a bismaleimide compound (A) solution, or a poor solvent may be added to the reaction solvent to form the bismaleimide compound (A) into a solid matter. Examples of the poor solvent include water, methyl alcohol, ethyl alcohol, 2-propyl alcohol, ethylene glycol, triethylene glycol, 2-butyl alcohol, 2-pentyl alcohol, 2-hexyl alcohol, cyclopentyl alcohol, cyclohexyl alcohol, phenol and t-butyl alcohol.

[Photo Initiator (B)]

The resin composition of the present embodiment contains a photo initiator (B1) represented by the formula (2) and/or a photo initiator (B2) represented by the formula (3). In the present embodiment, the initiator (B1) and the initiator (B2) are also collectively referred to as a "photo initiator (B)". The photo initiator (B) can be photocured together with the bismaleimide compound (A) and the initiator (C), and the compound (D) and the compound (E) which are compounded if required, and the like using various active energy rays (rays of light), in particular, an active energy ray including an h-line at a wavelength of 405 nm.

The resin composition, by containing the initiator (B1) and/or the initiator (B2) together with the bismaleimide compound (A) and the initiator (C), has superior photocurability for various active energy rays, in particular, an active energy ray including an h-line at a wavelength of 405 nm, and use of this resin composition produces a high density printed wiring board and semiconductor device having a highly detailed resist pattern. The present inventors estimate the reason for this as follows. That is, the initiator (B1) and the initiator (B2) have a relatively high absorbance for various active energy rays (rays of light), in particular, an active energy ray including an h-line at a wavelength of 405 nm. Besides, the initiator (B1) and the initiator (B2) are unlikely to lose a radical generation density even on their surfaces which come into contact with air, and are therefore also superior in surface curability. The initiator (C) has, because of its structure, a high absorbance for various active energy rays (rays of light), in particular, an active energy ray including an h-line at a wavelength of 405 nm, and are capable of having superior photocurability by use together with the initiator (B1) and/or the initiator (B2). Besides, the bismaleimide compound (A) is excellent in transmittance of an h-line at a wavelength of 405 nm. Thus, use of these components enables the resin composition to be relatively uniformly cured from the surface which comes into contact with air to the inside (deep part) which comes into no contact with air.

Therefore, the resin composition has superior photocurability for various active energy rays, in particular, an active energy ray including an h-line at a wavelength of 405 nm, in an exposure step, in the fabrication of a multilayer printed wiring board. Also, the resin composition can confer superior alkaline developability in a development step. Therefore, high density printed wiring boards and semiconductor devices having a more highly detailed resist pattern can be obtained. The resulting cured product is also excellent in heat resistance, insulation reliability, and thermal stability. Therefore, according to the present embodiment, protective films and insulation layers in multilayer printed wiring boards and semiconductor devices can be suitably formed.

The content of the photo initiator (B) is preferably 1.0 to 90 parts by mass, more preferably 5.0 to 95 parts by mass, still more preferably 10 to 90 parts by mass, and even more preferably 20 to 87 parts by mass based on 100 parts by mass of the total of the photo initiator (B) and the initiator (C) because the resin composition can be more uniformly cured from the surface which comes into contact with air to the inside (deep part) which comes into no contact with air.

In the resin composition, the content of the photo initiator (B) is preferably 0.1 to 50 parts by mass, more preferably 0.2 to 30 parts by mass, still more preferably 0.3 to 10 parts by mass, and even more preferably 0.5 to 8.0 parts by mass based on 100 parts by mass of the resin solid content in the resin composition from the viewpoint that photocuring reaction is not inhibited in the resin composition, photocuring proceeds more sufficiently, and the exposed portion is sufficiently insolubilized in alkaline developability.

When the resin composition contains the compound (D) and the compound (E) together with the bismaleimide compound (A), the initiator (B1) and/or the initiator (B2), and the initiator (C), the total content of the initiator (B1) and the initiator (B2) is preferably 0.1 to 20 parts by mass, more preferably 0.2 to 15 parts by mass, still more preferably 0.3 to 10 parts by mass, and even more preferably 0.5 to 8.0 parts by mass based on 100 parts by mass of the total of the bismaleimide compound (A), the initiator (B1), the initiator (B2), the initiator (C), the compound (D), and the compound (E) because superior alkaline developability can be conferred, and good curability can be exhibited, without inhibiting the photo initiator, in the resin composition.

Next, the photo initiator (B1) represented by the formula (2) and the photo initiator (B2) represented by the formula (3) will be described.
(Photo Initiator (B1) Represented by Formula (2))

The photo initiator (B1) represented by the formula (2) is the following compound.

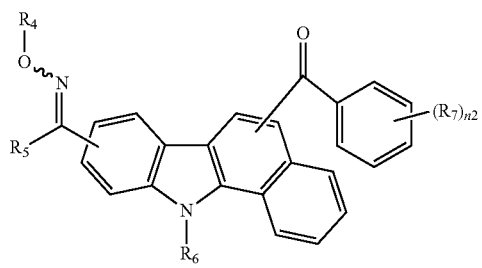

(2)

In the formula (2), $R_4$ represents an acetyl group or a benzoyl group. Among the above, an acetyl group is preferable because the sensitivity to an h-line is higher.

$R_5$ represents a phenyl group or naphthyl group optionally having a substituent. Examples of such a group include a phenyl group or naphthyl group having a substituent such as a hydrogen atom, an alkyl group having 1 to 4 carbon atoms, a trifluoromethyl group, a tetrafluoropropoxy group, a pentafluoropropoxy group, a hexafluoropropoxy group, a halogen atom (e.g., a fluorine atom, a chlorine atom, a bromine atom, and an iodine atom), a nitro group, a cyano group, a carbamoyl group, a sulfamoyl group, and an alkoxyl group having 1 to 4 carbon atoms. Among the above, a tetrafluoropropoxyphenyl group, a pentafluoropropoxyphenyl group, and a hexafluoropropoxyphenyl group are preferable, and a tetrafluoropropoxyphenyl group is more preferable, because the sensitivity to an h-line is higher.

$R_6$ represents a hydrogen atom, or a linear or branched alkyl group having 1 to 16 carbon atoms and optionally having a substituent. Examples of the linear or branched alkyl group having 1 to 16 carbon atoms and optionally having a substituent include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a 5-ethylhexyl group, a 6-methylheptyl group, and an octyl group. Among the above, a 5-ethylhexyl group, a 6-methylheptyl group, and an octyl group are preferable, and a 5-ethylhexyl group is more preferable, because better compatibility with the imidazole compound (B) is exhibited.

Each $R_7$ independently represents a hydrogen atom, or a linear or branched alkyl group having 1 to 6 carbon atoms and optionally having a substituent. For the linear or branched alkyl group having 1 to 6 carbon atoms and optionally having a substituent, for example, $R_6$ in the formula (2) can be referred to. Among the above, a methyl group, an ethyl group, a propyl group, and an isopropyl group are preferable, and a methyl group is more preferable, because the solvent solubility is superior.

Each $n_2$ independently represents an integer of 1 to 5.

The photo initiator (B1) represented by the formula (2) may be an initiator in which the N—O bond has an (E) configuration, may be an initiator in which the N—O bond has a (Z) configuration, or may be a mixture of an initiator in which the N—O bond has an (E) configuration, and an initiator in which the N—O bond has a (Z) configuration.

The initiator (B1) has an absorbance of preferably 0.01 or more when a chloroform solution containing the initiator (B1) at 0.01% by mass is prepared, and the absorbance of the chloroform solution containing the initiator (B1) at 0.01% by mass is measured using an active energy ray including a wavelength of 405 nm (h-line). In this case, the initiator (B1) exhibits superior light absorption. When such an initiator (B1) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The absorbance at a wavelength of 405 nm (h-line) is more preferably 0.03 or more because a resin composition that is superior in photocurability can be obtained. The upper limit of the absorbance at a wavelength of 405 nm (h-line) is, for example, 99.9 or less.

The photo initiator (B1) represented by the formula (2) is still more preferably a photo initiator represented by the formula (16) because the sensitivity to an h-line is higher, and solvent solubility is superior.

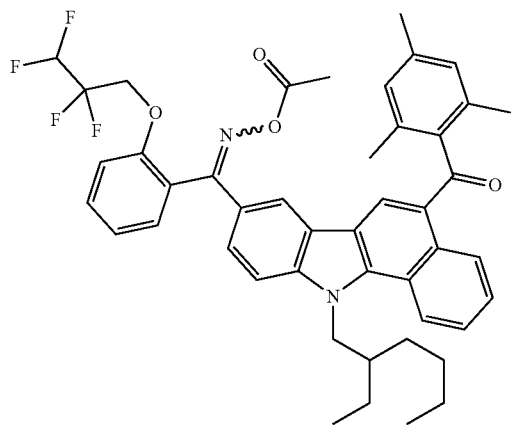

(16)

The photo initiator represented by the formula (16) may be an initiator in which the N—O bond has an (E) configuration, may be an initiator in which the N—O bond has a (Z) configuration, or may be a mixture of an initiator in which the N—O bond has an (E) configuration, and an initiator in which the N—O bond has a (Z) configuration.

(Method for Producing Photo Initiator (B1))

The photo initiator (B1) can be produced by a publicly known method without particular limitations, and a method described in, for example, Japanese Translation of PCT International Application Publication No. 2014-500852 can be adopted.

The obtained photo initiator (B1) can be identified by a publicly known method such as NMR (nuclear magnetic resonance analysis). The purity of the photo initiator (B1) can be analyzed by, for example, GPC, liquid chromatography, or IR spectroscopy. Volatile components such as by-products and a residual solvent in the photo initiator (B1) can be quantitatively analyzed by, for example, GPC or gas chromatography. When a halogen atom remains in the photo initiator (B1), the remaining halogen compound can be identified using, for example, a liquid chromatograph-mass spectrometer, and can also be decomposed by a potentiometric titration method using a silver nitrate solution or a combustion method and then quantified by ion chromatography.

(Photo Initiator (B2) Represented by Formula (3))

The photo initiator (B2) represented by the formula (3) is the following compound.

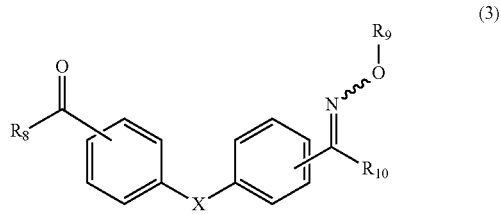

(3)

In the formula (3), $R_8$ represents an aryl group having 6 to 24 carbon atoms and optionally having a substituent, or a heteroaryl group having 3 to 24 carbon atoms and optionally having a substituent. Examples of the aryl group having 6 to 24 carbon atoms and optionally having a substituent include a phenyl group, a naphthyl group, a biphenyl group, a terphenyl group, a phenanthryl group, and an anthracenyl group having a substituent such as a hydrogen atom, an alkyl group having 1 to 4 carbon atoms, a trifluoromethyl group, a tetrafluoropropoxy group, a halogen atom (e.g., a fluorine atom, a chlorine atom, a bromine atom, and an iodine atom), a nitro group, a cyano group, a carbamoyl group, a sulfamoyl group, and an alkoxyl group having 1 to 4 carbon atoms. Examples of the heteroaryl group having 3 to 24 carbon atoms and optionally having a substituent include a pyrrolyl group, a furyl group, a benzofuryl group, a thienyl group, a pyrazolyl group, an imidazolyl group, an oxazolyl group, an isoxazolyl group, a thiazolyl group, an isothiazolyl group, a triazolyl group, a pyridyl group, a pyridazinyl group, a pyrimidinyl group, a pyrazyl group, a quinolyl group, an isoquinolyl group, an indolyl group, a benzofuranyl group, a benzothienyl group, a benzotriazolyl group, and a benzimidazolyl group having a substituent such as a hydrogen atom, an alkyl group having 1 to 4 carbon atoms, a trifluoromethyl group, a tetrafluoropropoxy group, a halogen atom (e.g., a fluorine atom, a chlorine atom, a bromine atom, and an iodine atom), a nitro group, a cyano group, a carbamoyl group, a sulfamoyl group, and an alkoxyl group having 1 to 4 carbon atoms. Among the above, a benzofuryl group and a benzothienyl group are preferable, and a benzofuryl group is more preferable, because the sensitivity to an h-line is higher.

$R_9$ represents an acetyl group or a benzoyl group. Among the above, an acetyl group is preferable because the sensitivity to an h-line is higher.

$R_{10}$ represents a hydrogen atom, or a linear or branched alkyl group having 1 to 16 carbon atoms and optionally having a substituent. Examples of the linear or branched alkyl group having 1 to 16 carbon atoms and optionally having a substituent include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, an isopentyl group, a hexyl group, a 5-ethylhexyl group, and a heptyl group. Among the above, an isopentyl group, a hexyl group, and a 5-ethylhexyl group are preferable, and an isopentyl group is more preferable, because better compatibility with the bismaleimide compound (A) is exhibited.

X represents an oxygen atom or a sulfur atom. Among the above, a sulfur atom is preferable because the sensitivity to an h-line is higher.

The photo initiator (B2) represented by the formula (3) may be an initiator in which the N—O bond has an (E) configuration, may be an initiator in which the N—O bond has a (Z) configuration, or may be a mixture of an initiator in which the N—O bond has an (E) configuration, and an initiator in which the N—O bond has a (Z) configuration.

The initiator (B2) has an absorbance of preferably 0.01 or more when a chloroform solution containing the initiator (B2) at 0.01% by mass is prepared, and the absorbance of the chloroform solution containing the initiator (B2) at 0.01% by mass is measured using an active energy ray including a wavelength of 405 nm (h-line). In this case, the initiator (B2) exhibits superior light absorption. When such an initiator (B2) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The absorbance at a wavelength of 405 nm (h-line) is more preferably 0.03 or more because a resin composition that is superior in photocurability can be obtained. The upper limit of the absorbance at a wavelength of 405 nm (h-line) is, for example, 99.9 or less.

The photo initiator (B2) represented by the formula (3) is still more preferably a photo initiator represented by the formula (17) because the sensitivity to an h-line is higher and solvent solubility is superior.

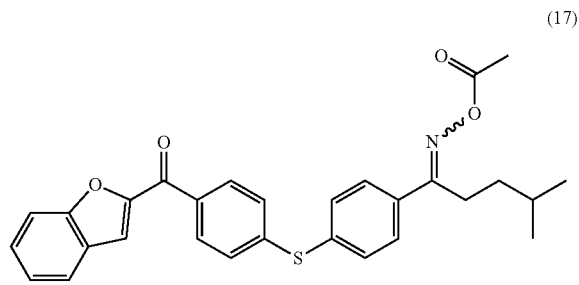 [SMILES: CC(=O)ON=C(CCC(C)C)c1ccc(Sc2ccc(C(=O)c3cc4ccccc4o3)cc2)cc1]

(17)

The photo initiator represented by the formula (17) may be an initiator in which the N—O bond has an (E) configuration, may be an initiator in which the N—O bond has a (Z) configuration, or may be a mixture of an initiator in which the N—O bond has an (E) configuration, and an initiator in which the N—O bond has a (Z) configuration.

(Method for Producing Photo Initiator (B2))

The photo initiator (B2) can be produced by a publicly known method without particular limitations, and a method described in, for example, Japanese Translation of PCT International Application Publication No. 2016-531926 can be adopted.

The obtained photo initiator (B2) can be identified by a publicly known method such as NMR (nuclear magnetic resonance analysis). The purity of the photo initiator (B2) can be analyzed by, for example, GPC, liquid chromatography, or IR spectroscopy. Volatile components such as by-products and a residual solvent in the photo initiator (B2) can be quantitatively analyzed by, for example, GPC or gas chromatography. When a halogen atom remains in the photo initiator (B2), the remaining halogen compound can be identified using, for example, a liquid chromatograph-mass spectrometer, and can also be decomposed by a potentiometric titration method using a silver nitrate solution or a combustion method and then quantified by ion chromatography.

[Photo Initiator (C)]

The resin composition of the present embodiment contains a photo initiator (C) represented by the formula (4). The photo initiator (C) can be photocured together with the bismaleimide compound (A) and the initiator (B1) and/or the initiator (B2), and the compound (D) and the compound (E) which are compounded if required, and the like using various active energy rays (rays of light).

The content of the initiator (C) is preferably 1.0 to 90 parts by mass, more preferably 5.0 to 95 parts by mass, still more preferably 10 to 90 parts by mass, and even more preferably 13 to 80 parts by mass based on 100 parts by mass of the total of the photo initiator (B) and the initiator (C) because the resin composition can be more uniformly cured from the surface which comes into contact with air to the inside (deep part) which comes into no contact with air.

In the resin composition, the content of the initiator (C) is preferably 0.1 to 50 parts by mass, more preferably 0.2 to 30 parts by mass, still more preferably 0.3 to 10 parts by mass, and even more preferably 0.5 to 8.0 parts by mass based on 100 parts by mass of the resin solid content in the resin composition from the viewpoint that photocuring reaction is not inhibited in the resin composition, photocuring proceeds more sufficiently, and the exposed portion is sufficiently insolubilized in alkaline developability.

When the resin composition contains the compound (D) and the compound (E) together with the bismaleimide compound (A), the initiator (B1) and/or the initiator (B2), and the initiator (C), the content of the initiator (C) is preferably 0.1 to 20 parts by mass, more preferably 0.2 to 15 parts by mass, still more preferably 0.3 to 10 parts by mass, and even more preferably 0.5 to 8.0 parts by mass based on 100 parts by mass of the total of the bismaleimide compound (A), the initiator (B1), the initiator (B2), the initiator (C), the compound (D), and the compound (E) because superior alkaline developability can be conferred, and good curability can be exhibited, without inhibiting the photo initiator, in the resin composition.

Next, the photo initiator (C) represented by the formula (4) will be described.

(Photo Initiator (C) Represented by Formula (4))

The photo initiator (C) represented by the formula (4) is the following compound and is acyl phosphine oxides.

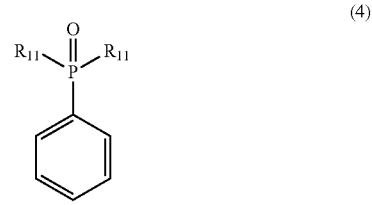

(4)

In the formula (4), each $R_{11}$ independently represents a substituent represented by the formula (5) or a phenyl group. One or more of the $R_{11}$ moieties are preferably substituents represented by the formula (5).

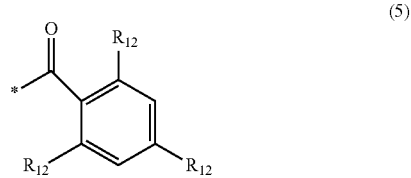

(5)

In the formula (5), each $R_{12}$ independently represents a hydrogen atom or a methyl group. In the formula (5), —* represents a bonding hand to a phosphorus atom (P) directly bonded to $R_{11}$ in the formula (4). One or more of the $R_{12}$ moieties are preferably methyl groups, and all thereof are more preferably methyl groups.

The initiator (C) has an absorbance of preferably 0.1 or more when a chloroform solution containing the initiator (C) at 0.01% by mass is prepared, and the absorbance of the chloroform solution containing the initiator (C) at 0.01% by mass is measured using an active energy ray including a wavelength of 405 nm (h-line). In this case, the initiator (C) exhibits superior light absorption. When such an initiator (C) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The absorbance at a wavelength of 405 nm (h-line)

is preferably 0.15 or more because a resin composition superior in photocurability can be obtained. The upper limit of the absorbance at a wavelength of 405 nm (h-line) is, for example, 99.9 or less.

Examples of the compound represented by the formula (4) include acyl phosphine oxides such as 2,4,6-trimethylbenzoyl-diphenyl-phosphine oxide and bis(2,4,6-trimethylbenzoyl)-phenylphosphine oxide. Among the above, bis(2,4,6-trimethylbenzoyl)-phenylphosphine oxide is preferable because of being more properly compatible with the bismaleimide compound (A) and the photo initiator (B), having superior solvent solubility, and having superior light transmissivity. One of these compounds can be used, or two or more thereof can be appropriately mixed and used.

(Additional Photo Initiator (b))

The resin composition of the present embodiment may contain a publicly known photo initiator (b) other than the initiator (B1), the initiator (B2), and the initiator (C) as long as the effect of the present invention is achieved. Examples of such a photo initiator (b) include radical type photo initiators such as benzoins such as benzoin, benzoin methyl ether, benzoin ethyl ether, benzoin isopropyl ether and benzoin isobutyl ether; organic peroxides exemplified by benzoyl peroxide, lauroyl peroxide, acetyl peroxide, parachlorobenzoyl peroxide, di-tert-butyl-di-perphthalate and the like; phosphine oxides such as 2,4,6-trimethylbenzoyl-diphenyl-phosphine oxide, bis(2,4,6-trimethylbenzoyl)-phenylphosphine oxide, benzoyl-diphenyl-phosphine oxide and bisbenzoyl-phenyphosphine oxide; acetophenones such as acetophenone, 2,2-diethoxy-2-phenylacetophenone, 2,2-diethoxy-2-phenylacetophenone, 1,1-dichloroacetophenone, 2-hydroxy-2-methyl-phenylpropan-1-one, diethoxyacetophenone, 1-hydroxycyclohexyl phenyl ketone, 2-methyl-1-[4-(methylthio)phenyl]-2-morpholinopropan-1-one and 2-benzyl-2-dimethylamino-1-(4-morpholinophenyl)-butanone-1; anthraquinones such as 2-ethylanthraquinone, 2-t-butylanthraquinone, 2-chloroanthraquinone and 2-amylanthraquinone; thioxanthones such as 2,4-diethylthioxanthone, 2-isopropylthioxanthone and 2-chlorothioxanthone; ketals such as acetophenone dimethyl ketal and benzyl dimethyl ketal; benzophenones such as benzophenone, 4-benzoyl-4'-methyldiphenyl sulfide and 4,4'-bismethylaminobenzophenone; and 1,2-octanedione, 1-[4-(phenylthio)-, 2-(O-benzoyloxime)] and ethanone, 1-[9-ethyl-6-(2-methylbenzoyl)-9H-carbazol-3-yl]-, 1-(O-acetyloxime);

diazonium salts of Lewis acid such as p-methoxyphenyldiazonium fluorophosphonate and N,N-diethylaminophenyldiazonium hexafluorophosphonate; iodonium salts of Lewis acid such as diphenyliodonium hexafluorophosphonate and diphenyliodonium hexafluoroantimonate; sulfonium salts of Lewis acid such as triphenylsulfonium hexafluorophosphonate and triphenylsulfonium hexafluoroantimonate; phosphonium salts of Lewis acid such as triphenylphosphonium hexafluoroantimonate; additional halides; triazine-based initiators; borate-based initiators; and cationic photo initiators such as additional photoacid generators.

One of these photo initiators (b) can be used, or two or more thereof can be appropriately mixed and used.

As the photo initiator (b), commercial products can also be used. Examples thereof include Omnirad (registered trademark) 369 (product name) manufactured by IGM Resins B.V., Omnirad (registered trademark) 819 (product name) manufactured by IGM Resins B.V., Omnirad (registered trademark) 819DW (product name) manufactured by IGM Resins B.V., Omnirad (registered trademark) 907 (product name) manufactured by IGM Resins B.V., Omnirad (registered trademark) TPO (product name) manufactured by IGM Resins B.V., Omnirad (registered trademark) TPO-G (product name) manufactured by IGM Resins B.V., Omnirad (registered trademark) 784 (product name) manufactured by IGM Resins B.V., Irgacure (registered trademark) OXE01 (product name) manufactured by BASF Japan Ltd., and Irgacure (registered trademark) OXE02 (product name) manufactured by BASF Japan Ltd.

[Compound (D) Containing One or More Carboxy Groups]

It is preferable that the resin composition of the present embodiment further contain a compound (D) containing one or more carboxy groups. The compound (D) is not particularly limited as long as the compound contains one or more carboxy groups. The carboxy group may be a salt such as a sodium salt or a potassium salt, and when two or more carboxy groups are contained in the molecule, the carboxy groups may be linked together to form an acid anhydride. One of the compounds (D) can be used, or two or more thereof can be appropriately mixed and used.

In the present embodiment, when a resin composition containing the compound (D) and the later-described maleimide compound (E) which is compounded if required together with the bismaleimide compound (A), the initiator (B1) and/or the initiator (B2), and the initiator (C) is used in an exposure step in the fabrication of a multilayer printed wiring board, a cured product can be suitably obtained without inhibiting photocuring reaction. A resin composition containing the compound (D) and the later-described maleimide compound (E) which is compounded if required together with the bismaleimide compound (A), the initiator (B1) and/or the initiator (B2), and the initiator (C) can be obtained in a development step, and excellent alkaline developability can be imparted to the resin composition in an unexposed portion after exposure. The reason for this is not certain, but the present inventors estimate it as follows.

That is, in an exposure step in the fabrication of a multilayer printed wiring board, the compound (D) has no functional group that participates in photocuring reaction in the exposure step, and does not inhibit photocuring reaction. The bismaleimide compound (A) has no backbone that inhibits light transmissivity, and has superior light transmissivity. Therefore, even if the compound (D) and the later-described maleimide compound (E) which is compounded if required are contained together with the bismaleimide compound (A), the initiator (B1) and/or the initiator (B2), and the initiator (C) photopolymerization proceeds, so that a cured product can be suitably obtained.

Furthermore, the compound (D) can be present in the resin composition in an unexposed portion. Therefore, when in a development step, the alkaline developing solution flows into the unexposed portion, the carboxy group in the compound (D) can suitably form a salt with the alkaline component in the alkaline developing solution, so that excellent alkaline developability is obtained because the water solubility is improved.

The compound (D) has a transmittance of preferably 5% or more when a N-methylpyrrolidone solution containing the compound (D) at 1% by mass is prepared and the transmittance of the N-methylpyrrolidone solution containing the compound (D) at 1% by mass is measured using an active energy ray including a wavelength of 405 nm (h-line). Such a compound (D) exhibits superior light transmissivity. When such a compound (D) is used, for example, upon producing a printed wiring board having a highly dense and highly detailed wiring formation (pattern) using the direct imaging method, for example, the photo radical reaction of the maleimide occurs efficiently even when an active energy ray including a wavelength of 405 nm (h-line) is used. The transmittance at a wavelength of 405 nm (h-line) is in a preferable range of 8% or more, 10% or more, 20% or more, 30% or more, and 40% or more in this order because a resin composition superior in photocurability can be obtained. The upper limit of the transmittance at a wavelength of 405 nm (h-line) is, for example, 99.9% or less, and may be 100% or less.

In the present embodiment, it is preferable that the molecule of the compound (D) contain n carboxy groups where n is an integer of 2 to 20 because superior alkaline developability can be obtained.

The molecular weight of the compound (D) is preferably 50 to 10000, more preferably 100 to 8000, still more preferably 130 to 6000, and even more preferably 150 to 5000 in view of further improving developability.

The mass average molecular weight of the compound (B) is preferably 50 to 10000, more preferably 100 to 8000, and still more preferably 150 to 5000 in view of further improving developability.

In the resin composition, the content of the compound (D) is preferably 0.1 to 30 parts by mass, more preferably 0.5 to 20 parts by mass, still more preferably 1.0 to 15 parts by mass, even more preferably 1.5 to 10 parts by mass based on 100 parts by mass of the resin solid content in the resin composition because superior alkaline developability can be conferred, and good curability can be exhibited, without inhibiting photocuring reaction, in the resin composition.

When the resin composition contains the compound (D) and the compound (E) together with the bismaleimide compound (A), the initiator (B1) and/or the initiator (B2), and the initiator (C), the content of the initiator (D) is preferably 0.1 to 30 parts by mass, more preferably 0.5 to 20 parts by mass, still more preferably 1.0 to 15 parts by mass, and even more preferably 1.5 to 10 parts by mass based on 100 parts by mass of the total of the bismaleimide compound (A), the initiator (B1), the initiator (B2), the initiator (C), the compound (D), and the compound (E) because superior alkaline developability can be conferred, and good curability can be exhibited, without inhibiting photocuring reaction, in the resin composition.

Examples of the compound (D) include formic acid, an aliphatic compound containing one or more carboxy groups, an aromatic compound containing one or more carboxy groups, and a hetero compound containing one or more carboxy groups, and an anhydride. One of these compounds (D) can be used, or two or more thereof can be appropriately mixed and used.

(Aliphatic Compound Containing One or More Carboxy Groups)

Examples of the aliphatic compound containing one or more carboxy groups include chain aliphatic monocarboxylic acids, alicyclic monocarboxylic acids, chain aliphatic polyvalent carboxylic acids and alicyclic polyvalent carboxylic acids. These compounds may have hydrogen atoms and substituents such as alkyl groups, alkoxy groups, aryloxy groups, aryl groups, aminoalkyl groups, hydroxy groups, amino groups and carboxyalkyl groups in the molecule. When these compounds have two or more carboxy groups in the molecule, the carboxy groups may be linked together to form an acid anhydride. When these compounds have a carboxyalkyl group in the molecule, the carboxyalkyl group and the carboxy group may be linked together to form an acid anhydride. When these compounds have two or more carboxyalkyl groups in the molecule, the carboxyalkyl groups may be linked together to form an acid anhydride.

Examples of the alkyl group include a methyl group, an ethyl group, a n-propyl group, an i-propyl group, a butyl group, an isobutyl group, a sec-butyl group, a tert-butyl group, a n-pentyl group, a n-hexyl group, a n-heptyl group and a n-octyl group.

Examples of the alkoxy group include a methoxy group, an ethoxy group, a propoxy group, an isopropoxy group, a n-butoxy group, an isobutoxy group, a tert-butoxy group, a n-hexanoxy group and a 2-methylpropoxy group.

Examples of the aryloxy group include a phenoxy group and a p-tolyloxy group.

Examples of the aryl group include a phenyl group, a toluyl group, a benzyl group, a methylbenzyl group, a xylyl group, a mesityl group, a naphthyl group and an anthryl group.

Examples of the aminoalkyl group include an aminomethyl group, an aminoethyl group, an aminopropyl group, an aminodimethyl group, an aminodiethyl group, an aminodipropyl group, an aminobutyl group, an aminohexyl group and an aminononyl group.

Examples of the carboxyalkyl group include a carboxymethyl group, a carboxyethyl group, a carboxypropyl group, a carboxybutyl group, a carboxyhexyl group and a carboxynonyl group.

Examples of the chain aliphatic monocarboxylic acid include saturated fatty acids such as acetic acid, propionic acid, isobutyric acid, butyric acid, isovaleric acid, valeric acid, caproic acid, lactic acid, succinic acid, octanoic acid, nonanoic acid, decanoic acid, dodecanoic acid, tetradecanoic acid, hexadecanoic acid, heptadecanoic acid and octadecanoic acid, and unsaturated fatty acids such as oleic acid, elaidic acid, erucic acid, nervonic acid, linolenic acid, stearidonic acid, eicosapentaenoic acid, linoleic acid and linolenic acid.

Examples of the alicyclic monocarboxylic acid include monocyclic carboxylic acids such as cyclopropanecarboxylic acid, cyclopropenecarboxylic acid, cyclobutanecarboxylic acid, cyclobutenecarboxylic acid, cyclopentanecarboxylic acid, cyclopentenecarboxylic acid, cyclohexanecarboxylic acid, cyclohexenecarboxylic acid, cycloheptanecarboxylic acid, cycloheptenecarboxylic acid, cyclooctanecarboxylic acid and cyclooctenecarboxylic acid, and polycyclic or bridged alicyclic carboxylic acids such as norbornanecarboxylic acid, tricyclodecanecarboxylic acid, tetracyclododecanecarboxylic acid, adamantanecarboxylic acid, methyladamantanecarboxylic acid, ethyladamantanecarboxylic acid and butyladamantanecarboxylic acid.

Examples of the chain aliphatic polyvalent carboxylic acid include carboxylic acids in which one or more carboxy groups are further added to a chain aliphatic monocarboxylic acid. Examples thereof include propionedioic acid, octanedioic acid, nonanedioic acid, decanedioic acid, dodecanedioic acid, tetradecanedioic acid, hexadecanedioic acid, heptadecanedioic acid and octadecanedioic acid.

Examples of the aliphatic polyvalent carboxylic acid include carboxylic acids in which one or more carboxy groups are further added to an alicyclic monocarboxylic acid. Examples thereof include monocyclic carboxylic acids such as cyclopropanedicarboxylic acid, cyclopropenedicarboxylic acid, cyclopropanetricarboxylic acid, cyclopropenetricarboxylic acid, cyclobutanedicarboxylic acid, cyclobutenedicarboxylic acid, cyclobutanetricarboxylic acid, cyclobutenetricarboxylic acid, cyclobutanetetracarboxylic acid, cyclobutenetetracarboxylic acid, cyclopentanedicarboxylic acid, cyclopentenedicarboxylic acid, cyclopentanetricarboxylic acid, cyclopentenetricarboxylic acid, cyclopentanetetracarboxylic acid, cyclopentenetetracarboxylic acid, cyclopentanepentacarboxylic acid, cyclopentenepentacarboxylic acid, cyclohexanedicarboxylic acid, cyclohexenedicarboxylic acid, cyclohexanetricarboxylic acid, cyclohexenetricarboxylic acid, cyclohexanetetraboxylic acid, cyclohexenetetracarboxylic acid, cyclohexanepentacarboxylic acid, cyclohexenepentacarboxylic acid, cyclohexanehexacarboxylic acid, cyclohexenehexacarboxylic acid, cycloheptanedicarboxylic acid, cycloheptenedicarboxylic acid, cyclooctanedicarboxylic acid and cyclooctenedicarboxylic acid, and polycyclic or bridged alicyclic carboxylic acids such as norbornanedicarboxylic acid and adamantanedicarboxylic acid.

(Aromatic Compound Containing One or More Carboxy Groups)

Examples of the main backbone of the aromatic compound containing one or more carboxy groups include benzoic acid, phenyleneacetic acid, salicylic acid, phthalic acid, trimellitic acid, pyromellitic acid, pentacarboxybenzene, hexacarboxybenzene, naphthalenecarboxylic acid, naphthalenedicarboxylic acid, naphthalenetricarboxylic acid, naphthalenetetracarboxylic acid, anthracenecarboxylic acid, anthracenedicarboxylic acid, anthracenetricarboxylic acid, anthracenetetracarboxylic acid, anthracenepentacarboxylic acid. The aromatic compound may have, for example, hydrogen atoms and substituents such as alkyl groups, alkoxy groups, aryloxy groups, aryl groups, aminoalkyl groups, hydroxy groups, amino groups and carboxyalkyl groups on the aromatic ring of the main backbone. When these compounds have two or more carboxy groups in the molecule, the carboxy groups may be linked together to form an acid anhydride. When these compounds have a carboxyalkyl group in the molecule, the carboxyalkyl group and the carboxy group may be linked together to form an acid anhydride. When these compounds have two or more carboxyalkyl groups in the molecule, the carboxyalkyl groups may be linked together to form an acid anhydride. For these substituents, those described above can be referred to.

(Hetero Compound Containing One or More Carboxy Groups)

Examples of the main backbone of the hetero compound containing one or more carboxy groups include compounds containing one or more carboxy groups on hetero rings such as furan, thiophene, pyrrole, imidazole, pyran, pyridine, pyrimidine, pyrazine, pyrrolidine, piperidine, piperazine, morpholine, indole, purine, quinoline, isoquinoline, quinuclidine, chromene, thianthrene, phenothiazine, phenoxazine, xanthene, acridine, phenazine and carbazole. The hetero compound may have, for example, hydrogen atoms and substituents such as alkyl groups, alkoxy groups, aryloxy groups, aryl groups, aminoalkyl groups, hydroxy groups, amino groups and carboxyalkyl groups on the main backbone. When these compounds have two or more carboxy groups in the molecule, the carboxy groups may be linked together to form an acid anhydride. When these compounds have a carboxyalkyl group in the molecule, the carboxyalkyl group and the carboxy group may be linked together to form an acid anhydride. When these compounds have two or more carboxyalkyl groups in the molecule, the carboxyalkyl groups may be linked together to form an acid anhydride. For these substituents, those described above can be referred to.

As the compound (D), it is preferable to contain a compound represented by the formula (6) because the compatibility with the bismaleimide compound (A) is superior, a salt can be formed rapidly and suitably with the alkaline component in the alkaline developing solution, and the water solubility is further improved.

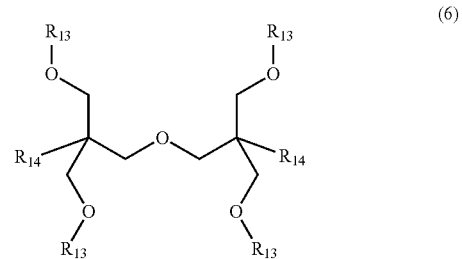

(6)

In the formula (6), each $R_{13}$ independently represents a group represented by the following formula (7) or a hydrogen atom. Each $R_{14}$ independently represents a hydrogen atom, or a linear or branched alkyl group having 1 to 6 carbon atoms. However, at least one $R_{13}$ is a group represented by the following formula (7).

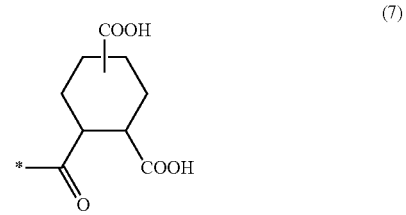

(7)

In the formula (7), —* represents a bonding hand to an oxygen atom (O) directly bonded to $R_{13}$ in the formula (6).

In the formula (6), as $R_{13}$, two or more groups represented by the formula (7) are preferably contained, and three or more groups represented by the formula (7) are more preferably contained, and still more preferably, all of the $R_{13}$ moieties are groups represented by the formula (7), because superior alkaline developability can be conferred. In the group represented by the formula (7), when the position of the carbonyl group with respect to the cyclohexane ring is defined as position 1, as long as a carboxy group is bonded to position 2 with respect to this carbonyl group, another carboxy group may be bonded to any of positions 3 to 6 in the cyclohexane ring.

The compound represented by the formula (6) is present in a cis form, in a trans form, or as a mixture of cis and trans forms because the structure of the carbonyl group and the two carboxy groups bonded to the cyclohexane ring in the group represented by the formula (7) has a conformation. That is, the compound represented by the formula (6) may be one compound or may be a mixture containing two or more isomers.

In the formula (6), at least one $R_{13}$ is preferably a group represented by the formula (18) because superior alkaline developability can be conferred. That is, in the group represented by the formula (18), it is preferable that the conformation of the carbonyl group bonded to position 1 of the cyclohexane ring and the carboxy group at position 2 be a cis form. As for another carboxy group, its confirmation may be a cis form or may be a trans form. As $R_{13}$, two or more groups represented by the formula (18) are preferably contained, and three or more groups represented by the formula (18) are more preferably contained, and still more preferably, all of the $R_{13}$ moieties are groups represented by the formula (18), because superior alkaline developability can be conferred. The reason why superior alkaline developability can be conferred when at least one $R_{13}$ is a group represented by the formula (18) is not certain, but the present inventors estimate it as follows. That is, when the carbonyl group bonded to position 1 and the carboxy group bonded to position 2 are in a cis form, the carboxy group at position 2 in the resin composition can assume a conformation that easily forms a salt with the alkaline component in the alkaline developing solution. Therefore, water solubility is further improved, and the alkaline developing solution is presumably further promoted to flow into the resin composition.

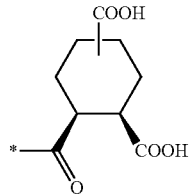

(18)

In the formula (18), —* represents a bonding hand to an oxygen atom (O) directly bonded to $R_{13}$ in the formula (6).

In the formula (6), each $R_{14}$ independently represents a hydrogen atom, or a linear or branched alkyl group having 1 to 6 carbon atoms.

Examples of the linear or branched alkyl group having 1 to 6 carbon atoms include a methyl group, an ethyl group, a n-propyl group, an isopropyl group, a n-butyl group, a 2-butyl group, an isobutyl group, a tert-butyl group, a n-pentyl group, a 2-pentyl group, a tert-pentyl group, a 2-methylbutyl group, a 3-methylbutyl group, a 2,2-dimethylpropyl group, a n-hexyl group, a 2-hexyl group, a 3-hexyl group, a 2-methylpentyl group, a 3-methylpentyl group, a 4-methylpentyl group, and a 2-methylpentan-3-yl group.

$R_{14}$ is preferably a linear alkyl group having 1 to 6 carbon atoms, more preferably a methyl group, an ethyl group, a n-propyl group, a 2-butyl group, an isobutyl group, a tert-butyl group, or a n-pentyl group, and still more preferably a methyl group, an ethyl group, or a n-propyl group from the viewpoint of exhibiting better solubility in a solvent.

The compound represented by the formula (6) is preferably a compound represented by the formula (19) or a compound represented by the formula (20), and more preferably a compound represented by the formula (20) from the viewpoint that superior alkaline developability can be conferred, and better solubility in a solvent is exhibited.

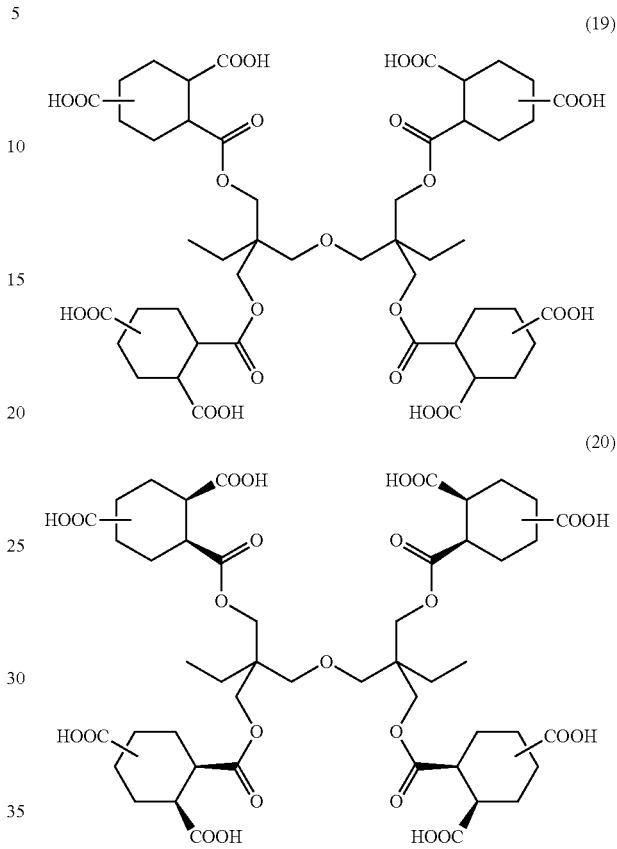

In the resin composition, the content of the compound represented by the formula (6) is preferably 10 to 100 parts by mass, more preferably 30 to 99 parts by mass, still more preferably 50 to 95 parts by mass, and still more preferably 60 to 90 parts by mass based on 100 parts by mass of the total of the compound (D) because superior alkaline developability can be conferred, and better curability can be exhibited, without inhibiting photocuring reaction, in the resin composition.

[Method for Producing Compound Represented by Formula (6)]

The compound represented by the formula (6) can be produced by a publicly known method and can be obtained, for example, by involving the step of subjecting an alcohol compound represented by the formula (21) and an acid anhydride represented by the formula (22) (cyclohexane-1,2,4-tricarboxylic acid-1,2-anhydride) to esterification reaction. The acid anhydride represented by the formula (22) is present in a cis form, in a trans form, or as a mixture of cis and trans forms because the structure of the two carbonyl groups bonded to the cyclohexane ring and the one carboxy group has a conformation. That is, the acid anhydride represented by the formula (22) may be one compound or may be a mixture containing two or more isomers.

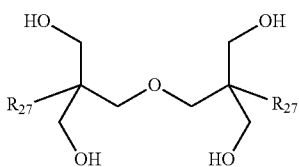

(21)

In the formula (21), each $R_{27}$ independently represents a hydrogen atom, or a linear or branched alkyl group having 1 to 6 carbon atoms.

For the linear or branched alkyl group having 1 to 6 carbon atoms, also including a preferable form thereof, $R_{14}$ in the formula (6) can be referred to.

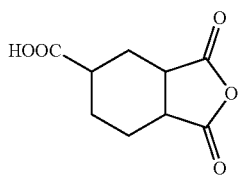

(22)

Examples of the alcohol compound represented by the formula (21) include di(trimethylolethane), di(trimethylolpropane), di(trimethylolbutane), di(trimethylolpentane), 2,2'-(oxybis(methylene))bis(propane-1,3-diol), 2,2'-(oxybis(methylene))bis(2-methylpropane-1,3-diol), and 2-((2,2-bis(hydroxymethyl)butoxy)methyl)-2-methylpropane-1,3-diol.

As the acid anhydride represented by the formula (22), it is preferable to contain an acid anhydride represented by the formula (23) (cis,cis-cyclohexane-1,2,4-tricarboxylic acid-1,2-anhydride) because superior alkaline developability can be conferred upon producing a cured product using the compound represented by the formula (6). That is, when the positions of the carbonyl groups with respect to the cyclohexane ring in the acid anhydride represented by the formula (23) are defined as positions 1 and 2, it is preferable that the conformation of the carbonyl group bonded to position 4 with respect to the carbonyl group, and the two carbonyl groups be a cis form.

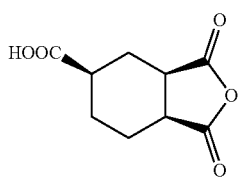

(23)

The esterification reaction can be performed in a solvent or with no solvent. The solvent is not particularly limited as long as the solvent reacts neither with the alcohol compound nor with the acid anhydride.

Examples of such a solvent include halogen solvents such as dichloromethane, chloroform, dichloroethane, and chlorobenzene; aprotic polar solvents such as dimethylformamide, dimethylacetamide, dimethylsulfoxide, tetrahydrofuran, dioxane, and acetonitrile; ketone solvents such as acetone, methyl ethyl ketone, methyl isobutyl ketone, cyclopentanone, and cyclohexanone; cellosolve solvents such as 2-ethoxyethanol and propylene glycol monomethyl ether; aliphatic alcohol solvents such as methanol, ethanol, propanol, isopropanol, and butanol; aromatic group-containing phenol solvents such as phenol and cresol; ester solvents such as ethyl lactate, methyl acetate, ethyl acetate, butyl acetate, isoamyl acetate, methyl methoxypropionate, methyl hydroxyisobutyrate, f-butyrolactone, and propylene glycol monomethyl ether acetate; aromatic hydrocarbon solvents such as toluene and xylene. One of these solvents can be used, or two or more thereof can be appropriately mixed and used.

Among the above, a halogen solvent, an aprotic polar solvent, a ketone solvent, and an ester solvent are preferable because the alcohol compound and the acid anhydride can be more sufficiently dissolved.

The halogen solvent is preferably dichloromethane. The aprotic polar solvent is preferably dimethylacetamide. The ketone solvent is preferably methyl ethyl ketone. The cellosolve solvent is preferably propylene glycol monomethyl ether. The ester solvent is preferably butyl acetate, γ-butyrolactone, or propylene glycol monomethyl ether acetate.

In the case of using the solvent, the amount of the solvent used is normally 20 to 2000 parts by mass based on 100 parts by mass of the total of the alcohol compound and the acid anhydride.

The esterification reaction may employ no catalyst or may employ a catalyst.

In the case of using the catalyst, examples of the catalyst include acidic compounds such as hydrochloric acid, sulfuric acid, methanesulfonic acid, trifluoromethanesulfonic acid, p-toluenesulfonic acid, nitric acid, trifluoroacetic acid, and trichloroacetic acid; metal hydroxides such as sodium hydroxide, potassium hydroxide, calcium hydroxide, and magnesium hydroxide; amine compounds such as triethylamine, tripropylamine, diisopropylethylamine, and tributylamine; aliphatic amines having an aromatic ring, such as aniline, N-methylaniline, N,N-dimethylaniline, and benzylamine; heterocyclic compounds such as pyridine, 4-dimethylaminopyridine, 1,8-diazabicyclo[5.4.0]undec-7-ene, imidazole, triazole, and tetrazole; quaternary ammonium salts such as tetramethylammonium hydroxide, tetraethylammonium hydroxide, tetrapropylammonium hydroxide, tetrabutylammonium hydroxide, trimethylethylammonium hydroxide, trimethylpropylammonium hydroxide, trimethylbutylammonium hydroxide, trimethylcetylammonium hydroxide, trioctylmethylammonium hydroxide, tetramethylammonium chloride, tetramethylammonium bromide, tetramethylammonium iodide, tetramethylammonium acetate, and trioctylmethylammonium acetate; o-titanates such as tetraethyl o-titanate and tetramethyl o-titanate; and metal soaps such as tin octylate, cobalt octylate, zinc octylate, manganese octylate, calcium octylate, sodium octylate, and potassium octylate. One of these catalysts can be used, or two or more thereof can be appropriately mixed and used. Among the above, an amine compound, an aliphatic amine having an aromatic ring, and a heterocyclic compound are preferable, and triethylamine and 4-dimethylaminopyridine are more preferable, because the reactivity is better. In the case of using the catalyst, the amount of the catalyst used is normally 0.0001 to 1000 parts by mass based on 1 part by mass of the alcohol compound.

Examples of the method for adding the catalyst include a method of directly adding the catalyst to the alcohol compound and/or the acid anhydride, and a method of adding a solution of the catalyst dissolved in a dissolving solvent or the like to the alcohol compound, the acid anhydride, and/or a solvent contained therein.

In the case of performing esterification using the catalyst, the reaction temperature of the esterification depends on the amount of the catalyst and the solvent used and is not particularly limited, and is normally −20 to 150° C. The reaction time is not particularly limited and is normally 0.5 to 100 hours. The reaction may complete at one stage or may be performed at two or more stages.

In the present embodiment, the esterification can be performed with no catalyst because the alcohol compound represented by the formula (21) and the acid anhydride represented by the formula (22) have relatively high reactivity. As the acid anhydride represented by the formula (22), it is preferable to contain an acid anhydride represented by the formula (23) because the reactivity with the alcohol compound is higher. In the present specification, the phrase "with no catalyst" means that a catalyst that contributes to the esterification reaction is not added or is added only in a very small amount. Specifically, the phrase means that the amount of the catalyst is 50 ppm or less based on 1 part by mass of the alcohol compound represented by the formula (22) during the reaction. The amount of the catalyst that contributes to the esterification reaction is preferably 0 ppm during the reaction.

In the case of performing esterification with no catalyst, the solvent is preferably a halogen solvent, a ketone solvent, or an ester solvent because the alcohol compound and the acid anhydride can be more sufficiently dissolved, and the resulting compound represented by the formula (6) can also be more sufficiently dissolved. A halogen solvent and an ester solvent are more preferable because superior solubility can be exhibited, and the hydrolysis of the acid anhydride can be further suppressed. An ester solvent is still more preferable because the alcohol compound and the acid anhydride can be more properly reacted, the hydrolysis of the acid anhydride can be further suppressed, and an environmental load is reduced. The halogen solvent is preferably dichloromethane because superior solubility can be exhibited. The ketone solvent is preferably methyl ethyl ketone because superior solubility can be exhibited. The ester solvent is preferably butyl acetate, γ-butyrolactone, or propylene glycol monomethyl ether acetate because superior solubility can be exhibited.

Use of such a solvent with no catalyst can omit the step of isolating the compound represented by the formula (6) from the later-described reaction mixture and a purification step. The reaction temperature and the reaction time are as described later.

The reason for this is not certain, but the present inventors estimate it as follows. That is, use of the halogen solvent, the ketone solvent, or the ester solvent more suitably suppresses the hydrolysis of the acid anhydride represented by the formula (22) and can further suppress side reaction other than the esterification reaction of interest. Therefore, impurities are unlikely to be formed, and the compound of interest with a high purity can presumably be obtained.

The amount of the solvent used is normally 20 to 2000 parts by mass based on 100 parts by mass of the total of the alcohol compound and the acid anhydride, and is preferably 20 to 1000 parts by mass, and more preferably 20 to 500 parts by mass because an environmental load is further reduced.

In the case of performing esterification with no catalyst, the reaction temperature of the esterification can be appropriately set depending on the solvent used and is normally −20 to 150° C., more preferably 0 to 150° C., and still more preferably 20 to 120° C. because the esterification proceeds more properly.

In the case of performing esterification with no catalyst, the reaction time is normally 0.5 to 100 hours and is more preferably 0.5 to 80 hours, and still more preferably 0.5 to 50 hours because side reaction is suppressed, and the esterification proceeds more properly. The reaction may complete at one stage or may be performed at two or more stages.

When an ester solvent is used as the solvent, the alcohol compound and the acid anhydride can be more sufficiently esterified with no catalyst. This can reduce cost required for a catalyst and can omit the step of removing a catalyst. Impurities are unlikely to be formed, and a compound with a relatively high purity can be obtained. Therefore, under this production condition, the step of isolating the compound represented by from the formula (4) from the later-described reaction mixture and a purification step can also be omitted. The reaction temperature and the reaction time are as described above.

The reason for this is not certain, but the present inventors estimate it as follows. That is, the ester solvent can further suppress the hydrolysis of the acid anhydride represented by the formula (22) and can further suppress side reaction other than the esterification reaction of interest. Therefore, impurities are more unlikely to be formed as compared with other solvents, and the compound of interest with a higher purity can presumably be obtained.

As for a method for isolating the compound of interest from the reaction mixture containing the compound represented by the formula (6), the compound of interest, when deposited from the reaction solvent, can be isolated by filtration or centrifugation. The compound of interest, when dissolved in the reaction solvent, can be deposited, for example, by distilling off the solvent under reduced pressure, by adding an appropriate poor solvent into the reaction mixture, or by discharging the reaction mixture into a poor solvent, and isolated by filtration or centrifugation. Examples of the poor solvent include hydrocarbons such as hexane, heptane, cyclohexane, toluene, and xylene. One of these solvents can be used, or two or more thereof can be appropriately mixed and used.

When the isolated compound needs to be further purified, a publicly known method can be adopted for the purification. Examples of such a method include a distillation purification method, a recrystallization method, a column chromatography method, sludge treatment, and active carbon treatment.

The obtained compound represented by the formula (6) can be identified by a publicly known method such as NMR (nuclear magnetic resonance analysis). The purity of the compound can be analyzed by, for example, GPC, liquid chromatography, or IR spectroscopy. Volatile components such as by-products and a residual solvent in the compound can be quantitatively analyzed by, for example, GPC or gas chromatography. A halide remaining in the compound can be identified using, for example, a liquid chromatograph-mass spectrometer, and can also be decomposed by a potentiometric titration method using a silver nitrate solution or a combustion method and then quantified by ion chromatography.

In the present embodiment, as the compound (D), an acid anhydride of a complete hydride of aromatic polycarboxylic acid and/or a partial hydride of aromatic polycarboxylic acid is more preferably contained because superior alkaline developability can be imparted to the resin composition. Such a compound is still more preferably used together with the compound represented by the formula (6) because superior alkaline developability can be imparted to the resin composition.

Examples of the acid anhydride of a complete hydride of aromatic polycarboxylic acid and the acid anhydride of a partial hydride of aromatic polycarboxylic acid include acid anhydrides such as 1,2,4-cyclohexanetricarboxylic acid-1,2-anhydride and 1,2,4,5-cyclohexanetetracarboxylic dianhydride; and acid anhydrides of complete hydrides or acid anhydrides of partial hydrides of 1,2,3-benzenetricarboxylic acid, 1,2,4-naphthalenetricarboxylic acid, 3,3',4,4'-benzophenonetetracarboxylic acid, 2,2',3,3'-benzophenonetetracarboxylic acid, 2,3,3',4'-benzophenonetetracarboxylic acid, 3,3',4,4'-biphenyltetracarboxylic acid, 2,2',3,3'-biphenyltetracarboxylic acid, 2,3,3',4'-biphenyltetracarboxylic acid, 4,4'-oxydiphthalic acid, diphenylmethanetetracarboxylic acid, 1,2,5,6-naphthalenetetracarboxylic acid, 2,3,6,7-naphthalenetetracarboxylic acid, 3,4,9,10-perylenetetracarboxylic acid, anthracenetetracarboxylic acid, 4,4'-(hexafluoroisopropylidene)diphthalic acid, benzenepentacarboxylic acid, and benzenehexacarboxylic acid.

The acid anhydride of a complete hydride of aromatic polycarboxylic acid and the acid anhydride of a partial hydride of aromatic polycarboxylic acid preferably have an alicyclic structure including monocyclic cycloalkane such as cyclopentane and cyclohexane; monocyclic cycloalkene such as cyclopropene and cyclohexene; bicyclic alkane such as bicycloundecane and decalin; and bicyclic alkene such as norbornene and norbornadiene, and more preferably have monocyclic cycloalkane or monocyclic cycloalkene, because superior alkaline developability can be conferred, and compatibility with the compound represented by the formula (6) is excellent for use together with the compound represented by the formula (6). Preferable examples of such an acid anhydride include 1,2,4-cyclohexanetricarboxylic acid-1,2-anhydride and 1,2,4,5-cyclohexanetetracarboxylic dianhydride. 1,2,4-Cyclohexanetricarboxylic acid-1,2-anhydride is still more preferable, and cis,cis-1,2,4-cyclohexanetricarboxylic acid-1,2-anhydride is furthermore preferable, because superior alkaline developability can be conferred, and compatibility with the compound represented by the formula (6) is excellent for use together with the compound represented by the formula (6).

In the resin composition, the total content of the acid anhydrides of a complete hydride of aromatic polycarboxylic acid and a partial hydride of aromatic polycarboxylic acid is preferably 0.1 to 40 parts by mass, more preferably 1.0 to 30 parts by mass, still more preferably 5.0 to 25 parts by mass, and even more preferably 10 to 20 parts by mass based on 100 parts by mass of the total of the compound (D) because superior alkaline developability can be conferred, and better curability can be exhibited, without inhibiting photocuring reaction, in the resin composition.

[Maleimide Compound (E)]

It is preferable that the resin composition of the present embodiment contain at least one maleimide compound (E) selected from the group consisting of a compound represented by the formula (8), a compound represented by the formula (9), a compound represented by the formula (10), a compound represented by the formula (11), a compound represented by the formula (12), and a compound represented by the formula (13).

As mentioned above, normally, the reactivity of maleimide compounds towards photo radical is very low. However, the bismaleimide compound (A) has superior light transmissivity as mentioned above. Therefore, even when the resin composition contains the maleimide compound (E), by using the bismaleimide compound (A) together with the initiator (B1) and/or the initiator (B2), and the initiator (C), as well as the compound (D) which is compounded if required, light reaches the photo initiators sufficiently using various active energy rays, particularly, an active energy ray including a wavelength of 405 nm (h-line), radical reaction using radicals generated from the photo initiators proceeds, the photo radical reaction of the maleimide efficiently takes place, and photocuring can be achieved.

The resin composition containing the maleimide compound (E) is also excellent in alkaline developability and photocurability. The resulting cured product is also superior in heat resistance, insulation reliability, and thermal stability. Therefore, protective films and insulation layers can be suitably formed.

As the maleimide compound (E), at least one selected from the group consisting of a compound represented by the formula (8), a compound represented by the formula (9), and a compound represented by the formula (10) is preferably contained, and at least one selected from the group consisting of a compound represented by the formula (8) and a compound represented by the formula (9) is more preferably contained from the viewpoint that better curability can be exhibited, heat resistance and thermal stability are superior, and better solubility in a solvent, a low melting point, low water absorbency, and better compatibility with other resins are exhibited.

Next, the compound represented by the formula (8) to the compound represented by the formula (13) which are contained as the maleimide compound (E) will be described.

(Compound Represented by Formula (8))

The compound represented by the formula (8) is the following compound.

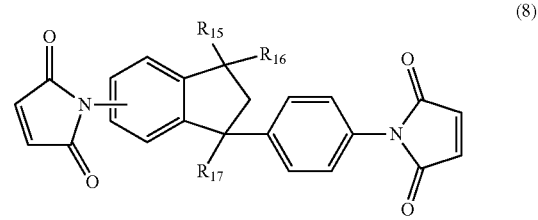

In the formula (8), each of $R_{15}$, $R_{16}$, and $R_{17}$ independently represents a hydrogen atom, or a linear or branched alkyl group having 1 to 8 carbon atoms and optionally having a substituent.

Examples of the linear or branched alkyl group having 1 to 8 carbon atoms and optionally having a substituent include a methyl group, an ethyl group, a propyl group, an isopropyl group, a n-butyl group, an isobutyl group a tert-butyl group, a n-pentyl group, a 1-ethylpropyl group, a 2,2-dimethylpropyl group, a cyclopentyl group, a hexyl group, and a heptyl group. A hydrogen atom in these alkyl groups may be replaced by a halogen atom such as a fluorine atom or a chlorine atom, or a cyano group or the like. Among these alkyl groups, a methyl group, an ethyl group, an isopropyl group, and a tert-butyl group are preferable, a methyl group, an ethyl group, and an isopropyl group are more preferable, and a methyl group is still more preferable from the viewpoint of having superior photocurability, heat resistance, and thermal stability and exhibiting good solubility in a solvent, a low melting point, low water absorbency, and good compatibility with other resins.

The compound represented by the formula (8) is even more preferably a compound represented by the formula (24) (in the present embodiment, also referred to as TMDM) from the viewpoint of having superior photocurability, heat resistance, and thermal stability and exhibiting solubility in a solvent, a low melting point, low water absorbency, and compatibility with other resins.

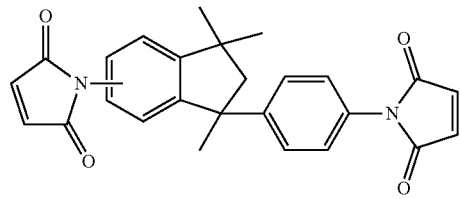

(24)

(Compound Represented by Formula (9))

The compound represented by the formula (9) is the following compound.

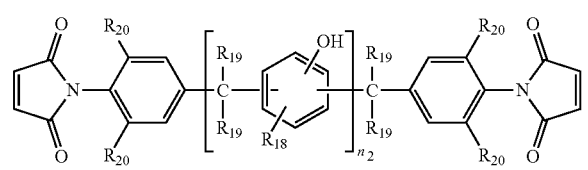

(9)

In the formula (9), each of $R_{18}$, $R_{19}$, and $R_{20}$ independently represents a hydrogen atom, a hydroxy group, or a linear or branched alkyl group having 1 to 6 carbon atoms and optionally having a substituent. $n_2$ represents an integer of 1 to 10.

For the linear or branched alkyl group having 1 to 6 carbon atoms, $R_{14}$ in the formula (6) can be referred to. The alkyl group is preferably a methyl group, an ethyl group, a n-propyl group, or an isopropyl group, and more preferably a methyl group from the viewpoint of exhibiting better solubility in a solvent, a low melting point, low water absorbency, and better compatibility with other resins.

As for $R_{18}$, $R_{19}$, and $R_{20}$, preferably, each of $R_{18}$ and $R_{20}$ is a linear or branched alkyl group having 1 to 6 carbon atoms, and $R_{19}$ is a hydrogen atom, from the viewpoint of exhibiting superior solubility in a solvent. A preferable alkyl group is as described above.

$n_2$ is preferably an integer of 1 to 10, and more preferably an integer of 1 to 6 because the solubility in a solvent is superior, a more suitable viscosity can be obtained, and an increase in viscosity of varnish can be more reliably controlled.

As the compound represented by the formula (9), commercial products can also be used. Examples thereof include a compound represented by the formula (25) (BCPH01 (product name, Mw/Mn=1.0 to 1.8) manufactured by Gunei Chemical Industry Co., Ltd., and BCPH13 (product name, Mw/Mn=1.0 to 1.6) manufactured by Gunei Chemical Industry Co., Ltd.), and a compound represented by the formula (26) (BMCX426 (product name) manufactured by Gunei Chemical Industry Co., Ltd.).

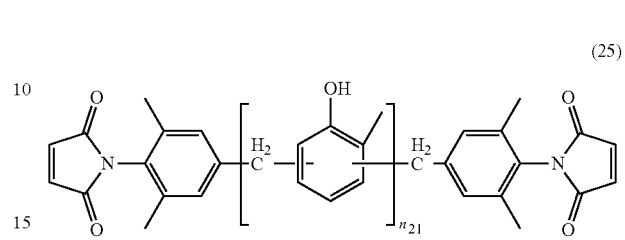

(25)

In the formula (25), $n_{21}$ is an integer of 1 to 5.

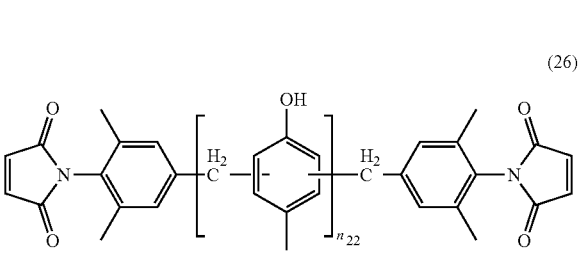

(26)

In the formula (26), $n_{22}$ is an integer of 1 to 10.

(Compound Represented by Formula (10))

The compound represented by the formula (10) is the following compound.

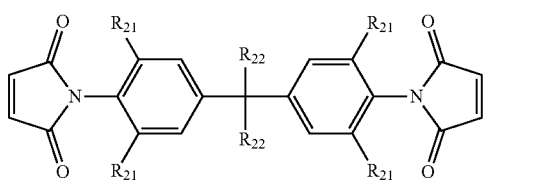

(10)

In the formula (10), each $R_{21}$ independently represents a hydrogen atom, a methyl group, or an ethyl group, and each $R_{22}$ independently represents a hydrogen atom or a methyl group.

$R_{21}$ is preferably a methyl group or an ethyl group from the viewpoint of exhibiting better solubility in a solvent, a low melting point, low water absorbency, and better compatibility with other resins.

$R_{22}$ is preferably a hydrogen atom from the viewpoint of exhibiting better solubility in a solvent, a low melting point, low water absorbency, and better compatibility with other resins.

As the maleimide compound represented by the formula (10), commercial products can also be used. Examples thereof include BMI-70 (product name) manufactured by K•I Chemical Industry Co., LTD. which is represented by the formula (27)

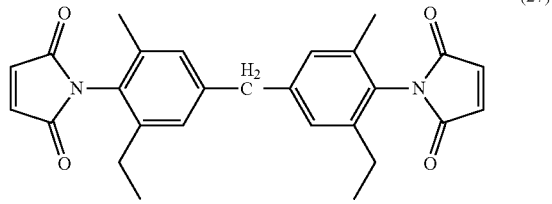

(27)

(Compound Represented by Formula (11))

The compound represented by the formula (11) is the following compound.

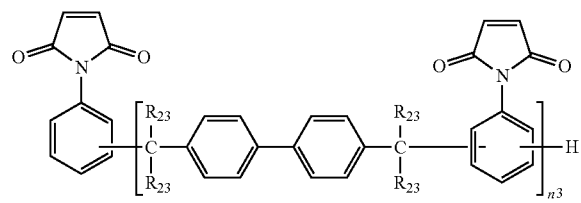

(11)

In the formula (11), each $R_{23}$ independently represents a hydrogen atom or a methyl group. $n_3$ represents an integer of 1 to 10.

As the maleimide compound represented by the formula (11), commercial products can also be used. Examples thereof include MIR-3000 (product name) manufactured by Nippon Kayaku Co., Ltd. which is represented by the formula (28)

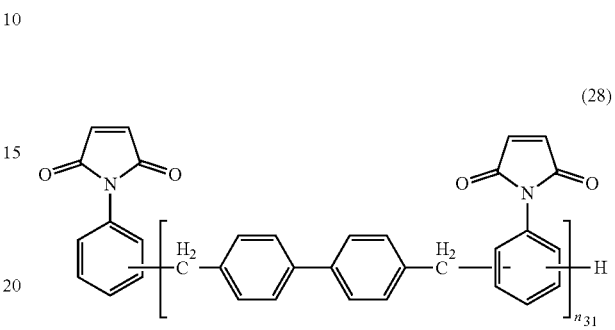

(28)

In the formula (28), $n_{31}$ is an integer of 1 to 10.

(Compound Represented by Formula (12))

The compound represented by the formula (12) is the following compound.

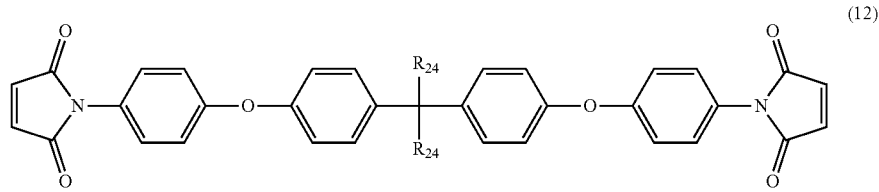

(12)

In the formula (12), each $R_{24}$ independently represents a hydrogen atom, a methyl group, or an ethyl group.

$R_{24}$ is preferably a methyl group or an ethyl group from the viewpoint of exhibiting better solubility in a solvent, a low melting point, low water absorbency, and better compatibility with other resins.

As the maleimide compound represented by the formula (12), commercial products can also be used. Examples thereof include BMI-80 (product name) manufactured by K•I Chemical Industry Co., LTD. which is represented by the formula (29)

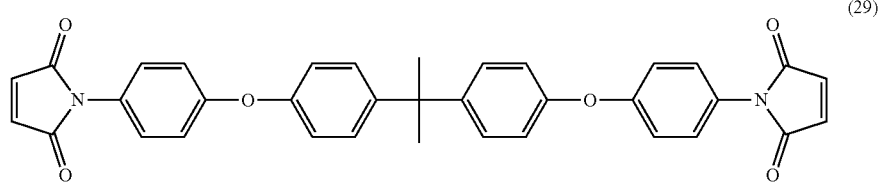 [SMILES: CC(C)(c1ccc(Oc2ccc(N3C(=O)C=CC3=O)cc2)cc1)c1ccc(Oc2ccc(N3C(=O)C=CC3=O)cc2)cc1]

(29)

(Compound Represented by Formula (13))

The compound represented by the formula (13) is the following compound.

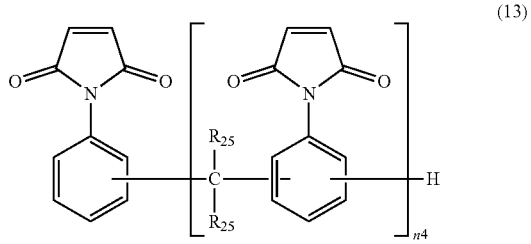

In the formula (13), each $R_{25}$ independently represents a hydrogen atom or a methyl group. $n_4$ represents an integer of 1 to 10.

$R_{25}$ is preferably a hydrogen atom from the viewpoint of exhibiting better solubility in a solvent, a low melting point, low water absorbency, and better compatibility with other resins.

$n_4$ is more preferably an integer of 1 to 5 because the solubility in a solvent is superior, a more suitable viscosity can be obtained, and an increase in viscosity of varnish can be more reliably controlled.

As the maleimide compound represented by the formula (13), commercial products can also be used. Examples thereof include BMI-2300 (product name) manufactured by Daiwa Kasei Industry Co., LTD. which is represented by the formula (30).

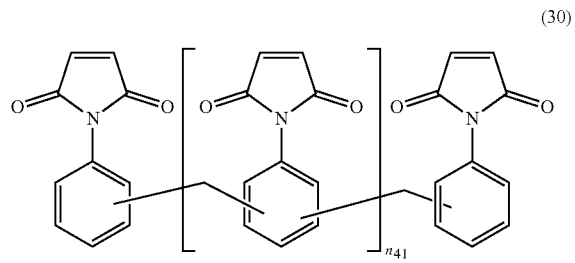

In the formula (30), $n_{41}$ is an integer of 1 to 5.

In the resin composition, the total content of the maleimide compound (E) is preferably 10 to 90 parts by mass, more preferably 20 to 70 parts by mass, still more preferably 25 to 60 parts by mass, even more preferably 30 to 50 parts by mass, and furthermore preferably 35 to 45 parts by mass based on 100 parts by mass of the resin solid content in the resin composition from the viewpoint that superior heat resistance and thermal stability can be obtained.

In the resin composition, the total content of the maleimide compound (E) is preferably 10 to 90 parts by mass, more preferably 20 to 70 parts by mass, still more preferably 25 to 60 parts by mass, even more preferably 30 to 50 parts by mass, and furthermore preferably 35 to 45 parts by mass based on 100 parts by mass of the total of the bismaleimide compound (A) and the maleimide compound (E) from the viewpoint that superior heat resistance and thermal stability can be obtained.

When the resin composition contains the compound (D) and the compound (E) together with the bismaleimide compound (A), the initiator (B1) and/or the initiator (B2), and the initiator (C), the total content of the maleimide compound (E) is preferably 10 to 85 parts by mass, more preferably 15 to 80 parts by mass, still more preferably 20 to 60 parts by mass, and even more preferably 25 to 50 parts by mass based on 100 parts by mass of the total of the bismaleimide compound (A), the initiator (B1), the initiator (B2), the initiator (C), the compound (D), and the compound (E) from the viewpoint that superior heat resistance and thermal stability can be obtained.

[Other Maleimide Compounds]

The resin composition of the present embodiment may further contain other maleimide compounds different from the bismaleimide compound (A) and the maleimide compound (E). Such other maleimide compounds are not particularly limited as long as the compounds have one or more maleimide groups in the molecule. Other maleimide compounds include N-phenylmaleimide, N-cyclohexylmaleimide, N-hydroxyphenylmaleimide, N-anilinophenylmaleimide, N-carboxyphenylmaleimide, N-(4-carboxy-3-hydroxyphenyl)maleimide, 6-maleimidehexanoic acid, 4-maleimidebutyric acid, bis(4-maleimidophenyl)methane, 2,2-bis(4-(4-maleimidephenoxy)-phenyl)propane, 4,4-diphenylmethanebismaleimide, bis(3,5-dimethyl-4-maleimidephenyl)methane, bis(3-ethyl-5-methyl-4-maleimidephenyl)methane, bis(3,5-diethyl-4-maleimidephenyl)methane, phenylmethanemaleimide, o-phenylene bismaleimide, m-phenylene bismaleimide, p-phenylene bismaleimide, o-phenylenebiscitraconimido, m-phenylenebiscitraconimido, p-phenylenebiscitraconimido, 2,2-bis(4-(4-maleimidephenoxy)-phenyl)propane, 3,3-dimethyl-5,5-diethyl-4,4-diphenylmethane bismaleimide, 4-methyl-1,3-phenylenebismaleimide, 1,2-bismaleimideethane, 1,4-bismaleimidebutane, 1,5-bismaleimidepentane, 1,5-bismaleimide-2-methylpentane, 1,6-bismaleimidehexane, 1,6-bismaleimide-(2,2,4-trimethyl)hexane, 1,8-bismaleimide-3,6-dioxaoctane, 1,11-bismaleimide-3,6,9-trioxaundecane, 1,3-bis(maleimide methyl)cyclohexane, 1,4-bis(maleimide methyl)cyclohexane, 4,4-diphenyl ether bismaleimide, 4,4-diphenyl sulfone bismaleimide, 1,3-bis(3-maleimidephenoxy)benzene, 1,3-bis(4-maleimidephenoxy)benzene, 4,4-diphenylmethanebiscitraconimido, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethane maleimide, fluorescein-5-maleimide, and a prepolymer of these maleimide compounds, and a prepolymer of maleimide compounds and amine compounds. One of these maleimide compounds can be used, or two or more thereof can be appropriately mixed and used.

As other maleimide compounds, a compound excellent in light transmissivity is preferably used.

When the resin composition contains other maleimide compounds, the total content of other maleimide compounds is normally on the order of 0.01 to 40 parts by mass based on 100 parts by mass of the resin solid content in the resin composition.

[Filler]

In the resin composition of the present embodiment, a filler can be used for further improving a variety of characteristics such as a coating property and heat resistance. The filler is preferably one that has an insulation property and does not inhibit transmissivity for various active energy rays used for photocuring, and more preferably one that does not inhibit transmissivity for an active energy ray including a wavelength of 405 nm (h-line).

Examples of the filler include silica (for example, natural silica, fused silica, amorphous silica and hollow silica), an aluminum compound (for example, boehmite, aluminum hydroxide, alumina and aluminum nitride), a boron compound (for example, boron nitride), a magnesium compound (for example, magnesium oxide and magnesium hydroxide), a calcium compound (for example, calcium carbonate), a molybdenum compound (for example, molybdenum oxide and zinc molybdate), a barium compound (for example, barium sulfate and barium silicate), talc (for example, natural talc and calcined talc), mica, glass (for example, short fibrous glass, spherical glass, fine powder glass, E glass, T glass and D glass), silicone powder, a fluororesin-based filler, a urethane resin-based filler, a (meth)acrylic resin-based filler, a polyethylene-based filler, a styrene-butadiene rubber, and a silicone rubber. One of these fillers can be used, or two or more thereof can be appropriately mixed and used.

Among the above, it is preferable that the filler should be one or more selected from the group consisting of silica, boehmite, barium sulfate, silicone powder, a fluororesin-based filler, a urethane resin-based filler, a (meth)acrylic resin-based filler, a polyethylene-based filler, a styrene-butadiene rubber, and a silicone rubber.

These fillers may be surface-treated with a silane coupling agent, which will be mentioned later, or the like.

From the viewpoint of further improving the heat resistance of the cured product and obtaining a better coating property, silica is preferable and fused silica is more preferable. Specific examples of the silica include SFP-130MC (product name) manufactured by Denka Company Limited, and SC2050-MB (product name), SC1050-MLE (product name), YA010C-MFN (product name), and YA050C-MJA (product name) manufactured by Admatechs Company Limited.

The particle diameter of the filler is not particularly limited, but in view of further obtaining ultraviolet light transmissivity of the resin composition, it is normally 0.005 to 10 μm, and is preferably 0.01 to 1.0 μm.

In the resin composition, the content of the filler is normally preferably 300 parts by mass or less, more preferably 200 parts by mass or less, and still more preferably 100 parts by mass or less based on 100 parts by mass of the resin solid content in the resin composition from the viewpoint of further improving the light transmissivity of the resin composition and the heat resistance of the cured product. When the filler is contained, the lower limit value of its content is normally 1 part by mass based on 100 parts by mass of the resin solid content in the resin composition from the viewpoint of obtaining effects of further improving a variety of characteristics such as a coating property and heat resistance.

[Silane Coupling Agent and Wetting and Dispersing Agent]

In the resin composition of the present embodiment, a silane coupling agent and/or a wetting and dispersing agent can also be used in combination in order to further improve the dispersibility of the filler, and the adhesive strength between the polymers and/or the resins and the filler.

The silane coupling agent is not particularly limited as long as it is a silane coupling agent generally used for surface treatment of inorganic matters. Examples thereof include aminosilane-based compounds such as 3-aminopropyltrimethoxysilane, γ-aminopropyltriethoxysilane, 3-aminopropyldimethoxymethylsilane, 3-aminopropyldiethoxymethylsilane, N-β-(aminoethyl)-γ-aminopropyltrimethoxysilane, N-(2-aminoethyl)-3-aminopropyltriethoxysilane, N-(2-aminoethyl)-3-aminopropyldimethoxymethylsilane, N-(2-aminoethyl)-3-aminopropyldiethoxymethylsilane, N-phenyl-3-aminopropyltrimethoxysilane, N-phenyl-3-aminopropyltriethoxysilane, [3-(6-aminohexylamino) propyl]trimethoxysilane and [3-(N,N-dimethylamino) propyl]trimethoxysilane; epoxysilane-based compounds such as γ-glycidoxypropyltrimethoxysilane, 3-glycidoxypropyltriethoxysilane, 3-glycidoxypropyldimethoxymethylsilane, 3-glycidoxypropyldiethoxymethylsilane, 2-(3,4-epoxycyclohexyl)ethyltrimethoxysilane and [8-(glycidyloxy)-n-octyl]trimethoxysilane; vinylsilane-based compounds such as vinyltris(2-methoxyethoxy)silane, vinyltrimethoxysilane, vinyltriethoxysilane, dimethoxymethylvinylsilane, diethoxymethylvinylsilane, trimethoxy(7-octen-1-yl)silane and trimethoxy(4-vinylphenyl)silane; methacrylic silane-based compounds such as 3-methacryloxypropyltrimethoxysilane, 3-methacryloxypropyltriethoxysilane, 3-methacryloxypropyldimethoxymethylsilane and 3-methacryloxypropyldimethoxymethylsilane; acrylic silane-based compounds such as 3-acryloxypropyltrimethoxysilane and 3-acryloxypropyltriethoxysilane; isocyanate silane-based compounds such as 3-isocyanatepropyltrimethoxysilane and 3-isocyanatepropyltriethoxysilane; isocyanurate silane-based compounds such as tris-(trimethoxysilylpropyl)isocyanurate; mercaptosilane-based compounds such as 3-mercaptopropyltrimethoxysilane and 3-mercaptopropyldimethoxymethylsilane; ureidosilane-based compounds such as 3-ureidopropyltriethoxysilane; styrylsilane-based compounds such as p-styryltrimethoxysilane; cationic silane-based compounds such as N-β-(N-vinylbenzylaminoethyl)-γ-aminopropyltrimethoxysilane hydrochlorides; acid anhydride-based compounds such as [3-(trimethoxysilyl)propyl]succinic anhydride; phenylsilane-based compounds such as phenyltrimethoxysilane, phenyltriethoxysilane, dimethoxymethylphenylsilane, diethoxymethylphenylsilane and p-tolyltrimethoxysilane; and arylsilane-based compounds such as trimethoxy(1-naphthyl)silane. One of these silane coupling agents can be used, or two or more thereof can be appropriately mixed and used.

In the resin composition, the content of the silane coupling agent is normally 0.1 to 10 parts by mass based on 100 parts by mass of the resin solid content in the resin composition.

The wetting and dispersing agent is not particularly limited as long as it is a dispersion stabilizer used for a paint. Specific examples of the wetting and dispersing agent include DISPERBYK (registered trademark)-110 (product name), 111 (product name), 118 (product name), 180 (product name), and 161 (product name), and BYK (registered trademark)-W996 (product name), W9010 (product name), and W903 (product name) manufactured by BYK Japan KK. One of these wetting and dispersing agents can be used, or two or more thereof can be appropriately mixed and used.

In the resin composition, the content of the wetting and dispersing agent is normally 0.1 to 10 parts by mass based on 100 parts by mass of the resin solid content in the resin composition.

[Cyanate Compound, Phenolic Resin, Oxetane Resin, Benzoxazine Compound, Epoxy Resin, and Additional Compound]

In the present embodiment, as long as the effect of the present invention is achieved, a variety of types of compounds and resins such as a cyanate compound, a phenolic resin, an oxetane resin, a benzoxazine compound, an epoxy resin and additional compounds in addition to the bismaleimide compound (A), the initiator (B1), the initiator (B2), the compound (C), the compound (D), the compound (E), and the additional maleimide compound can be used, depending on characteristics such as flame retardancy, heat resistance and a thermal expansion property of the cured product. Preferably, these compounds and resins ensure that the resin composition becomes light-sensitive to be photo-cured when exposed with an active energy ray including 405 nm (h-line).

One of these compounds and resins can be used, or two or more thereof can be appropriately mixed and used.

<Cyanate Compound>

The cyanate compound is not particularly limited as long as it is a resin having in the molecule an aromatic moiety substituted by at least one cyanate group (cyanate group).

For example, mention may be made of those represented by the formula (31).

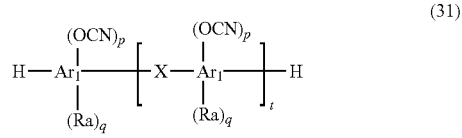
(31)

In the formula (31), $Ar_1$ represents a benzene ring, a naphthalene ring, or two benzene rings bonded to each other by a single bond. When there are a plurality of $Ar_1$, $Ar_1$ may be the same as or different from each other. Each Ra independently represents a hydrogen atom, an alkyl group having 1 to 6 carbon atoms, an alkenyl group having 2 to 6 carbon atoms, an aryl group having 6 to 12 carbon atoms, an alkoxyl group having 1 to 4 carbon atoms, and a group in which an alkyl group having 1 to 6 carbon atoms and an aryl group having 6 to 12 carbon atoms are bonded to each other. The aromatic ring for Ra may have a substituent, and any position can be selected for the substituents in $Ar_1$ and Ra. p represents the number of cyanate groups bonded to $Ar_1$ and each p is independently an integer of 1 to 3. q represents the number of Ra bonded to $Ar_1$ and is 4−p when $Ar_1$ is a benzene ring, 6−p when $Ar_1$ is a naphthalene ring, and 8−p when $Ar_1$ is two benzene rings bonded to each other by a single bond. t represents the average number of repetitions and is an integer of 0 to 50, and the cyanate compound may be a mixture of compounds having different t. X represents any of a single bond, a divalent organic group having 1 to 50 carbon atoms (a hydrogen atom may be replaced by a heteroatom), a divalent organic group having 1 to 10 nitrogen atoms (for example, —N—R—N— (wherein R represents an organic group)), a carbonyl group (—CO—), a carboxy group (—C(=O)O—), a carbonyl dioxide group (—OC(=O)O—), a sulfonyl group (—SO$_2$—), a divalent sulfur atom, and a divalent oxygen atom, and X is each independently as defined above when there are a plurality of X.

The alkyl group for Ra in the formula (31) may have either a linear or branched chain structure or a cyclic structure (for example, a cycloalkyl group).

In addition, a hydrogen atom in the alkyl group and the aryl group for Ra in the formula (31) may be replaced by a halogen atom such as a fluorine atom and a chlorine atom; an alkoxyl group such as a methoxy group and a phenoxy group; a cyano group, or the like.

Specific examples of the alkyl group include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the alkenyl group include a vinyl group, a (meth)allyl group, an isopropenyl group, a 1-propenyl group, a 2-butenyl group, a 3-butenyl group, a 1,3-butanedienyl group, 2-methyl-2-propenyl group, a 2-pentenyl group, and a 2-hexenyl group.

Specific examples of the aryl group include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group.

Examples of the alkoxyl group include a methoxy group, an ethoxy group, a propoxy group, an isopropoxy group, a n-butoxy group, an isobutoxy group, and a tert-butoxy group.

Specific examples of the divalent organic group having 1 to 50 carbon atoms for X in the formula (31) include a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the divalent organic group may be replaced by a halogen atom such as a fluorine atom and a chlorine atom; an alkoxyl group such as a methoxy group and a phenoxy group; a cyano group, or the like.

Examples of the divalent organic group having 1 to 10 nitrogen atoms for X in the formula (31) include an imino group and a polyimide group.

In addition, examples of the organic group of X in the formula (31) include one having a structure represented by the formula (32) or one having a structure represented by the formula (33).

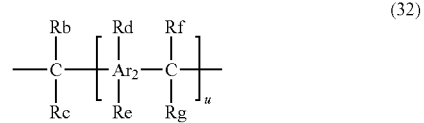
(32)

In the formula (32), $Ar_2$ represents a benzenediyl group, a naphthalenediyl group, or a biphenyldiyl group, and may be the same as or different from each other when u is an integer of 2 or more. Each of Rb, Rc, Rf, and Rg independently represents a hydrogen atom, an alkyl group having 1 to 6 carbon atoms, an aryl group having 6 to 12 carbon atoms, a trifluoromethyl group, or an aryl group having at least one phenolic hydroxy group. Each of Rd and Re is independently selected from any one of a hydrogen atom, an alkyl group having 1 to 6 carbon atoms, an aryl group having 6 to 12 carbon atoms, an alkoxyl group having 1 to 4 carbon atoms, and a hydroxy group. u represents an integer of 0 to 5.

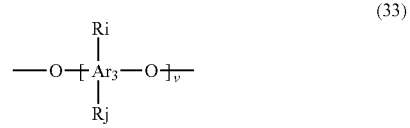
(33)

In the formula (33), $Ar_3$ represents a benzenediyl group, a naphthalenediyl group, or a biphenyldiyl group, and may be the same as or different from each other when v is an integer of 2 or more. Each of Ri and Rj independently represents a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanate group. v represents an integer of 0 to 5, and the cyanate compound may be a mixture of compounds having different v.

Furthermore, examples of X in the formula (31) include divalent groups represented by the following formulas.

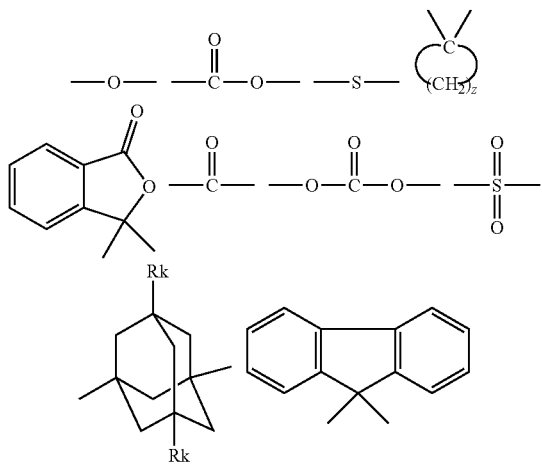

Here, in the above formula, z represents an integer of 4 to 7. Each Rk independently represents a hydrogen atom or an alkyl group having 1 to 6 carbon atoms.

Specific examples of $Ar_2$ in the formula (32) and $Ar_3$ in the formula (33) include a benzenediyl group to which two carbon atoms shown in the formula (32) or two oxygen atoms shown in the formula (33) are bonded at positions 1 and 4 or positions 1 and 3, a biphenyldiyl group to which the above two carbon atoms or two oxygen atoms are bonded at positions 4 and 4', positions 2 and 4', positions 2 and 2', positions 2 and 3', positions 3 and 3', or positions 3 and 4', and a naphthalenediyl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in the formula (32) and Ri and Rj in the formula (33) have the same meanings as those in the above formula (31).

Specific examples of the cyanate-substituted aromatic compound represented by the above formula (31) include cyanatebenzene, 1-cyanate-2-, 1-cyanate-3-, or 1-cyanate-4-methylbenzene, 1-cyanate-2-, 1-cyanate-3-, or 1-cyanate-4-methoxybenzene, 1-cyanate-2,3-, 1-cyanate-2,4-, 1-cyanate-2,5-, 1-cyanate-2,6-, 1-cyanate-3,4-, or 1-cyanate-3,5-dimethylbenzene, cyanateethylbenzene, cyanatebutylbenzene, cyanateoctylbenzene, cyanatenonylbenzene, 2-(4-cyanatephenyl)-2-phenylpropane (a cyanate of 4-α-cumylphenol), 1-cyanate-4-cyclohexylbenzene, 1-cyanate-4-vinylbenzene, 1-cyanate-2- or 1-cyanate-3-chlorobenzene, 1-cyanate-2,6-dichlorobenzene, 1-cyanate-2-methyl-3-chlorobenzene, cyanatenitrobenzene, 1-cyanate-4-nitro-2-ethylbenzene, 1-cyanate-2-methoxy-4-allylbenzene (a cyanate of eugenol), methyl (4-cyanatephenyl) sulfide, 1-cyanate-3-trifluoromethylbenzene, 4-cyanatebiphenyl, 1-cyanate-2- or 1-cyanate-4-acetylbenzene, 4-cyanatebenzaldehyde, methyl 4-cyanatebenzoate ester, phenyl 4-cyanatebenzoate ester, 1-cyanate-4-acetaminobenzene, 4-cyanatebenzophenone, 1-cyanate-2,6-di-tert-butylbenzene, 1,2-dicyanatebenzene, 1,3-dicyanatebenzene, 1,4-dicyanatebenzene, 1,4-dicyanate-2-tert-butylbenzene, 1,4-dicyanate-2,4-dimethylbenzene, 1,4-dicyanate-2,3,4-dimethylbenzene, 1,3-dicyanate-2,4,6-trimethylbenzene, 1,3-dicyanate-5-methylbenzene, 1-cyanate- or 2-cyanatenaphthalene, 1-cyanate-4-methoxynaphthalene, 2-cyanate-6-methoxynaphthalene, 2-cyanate-7-methoxynaphthalene, 2,2'-dicyanate-1,1'-binaphthyl, 1,3-, 1,4-, 1,5-, 1,6-, 1,7-, 2,3-, 2,6-, or 2,7-dicyanatenaphthalene, 2,2'- or 4,4'-dicyanatebiphenyl, 4,4'-dicyanateoctafluorobiphenyl, 2,4'- or 4,4'-dicyanatediphenylmethane, bis(4-cyanate-3,5-dimethylphenyl)methane, 1,1-bis(4-cyanatephenyl)ethane, 1,1-bis(4-cyanatephenyl)propane, 2,2-bis(4-cyanatephenyl) propane, 2,2-bis(4-cyanate-3-methylphenyl)propane, 2,2-bis(2-cyanate-5-biphenylyl)propane, 2,2-bis(4-cyanatephenyl)hexafluoropropane, 2,2-bis(4-cyanate-3,5-dimethylphenyl)propane, 1,1-bis(4-cyanatephenyl)butane, 1,1-bis(4-cyanatephenyl)isobutane, 1,1-bis(4-cyanatephenyl)pentane, 1,1-bis(4-cyanatephenyl)-3-methylbutane, 1,1-bis(4-cyanatephenyl)-2-methylbutane, 1,1-bis(4-cyanatephenyl)-2,2-dimethylpropane, 2,2-bis(4-cyanatephenyl) butane, 2,2-bis(4-cyanatephenyl)pentane, 2,2-bis(4-cyanatephenyl)hexane, 2,2-bis(4-cyanatephenyl)-3-methylbutane, 2,2-bis(4-cyanatephenyl)-4-methylpentane, 2,2-bis(4-cyanatephenyl)-3,3-dimethylbutane, 3,3-bis(4-cyanatephenyl)hexane, 3,3-bis(4-cyanatephenyl)heptane, 3,3-bis(4-cyanatephenyl)octane, 3,3-bis(4-cyanatephenyl)-2-methylpentane, 3,3-bis(4-cyanatephenyl)-2-methylhexane, 3,3-bis(4-cyanatephenyl)-2,2-dimethylpentane, 4,4-bis(4-cyanatephenyl)-3-methylheptane, 3,3-bis(4-cyanatephenyl)-2-methylheptane, 3,3-bis(4-cyanatephenyl)-2,2-dimethylhexane, 3,3-bis(4-cyanatephenyl)-2,4-dimethylhexane, 3,3-bis(4-cyanatephenyl)-2,2,4-trimethylpentane, 2,2-bis(4-cyanatephenyl)-1,1,1,3,3,3-hexafluoropropane, bis(4-cyanatephenyl)phenylmethane, 1,1-bis(4-cyanatephenyl)-1-phenylethane, bis(4-cyanatephenyl)biphenylmethane, 1,1-bis(4-cyanatephenyl)cyclopentane, 1,1-bis(4-cyanatephenyl)cyclohexane, 2,2-bis(4-cyanate-3-isopropylphenyl)propane, 1,1-bis(3-cyclohexyl-4-cyanatephenyl)cyclohexane, bis(4-cyanatephenyl) diphenylmethane, bis(4-cyanatephenyl)-2,2-dichloroethylene, 1,3-bis[2-(4-cyanatephenyl)-2-propyl] benzene, 1,4-bis[2-(4-cyanatephenyl)-2-propyl]benzene, 1,1-bis(4-cyanatephenyl)-3,3,5-trimethylcyclohexane, 4-[bis(4-cyanatephenyl)methyl]biphenyl, 4,4-dicyanatebenzophenone, 1,3-bis(4-cyanatephenyl)-2-propen-1-one, bis (4-cyanatephenyl) ether, bis(4-cyanatephenyl) sulfide, bis(4-cyanatephenyl) sulfone, 4-cyanatebenzoic acid-4-cyanatephenyl ester (4-cyanatephenyl-4-cyanatebenzoate), bis-(4-cyanatephenyl) carbonate, 1,3-bis(4-cyanatephenyl) adamantane, 1,3-bis(4-cyanatephenyl)-5,7-dimethyladamantane, 3,3-bis(4-cyanatephenyl)isobenzofuran-1(3H)-one (a cyanate of phenolphthalein), 3,3-bis(4-cyanate-3-methylphenyl)isobenzofuran-1(3H)-one (a cyanate of o-cresolphthalein), 9,9'-bis(4-cyanatephenyl)fluorene, 9,9-bis(4-cyanate-3-methylphenyl)fluorene, 9,9-bis(2-cyanate-5-biphenylyl)fluorene, tris(4-cyanatephenyl)methane, 1,1,1-tris(4-cyanatephenyl)ethane, 1,1,3-tris(4-cyanatephenyl) propane, α,α,α'-tris(4-cyanatephenyl)-1-ethyl-4-isopropylbenzene, 1,1,2,2-tetrakis(4-cyanatephenyl)ethane, tetrakis(4-cyanatephenyl)methane, 2,4,6-tris(N-methyl-4-cyanateanilino)-1,3,5-triazine, 2,4-bis(N-methyl-4-cyanateanilino)-6-(N-methylanilino)-1,3,5-triazine, bis(N-4-cyanate-2-methylphenyl)-4,4'-oxydiphthalimide, bis(N-3-cyanate-4-methylphenyl)-4,4'-oxydiphthalimide, bis(N-4-cyanatephenyl)-4,4'-oxydiphthalimide, bis(N-4-cyanate-2-methylphenyl)-4,4'-(hexafluoroisopropylidene) diphthalimide, tris(3,5-dimethyl-4-cyanatebenzyl) isocyanurate, 2-phenyl-3,3-bis(4-cyanatephenyl)phthalimidine, 2-(4-methylphenyl)-3,3-bis(4-cyanatephenyl)phthalimidine, 2-phenyl-3,3-bis(4-cyanate-3-methylphenyl)phthalimidine, 1-methyl-3,3-bis(4-cyanatephenyl)indolin-2-one, and 2-phenyl-3,3-bis(4-cyanatephenyl)indolin-2-one.

One of these cyanate compounds can be used, or two or more thereof can be appropriately mixed and used.

Other specific examples of the cyanate compound represented by the formula (31) include those obtained by cyanation of a phenolic resin such as a phenol novolac resin and a cresol novolac resin (those obtained by reacting phenol, an alkyl-substituted phenol or a halogen-substituted phenol with a formaldehyde compound such as formalin or paraformaldehyde in an acidic solution, using a publicly known method), a trisphenol novolac resin (those obtained by reacting hydroxybenzaldehyde with phenol in the presence of an acidic catalyst), a fluorene novolac resin (those obtained by reacting a fluorenone compound with a 9,9-bis(hydroxyaryl)fluorene in the presence of an acidic catalyst), a phenol aralkyl resin, a cresol aralkyl resin, a naphthol aralkyl resin, and a biphenyl aralkyl resin (those obtained by reacting a bishalogenomethyl compound as represented by $Ar_4$—$(CH_2Y)_2$ (wherein $Ar_4$ represents a phenyl group and Y represents a halogen atom. The same applies in this paragraph.) with a phenolic compound with an acidic catalyst or with no catalyst, those obtained by reacting a bis(alkoxymethyl) compound as represented by $Ar_4$—$(CH_2OR)_2$ (wherein R represents an alkyl group) with a phenolic compound in the presence of an acidic catalyst, or those obtained by reacting a bis(hydroxymethyl) compound as represented by $Ar_4$—$(CH_2OH)_2$ with a phenolic compound in the presence of an acidic catalyst, or those obtained by polycondensing an aromatic aldehyde compound, an aralkyl compound, and a phenolic compound, using a publicly known method), a phenol-modified xylene formaldehyde resin (those obtained by reacting a xylene formaldehyde resin with a phenolic compound in the presence of an acidic catalyst, using a publicly known method), a modified naphthalene formaldehyde resin (those obtained by reacting a naphthalene formaldehyde resin with a hydroxy-substituted aromatic compound in the presence of an acidic catalyst, using a publicly known method), a phenol-modified dicyclopentadiene resin, or a phenolic resin having a polynaphthylene ether structure (those obtained by subjecting a polyvalent hydroxynaphthalene compound having two or more phenolic hydroxy groups in one molecule to dehydration condensation in the presence of a basic catalyst, using a publicly known method) by a method similar to the above, and a prepolymer thereof. One of these cyanate compounds can be used, or two or more thereof can be appropriately mixed and used.

The method for producing these cyanate compounds is not particularly limited, and a publicly known method can be used. Specific examples thereof include acquisition or synthesis of a hydroxy group containing compound having a desired backbone and cyanation of that compound by modifying the hydroxy group by a publicly known method. Examples of the approach for the cyanation of hydroxy groups include, for example, the approach described in Ian Hamerton, "Chemistry and Technology of Cyanate Ester Resins, "Blackie Academic & Professional.

The cured product using these cyanate compounds has characteristics of being more excellent in glass transition temperature, a low thermal expansion property, plating adhesiveness, and the like.

In the resin composition, the content of the cyanate compound is 0.01 to 40 parts by mass based on 100 parts by mass of the resin solid content in the resin composition.

<Phenolic Resin>

As the phenolic resin, those publicly known in general can be used as long as they are phenolic resins having two or more hydroxy groups in one molecule. Examples thereof include a bisphenol A-based phenolic resin, a bisphenol E-based phenolic resin, a bisphenol F-based phenolic resin, a bisphenol S-based phenolic resin, a phenol novolac resin, a bisphenol A novolac-based phenolic resin, a glycidyl ester-based phenolic resin, an aralkyl novolac-based phenolic resin, a biphenyl aralkyl-based phenolic resin, a cresol novolac-based phenolic resin, a polyfunctional phenolic resin, a naphthol resin, a naphthol novolac resin, a polyfunctional naphthol resin, an anthracene-based phenolic resin, a naphthalene backbone modified novolac-based phenolic resin, a phenol aralkyl-based phenolic resin, a naphthol aralkyl-based phenolic resin, a dicyclopentadiene-based phenolic resin, a biphenyl-based phenolic resin, an alicyclic phenolic resin, a polyol-based phenolic resin, a phosphorus containing phenolic resin, a polymerizable unsaturated hydrocarbon group containing phenolic resin, and a hydroxyl group containing silicone resin. One of these phenol resins can be used, or two or more thereof can be appropriately mixed and used.

In the resin composition, the content of the phenolic resin is 0.01 to 40 parts by mass based on 100 parts by mass of the resin solid content in the resin composition.

<Oxetane Resin>

As the oxetane resin, those publicly known in general can be used. Examples thereof include, for example, oxetane, an alkyloxetane such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluorooxetane, 2-chloromethyloxetane, 3,3-bis(chloromethyl) oxetane, biphenyl-based oxetane, OXT-101 (manufactured by Toagosei Co., Ltd., product name), OXT-121 (manufactured by Toagosei Co., Ltd., product name), and OXT-221 (manufactured by Toagosei Co., Ltd., product name). One of these oxetane resins can be used, or two or more thereof can be appropriately mixed and used.

In the resin composition, the content of the oxetane resin is 0.01 to 40 parts by mass based on 100 parts by mass of the resin solid content in the resin composition.

<Benzoxazine Compound>

As the benzoxazine compound, those publicly known in general can be used as long as they are compounds having two or more dihydrobenzoxazine rings in one molecule. Examples thereof include a bisphenol A-based benzoxazine BA-BXZ (product name, manufactured by Konishi Chemical Ind. Co., Ltd., product name), a bisphenol F-based benzoxazine BF-BXZ (product name, manufactured by Konishi Chemical Ind. Co., Ltd.), a bisphenol S-based benzoxazine BS-BXZ (product name, manufactured by Konishi Chemical Ind. Co., Ltd.), P-d-type benzoxazine (product name, manufactured by Shikoku Chemicals Corp.), F-a-type benzoxazine (product name, manufactured by Shikoku Chemicals Corp.), and a phenolphthalein-based benzoxazine. One of these benzoxazine compounds can be used, or two or more thereof can be appropriately mixed and used.

In the resin composition, the content of the benzoxazine compound is 0.01 to 40 parts by mass based on 100 parts by mass of the resin solid content in the resin composition.

<Epoxy Resin>

There is no particular limitation on the epoxy resin, and those publicly known in general can be used. Examples thereof include, for example, a bisphenol A based epoxy resin, a bisphenol E-based epoxy resin, a bisphenol F-based epoxy resin, a bisphenol S-based epoxy resin, a bisphenol A novolac-based epoxy resin, a biphenyl-based epoxy resin, a phenol novolac-based epoxy resin, a cresol novolac-based epoxy resin, a xylene novolac-based epoxy resin, a polyfunctional phenol-based epoxy resin, a naphthalene-based epoxy resin, a naphthalene backbone modified novolac-based epoxy resin, a naphthylene ether-based epoxy resin, a phenol aralkyl-based epoxy resin, an anthracene-based epoxy resin, a trifunctional phenol-based epoxy resin, a tetrafunctional phenol-based epoxy resin, triglycidyl isocyanurate, a glycidyl ester-based epoxy resin, an alicyclic epoxy resin, a dicyclopentadiene novolac-based epoxy resin, a biphenyl novolac-based epoxy resin, a phenol aralkyl novolac-based epoxy resin, a naphthol aralkyl novolac-based epoxy resin, an aralkyl novolac-based epoxy resin, a naphthol aralkyl-based epoxy resin, a dicyclopentadiene-based epoxy resin, a polyol-based epoxy resin, a phosphorus containing epoxy resin, a glycidyl amine, a compound obtained by epoxidizing a double bond of butadiene and the like, a compound obtained by the reaction between a hydroxyl group containing silicone resin and epichlorohydrin, and a halide thereof. One of these epoxy resins can be used, or two or more thereof can be appropriately mixed and used.

As the epoxy resin, commercial products can be used, and examples thereof include an epoxy resin represented by the formula (34) (NC-3000FH (product name) manufactured by Nippon Kayaku Co., Ltd., $n_5$ is about 4 in the formula (34)), and a naphthalene-based epoxy resin represented by the formula (35) (HP-4710 (product name) manufactured by DIC CORPORATION).

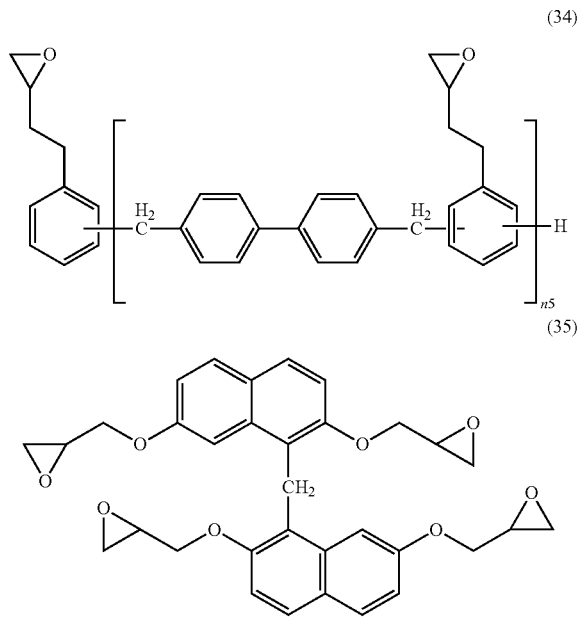

One of these epoxy resins can be used, or two or more thereof can be appropriately mixed and used.

In the resin composition, the content of the epoxy resin is 0.01 to 40 parts by mass based on 100 parts by mass of the resin solid content in the resin composition.

<Additional Compound>

Examples of the additional compound include a vinyl ether such as ethyl vinyl ether, propyl vinyl ether, hydroxyethyl vinyl ether, and ethylene glycol divinyl ether; a styrene such as styrene, methylstyrene, ethylstyrene, and divinylbenzene; triallyl isocyanurate, trimethallyl isocyanurate, and bisallylnadic imide. One of these compounds can be used, or two or more thereof can be appropriately mixed and used.

In the resin composition, the content of the additional compound is 0.01 to 40 parts by mass based on 100 parts by mass of the resin solid content in the resin composition.

[Organic Solvent]

The resin composition of the present embodiment may contain an organic solvent if required. When an organic solvent is used, the viscosity can be adjusted during the preparation of the resin composition. The type of the organic solvent is not particularly limited as long as it is capable of dissolving a part of or all of the resin in the resin composition.

Examples of an organic solvent include halogen solvents such as dichloromethane, chloroform, dichloroethane, and chlorobenzene; aprotic polar solvents such as dimethylformamide, dimethylacetamide, dimethylsulfoxide, tetrahydrofuran, dioxane, and acetonitrile; ketone solvents such as acetone, methyl ethyl ketone, methyl isobutyl keton, cyclopentanone, and cyclohexanone; cellosolve solvents such as 2-ethoxyethanol and propylene glycol monomethyl ether; aliphatic alcohol solvents such as methanol, ethanol, propanol, isopropanol, and butanol; aromatic group-containing phenol solvents such as phenol and cresol; ester solvents such as ethyl lactate, methyl acetate, ethyl acetate, butyl acetate, isoamyl acetate, methyl methoxypropionate, methyl hydroxyisobutyrate, γ-butyrolactone, and propylene glycol monomethyl ether acetate; aromatic hydrocarbon solvents such as toluene and xylene.

Among the above, an aprotic polar solvent, a ketone solvent, a cellosolve solvent, and an ester solvent are preferable from the viewpoint that the solvent can exhibit superior solubility in the bismaleimide compound (A), the initiator (B1), the initiator (B2), and the initiator (C), and the compound (D) and the compound (E) which are compounded if required, and furthermore, also in other resins and compounds, and an aprotic polar solvent, a ketone solvent, and an ester solvent are more preferable because superior solubility is exhibited.

The aprotic polar solvent is preferably dimethylacetamide. The ketone solvent is preferably methyl ethyl ketone. The cellosolve solvent is preferably propylene glycol monomethyl ether. The ester solvent is preferably butyl acetate, γ-butyrolactone, and propylene glycol monomethyl ether acetate.

One of these organic solvents can be used, or two or more thereof can be appropriately mixed and used.

[Additional Component]

In the resin composition of the present embodiment, a variety of polymer compounds such as thermosetting resins, thermoplastic resins and oligomers thereof, and elastomers, which have not been mentioned before; flame retardant compounds, which have not been mentioned before; additive agents and the like can also be used in combination to the extent that the characteristics of the present embodiment are not impaired. These are not particularly limited as long as they are those generally used. Examples of the flame retardant compound include, for example, a nitrogen containing compound such as melamine and benzoguanamine; an oxazine ring containing compound; and a phosphorus compound such as a phosphate compound, an aromatic fused phosphate ester, and a halogen containing fused phosphate ester. Examples of the additive agent include, for example, an ultraviolet absorbing agent, an antioxidant, a fluorescent brightening agent, a photosensitizer, a dye, a pigment, a thickening agent, a lubricant, a defoaming agent, a surface conditioner, a brightening agent, a polymerization inhibitor, and a thermal curing accelerator. One of these components can be used, or two or more thereof can be appropriately mixed and used.

In the resin composition, the content of the additional component is normally 0.1 to 10 parts by mass based on 100 parts by mass of the resin solid content in the resin composition.

[Method for Producing Resin Composition and Varnish]

The resin composition of the present embodiment can be prepared by appropriately mixing the bismaleimide compound (A), the initiator (B1) and/or the initiator (B2), the initiator (C), and if required, the compound (D), the maleimide compound (E), the additional maleimide compound, the filler, the additional resin, the additional compound, the additive, and the like. Examples of the method for producing the resin composition include a method in which each of the components described above is sequentially compounded in a solvent and stirred sufficiently.

Upon producing the resin composition, publicly known treatment (stirring, mixing, and kneading treatment and the like) for uniformly dissolving or dispersing each component can be carried out, if required. Specifically, by using a stirring tank equipped with a stirrer having an appropriate stirring capacity to carry out the stirring and dispersion treatment, the dispersibility of each component such as the bismaleimide compound (A), the initiator (B1) and/or the initiator (B2), and the initiator (C) in the resin composition can be improved. The stirring, mixing, and kneading treatment can be appropriately carried out by using a publicly known apparatus such as a stirring apparatus intended for dispersion such as an ultrasonic homogenizer; an apparatus intended for mixing such as a three roll mill, a ball mill, a bead mill, or a sand mill; or a revolution or rotation mixing apparatus. In addition, upon preparing the resin composition, an organic solvent can be used if required. The type of the organic solvent is not particularly limited as long as it is capable of dissolving the resin in the resin composition, and specific examples thereof are as described above.

The resin composition can be suitably used as a varnish upon fabricating a resin sheet of the present embodiment, which will be mentioned later. The varnish can be obtained by a publicly known method. For example, the varnish can be obtained by adding 10 to 900 parts by mass, preferably 30 to 500 parts by mass of an organic solvent to 100 parts by mass of components other than the organic solvent in the resin composition and carrying out the publicly known treatment (stirring, mixing, and kneading treatment or the like). The organic solvent for use in the preparation of the varnish is not particularly limited, and specific examples thereof are as described above.

[Application]

The resin composition of the present embodiment can be suitably used in the fabrication of a multilayer printed wiring board and can be preferably used in applications where an insulation resin composition is required. For example, the resin composition of the present embodiment can be used for a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, a component embedding resin, and the like. Among the above, the resin composition can be suitably used for insulation layers of multilayer printed wiring boards or for solder resists because the resin composition is excellent in photocurability and alkaline developability.

[Cured Product]

The cured product can be obtained by curing the resin composition. The cured product can be obtained by, for example, melting the resin composition or dissolving the resin composition in a solvent, then pouring the resin composition into a mold, and curing the resin composition with light under normal conditions. It is preferable to cure the resin composition in a light wavelength range of 100 to 500 nm where curing is efficiently promoted by a photo initiator or the like.

[Resin Sheet]

A resin sheet of the present embodiment is a resin sheet with a support containing: a support; and a resin layer disposed on one surface or both surfaces of the support, wherein the resin layer contains the resin composition of the present embodiment. The resin sheet can be produced by applying the resin composition onto the support and drying the resultant. The resin layer in the resin sheet has excellent photocurability and alkaline developability.

As the support, those publicly known can be used and there is no particular limitation thereon, but it is preferably a resin film. Examples of the resin film include, for example, a polyimide film, a polyamide film, a polyester film, a polyethylene terephthalate (PET) film, a polybutylene terephthalate (PBT) film, a polypropylene (PP) film, a polyethylene (PE) film, a polyethylene naphthalate film, a polyvinyl alcohol film, and a triacetyl acetate film. Among the above, a PET film is preferable.

Preferably, the surface of the resin film is coated with a release agent in order to facilitate release from the resin layer. The thickness of the resin film is preferably in the range of 5 to 100 μm and more preferably in the range of 10 to 50 μm. When the thickness is less than 5 μm, the support tends to be easily torn at the time when the support is released before alkaline development, and when the thickness is greater than 100 μm, the resolution upon being exposed through the support tends to be reduced. In the present specification, the thickness can be measured using, for example, a micrometer.

In addition, in order to reduce light scattering during exposure, it is preferable that the resin film should have excellent transparency.

Furthermore, in the resin sheet, the resin layer thereof may be protected with a protective film.

By protecting the resin layer side with a protective film, adhesion of dust and the like to the surface of the resin layer and scratches can be prevented. As the protective film, a film composed of a material similar to the resin film can be used. The thickness of the protective film is preferably in the range of 1 to 50 μm and more preferably in the range of 5 to 40 μm. If the thickness is less than 1 μm, the handleability of the protective film tends to be reduced, and if the thickness is greater than 50 μm, the inexpensiveness tends to be poor. Note that it is preferable for the protective film to have a smaller adhesive force between the resin layer and the protective film than the adhesive force between the resin layer and the support.

Examples of the method for producing the resin sheet include a method in which the resin composition is applied to a support such as PET film and the organic solvent is removed by drying to produce the resin sheet.

The application method can be carried out by a publicly known method using, for example, a roll coater, a comma coater, a gravure coater, a die coater, a bar coater, a lip coater, a knife coater, a squeeze coater, or the like. The drying can be carried out by, for example, a method of heating in a dryer at 60 to 200° C. for 1 to 60 minutes.

The amount of organic solvent remaining in the resin layer is preferably 5% by mass or less based on the total mass of the resin layer from the viewpoint of further preventing diffusion of the organic solvent in the subsequent steps. It is preferable that the thickness of the resin layer should be 1 to 50 μm from the viewpoint of improving handleability.

The resin sheet can be preferably used for production of insulation layers of multilayer printed wiring boards.

[Multilayer Printed Wiring Board]

The multilayer printed wiring board in the present embodiment contains an insulation layer; and a conductor layer formed on one surface or both surfaces of the insulation layer, wherein the insulation layer contains the resin composition of the present embodiment. The insulation layer can also be obtained by, for example, laminating one or more of the resin sheets and curing them. For the number of laminations in the insulation layer and the conductor layer, the number of laminations can be appropriately set according to an intended application. The order of the insulation layer and the conductor layer is not particularly limited. The conductor layer may be a metal foil used for various printed wiring board materials, and examples thereof include metal foils of copper, aluminum and the like. Examples of the copper metal foil include a rolled copper foil and an electrolytic copper foil. The thickness of the conductor layer is normally 1 to 100 μm. In particular, it can be produced by the following method.

(Lamination Step)

In a lamination step, the resin layer side of the resin sheet is laminated to one surface or both surfaces of a circuit substrate using a vacuum laminator. Examples of the circuit substrate include, for example, a glass epoxy substrate, a metal substrate, a ceramic substrate, a silicon substrate, a semiconductor sealing resin substrate, a polyester substrate, a polyimide substrate, a BT resin substrate, and a thermosetting polyphenylene ether substrate. Note that a circuit substrate refers to a substrate in which a patterned conductor layer (circuit) is formed on one surface or both surfaces of a substrate as described above. Also, in a multilayer printed wiring board formed by alternately laminating a conductor layer and an insulation layer, a substrate in which one surface or both surfaces of the outermost layer of the multilayer printed wiring board are patterned conductor layers (circuits) is also included in the circuit substrate. Note that the insulation layer laminated on the multilayer printed wiring board may be an insulation layer obtained by laminating and curing one or more resin sheets of the present embodiment, or an insulation layer obtained by laminating one or more resin sheets of the present embodiment and one or more publicly known resin sheets different from the resin sheet of the present embodiment. Note that the mode in which the resin sheets of the present embodiment and the publicly known resin sheets different from the resin sheet of the present embodiment are laminated is not particularly limited. The surface of the conductor layer may be subjected to blackening treatment and/or roughening treatment by copper etching or the like in advance. In the lamination step, when the resin sheet has a protective film, the protective film is peeled off and removed. Then, the resin sheet and the circuit substrate are preheated if required, and while pressurizing and heating the resin layer of the resin sheet, it is crimped to the circuit substrate. In the present embodiment, a method of laminating the resin layer of the resin sheet to the circuit substrate under reduced pressure using a vacuum lamination method is suitably used.

As conditions of the lamination step, for example, it is preferable to perform the lamination under reduced pressure with a crimping temperature (lamination temperature) of 50 to 140° C., crimping pressure of 1 to 15 kgf/cm$^2$, crimping time of 5 to 300 seconds, and air pressure of 20 mmHg or less. Also, the lamination step may be in a batch type or in a continuous type using a roll. The vacuum lamination method can be carried out using a commercially available vacuum laminator. Examples of the commercially available vacuum laminator include, for example, a two-stage build-up laminator manufactured by Nikko-Materials Co., Ltd.

(Exposure Step)

In the exposure step, after providing the resin layer on the circuit substrate by the lamination step, a predetermined portion of the resin layer is irradiated with an active energy ray as a light source to cure the resin layer in the irradiated part. The compound (D) which is compounded if required does not inhibit photocuring reaction in the exposure step.

The irradiation may be performed through a mask pattern or may be performed by using the direct imaging method in which the irradiation is directly applied. Examples of the active energy ray include, for example, ultraviolet rays, visible rays of light, electron beam, and X-rays. The wavelength of the active energy ray is, for example, in the range of 200 to 600 nm. When an ultraviolet ray is used, the irradiation amount thereof is approximately 10 to 1000 mJ/cm$^2$. Upon producing a printed wiring board having a highly dense and highly detailed wiring formation (pattern) using the direct imaging method, it is preferable to use, for example, an active energy ray including a wavelength of 405 nm (h-line) as an active energy ray. When an active energy ray including a wavelength of 405 nm (h-line) is used, the irradiation amount is approximately 10 to 10,000 mJ/cm$^2$.

There are two exposure methods for passing through the mask pattern: the contact exposure method, in which the mask pattern is adhered to the multilayer printed wiring board, and the non-contact exposure method, in which parallel light rays are used to perform the exposure without adhering the mask pattern to the multilayer printed wiring board, but either method may be used. Also, when a support is present on the resin layer, it may be exposed from the top of the support, or it may be exposed after the support is removed.

(Alkaline Development Step)

When a support is not present on the resin layer, a portion which is not photocured directly in alkaline development (unexposed portion) is removed after the exposure step, and development is performed, whereby an insulation layer pattern can be formed.

When a support is present on the resin layer, the support is removed after the exposure step, and thereafter a portion which is not photocured in alkaline development (unexposed portion) is removed, and development is performed, whereby an insulation layer pattern can be formed.

The unexposed resin layer containing the resin composition of the present embodiment has excellent alkaline developability by containing the compound (D), so that it is possible to rapidly remove the unexposed resin composition.

It is therefore possible to obtain a printed wiring board having a highly detailed pattern.

In the case of alkaline development, the developing solution is not particularly limited as long as unexposed portion is selectively eluted, and alkaline developing solutions such as an aqueous tetramethylammonium hydroxide solution, an aqueous sodium carbonate solution, an aqueous potassium carbonate solution, an aqueous sodium hydroxide solution and an aqueous potassium hydroxide solution are used. In the present embodiment, it is more preferable to use an aqueous tetramethylammonium hydroxide solution. One of these alkaline developing solutions can be used, or two or more thereof can be appropriately mixed and used.

As the alkaline development method, for example, a known method such as dipping, paddling, spraying, shaking immersion, blushing and scraping can be carried out. In pattern formation, these development methods can be used in combination if necessary. As the development method, use of a high-pressure spray is suitable because the resolution is further improved. When the spraying method is employed, the spray pressure is preferably 0.02 to 0.5 MPa.

(Postbaking Step)

In the present embodiment, a postbaking step is carried out after the alkaline development step, thereby forming an insulation layer (cured product). Examples of the postbaking step include an ultraviolet irradiation step with a high pressure mercury lamp and a heating step using a clean oven, and these steps may be used in combination as well. When irradiating with ultraviolet ray, the irradiation amount thereof can be adjusted if required, and for example, the irradiation can be carried out at an irradiation amount of approximately 0.05 to 10 J/cm$^2$. Also, the conditions of heating can be appropriately selected if required, but they are preferably selected from the range of 20 to 180 minutes at 150 to 220° C., and more preferably from the range of 30 to 150 minutes at 160 to 200° C.

(Conductor Layer Formation Step)

After forming the insulation layer (cured product), a conductor layer is formed on the surface of the insulation layer by dry plating.

When the conductor layer is formed, the surface of the insulation layer may be subjected to surface modification treatment before dry plating. As the surface modification treatment, a known method such as plasma etching treatment, reverse sputtering treatment, and corona treatment can be used.

For the dry plating, a publicly known method such as a vapor deposition method, a sputtering method, and an ion plating method can be used. In the vapor deposition method (vacuum deposition method), for example, a metallic film can be formed on the insulation layer by placing the multilayer printed wiring board in a vacuum container and heating and evaporating the metal. In the sputtering method as well, for example, the multilayer printed wiring board is placed in a vacuum container, an inert gas such as argon is introduced, a direct current voltage is applied, the ionized inert gas is brought into collision with the target metal, and the knocked-out metal can be used to form a metallic film on the insulation layer.

Next, a conductor layer is formed by nonelectrolytic plating or electroplating. As a method of subsequent pattern formation, for example, a subtractive method, a semi-additive method, or the like can be used.

[Semiconductor Device]

A semiconductor device of the present embodiment contains the resin composition of the present embodiment. In particular, it can be produced by the following method. A semiconductor device can be produced by a mounting semiconductor chip at the conduction points on the multilayer printed wiring board. Here, the conduction points refer to the points in the multilayer printed wiring board where electrical signals are conveyed, and the locations thereof may be on the surface or at embedded points. In addition, the semiconductor chip is not particularly limited as long as they are electrical circuit elements made of semiconductors.

The method for mounting the semiconductor chip upon producing the semiconductor device is not particularly limited as long as the semiconductor chip effectively functions. Specific examples thereof include a wire bonding mounting method, a flip chip mounting method, a mounting method with a bumpless build-up layer (BBUL), a mounting method with an anisotropic conductive film (ACF), and a mounting method with a non-conductive film (NCF).

Alternatively, the semiconductor device can be produced by forming an insulation layer containing the resin composition on a semiconductor chip or a substrate on which semiconductor chip is mounted. The shape of the substrate on which semiconductor chip is mounted may be wafer-like or panel-like. After the formation, the semiconductor device can be produced using the same method as the multilayer printed wiring board described above.

EXAMPLES

The present embodiment will be more specifically described below using Examples and Comparative Examples. The present embodiment is not limited in any way by the following Examples.

[Synthesis Example 1] Synthesis of Photo Initiator (B1)

As the photo initiator (B1), a photo initiator (B1A) represented by the formula (16) was synthesized in accordance with the method described in the paragraph [0344] of Japanese Translation of PCT International Application Publication No. 2014-500852. The $^1$H-NMR measurement was carried out, and it was verified that the photo initiator was the photo initiator (B1A) represented by the formula (16).

The signals of $^1$H-NMR of the photo initiator (B1A) represented by the formula (16) are shown below. In addition, the $^1$H-NMR chart is shown in FIG. 1.

$^1$H-NMR (500 MHz, CDCl$_3$) δ (ppm): 9.54 (d, 1H), 8.72 (d, 1H), 8.36 (s, 1H), 8.29 (s, 1H), 7.79-7.77 (m, 2H), 7.61-7.56 (m, 3H), 7.25 (d, 2H), 7.07 (d, 1H), 7.00 (s, 2H), 5.36 (m, 1H), 4.80 (m, 2H), 4.38 (m, 2H), 2.43 (s, 3H), 2.32 (m, 1H), 2.19 (s, 6H), 2.07 (s, 3H), 1.38-1.22 (m, 8M), 0.92 (t, 3M), 0.84 (t, 3H)

[Synthesis Example 2] Synthesis of Photo Initiator (B2)

As the photo initiator (B1), a photo initiator (B2A) represented by the formula (17) was synthesized in accordance with the method described in the paragraph [0357] of Japanese Translation of PCT International Application Publication No. 2016-531926. The $^1$H-NMR measurement was carried out, and it was verified that the photo initiator was the photo initiator (B2A) represented by the formula (17).

Figure 2:
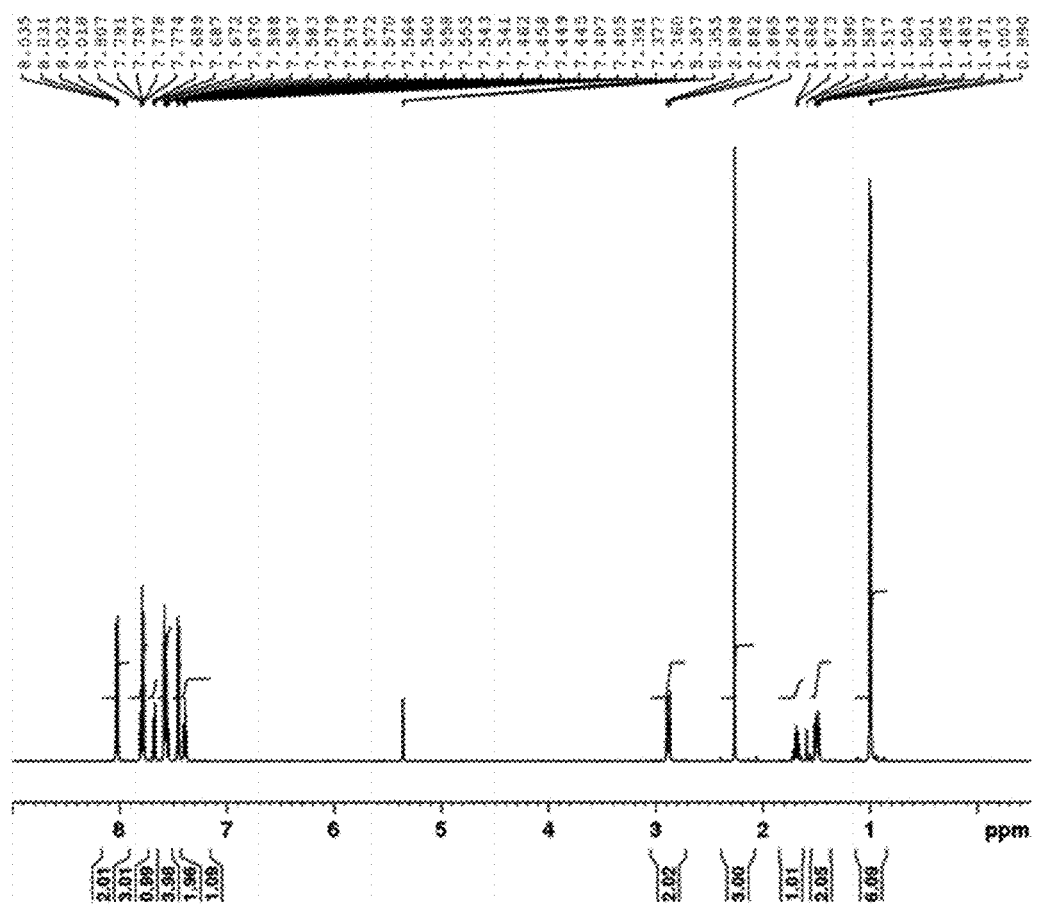
FIG. 2 shows a $^1$H-NMR chart of a photo initiator (B2A) obtained in Synthesis Example 2.

The signals of $^1$H-NMR of the photo initiator (B2A) represented by the formula (17) are shown below. In addition, the $^1$H-NMR chart is shown in FIG. 2.

¹H-NMR (500 MHz, CDCl₃) δ (ppm): 8.03 (m, 2H), 7.81-7.77 (m, 3H), 7.68 (d, 1H), 7.59-7.54 (m, 4H), 7.45 (m, 2H), 7.38 (m, 1H), 2.88 (m, 2H), 2.26 (s, 3H), 1.69 (m, 1H), 1.49 (m, 2H), 1.00 (s, 6H)

[Synthesis Example 3] Synthesis of Maleimide Compound (TMDM)

A compound represented by the formula (24) (TMDM) was synthesized as follows.
[Synthesis of Amide Acid Compound (Hereinafter, Abbreviated as MA-TMDA)]
First, MA-TMDA represented by the formula (36) was synthesized by the following method.

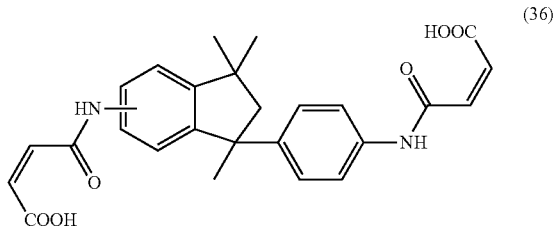

(36)

In a 100 mL four neck flask equipped with an argon inlet, a Dienstark apparatus, a Dimroth condenser tube and a thermometer, 5.2 g (53 mmol) of maleic anhydride, 20 mL of N-methylpyrrolidone (NMP) and 20 mL of toluene were added, and stirred under a stream of argon at room temperature (25° C.) to dissolve maleic anhydride completely. To this solution, 5.0 g (19 mmol) of TMDA (manufactured by Nipponjunryo Chemicals Co., Ltd., a mixture of 5-amino-1,3,3-trimethyl-1-(4-aminophenyl)-indane and 6-amino-1,3,3-trimethyl-1-(4-aminophenyl)-indane) and 10 mL of NMP were added, and the mixture was stirred at room temperature (25° C.) for 17 hours.

A fraction of the reaction solution was collected, water and ethyl acetate were added thereto, and the mixture was shaken. Thereafter, the organic layer was taken out and dried over magnesium sulfate. The solvent was distilled off from the supernatant at 40° C. to obtain a yellow oil. The ¹H-NMR measurement was carried out, and it was verified that the yellow oil was MA-TMDA represented by the formula (36).

Figure 3:
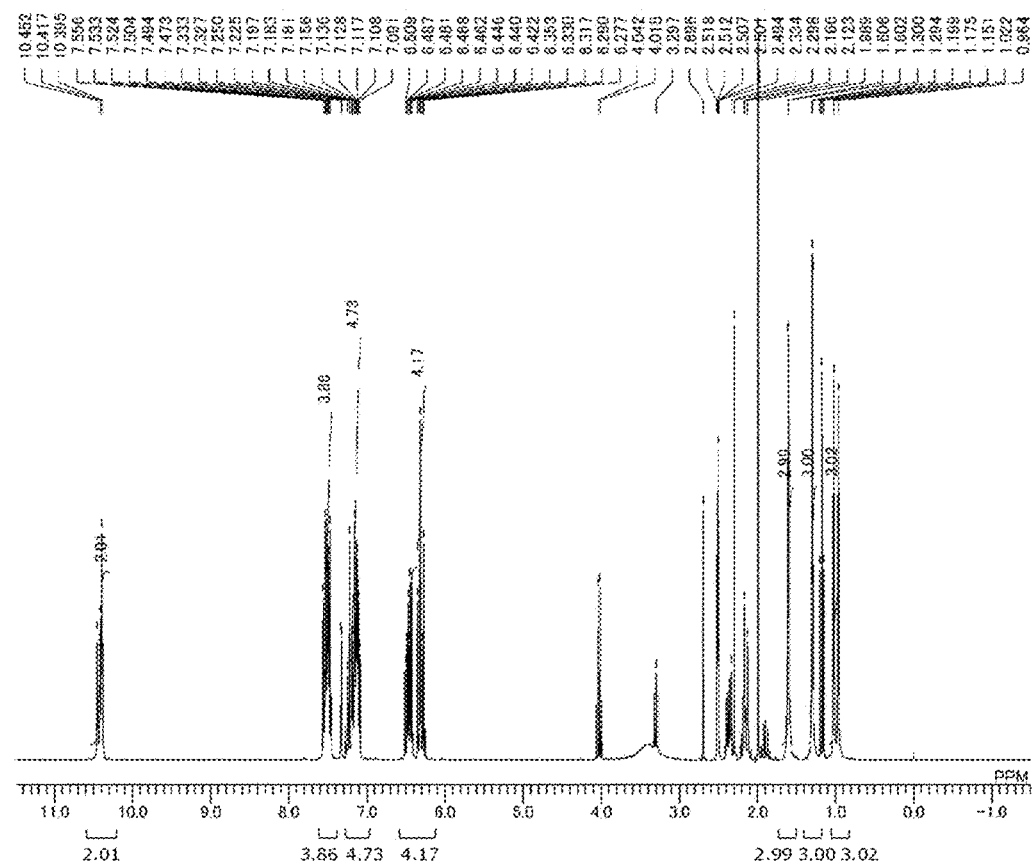
FIG. 3 shows a $^1$H-NMR chart of an amide acid compound (MA-TMDA).

The signals of ¹H-NMR of MA-TMDA represented by the formula (36) are shown below. In addition, the ¹H-NMR chart is shown in FIG. 3.

¹H-NMR (300 MHz, DMSO-d6) δ (ppm): 10.40 (m, 2H, —COOH), 7.30 (m, 7H, ArH), 6.33 (m, 4H, =CH—), 2.11 (m, 2H, —CH₂—), 1.48 (d, 3H, —CH₃), 1.21 (d, 3H, —CH₃), 0.92 (d, 3H, —CH₃)
[Synthesis of TMDM]
To the above reaction solution, 0.67 g (3.5 mmol) of p-toluenesulfonic acid monohydrate was added, and the mixture was heated to reflux at 127° C. for 2.5 hours. After the reaction solution was cooled to room temperature (25° C.), the reaction solution after cooling was poured into a mixed solution of 50 mL of saturated aqueous sodium bicarbonate solution and 100 mL of ethyl acetate while stirring. Furthermore, 100 mL of water and 100 mL of ethyl acetate were added thereto, and the mixture was stirred and allowed to stand for 5 minutes. Thereafter, the solution was separated, and the aqueous layer was extracted three times with 50 mL of ethyl acetate. All the organic layers were combined and washed once with 100 mL of water, once with 10 mL of brine, and twice with 5 mL of brine. The organic layer was dried over magnesium sulfate, the solids were filtered off, and thereafter, the solvent was distilled off at 40° C. to obtain a yellow solid.

The obtained yellow solid was dissolved in 6.5 mL of acetone, and the acetone solution was poured into 300 mL of water. The precipitated solid was collected by filtration, washed with a small amount of isopropyl alcohol (IPA), and thereafter, dried under reduced pressure at 50° C. for 20 hours to obtain 5.71 parts by mass of yellow solid. The ¹H-NMR measurement was carried out, and it was verified that the yellow solid was the maleimide compound (TMDM) represented by the formula (24).

Figure 4:
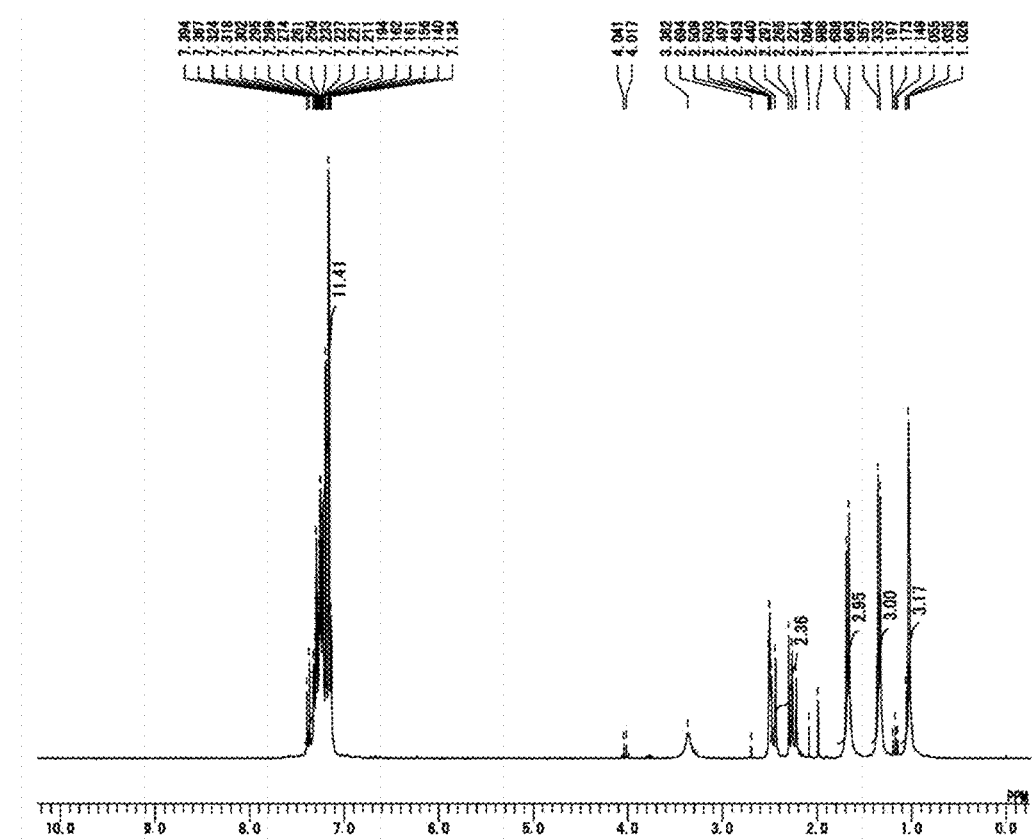
FIG. 4 FIG. 4 shows a $^1$H-NMR chart of a maleimide compound (TMDM).

The signals of ¹H-NMR of TMDM are shown below. In addition, the ¹H-NMR chart is shown in FIG. 4.

¹H-NMR (300 MHz, DMSO-d6) δ (ppm): 7.19 (m, 11H, ArH, —CH=CH—), 2.42 (m, 2H, —CH₂—), 1.66 (d, 3H, —CH₃), 1.32 (d, 3H, —CH₃), 1.00 (d, 3H, —CH₃)

[Synthesis Example 4] Synthesis of Compound Represented by Formula (20)

A compound (D1) represented by the formula (20) was synthesized as follows.

In a 200 mL flask, 12.52 g (50 mmol) of di(trimethylolpropane) (manufactured by Tokyo Kasei Kogyo Co., Ltd.), 41.62 g (210 mmol) of cis,cis-cyclohexane-1,2,4-tricarboxylic acid-1,2-anhydride (manufactured by Mitsubishi Gas Chemical Company, Inc., H-TMAn-S (product name)), 6.10 g (50 mmol) of 4-dimethylaminopyridine, 22.26 g of triethylamine, and 150 g of dichloromethane were added and stirred at room temperature (25° C.) for 9 hours.

To the reaction solution, 200 mL of 10% hydrochloric acid and 200 mL of methyl ethyl ketone were added, and the mixture was transferred to a separatory funnel, washed twice with 100 mL of 10% hydrochloric acid and twice with 150 mL of brine, and then dried over magnesium sulfate, thereby distilling off the solvent. The residue was dried in vacuum at 120° C., thereby obtaining 44.00 g of a white solid. As a result of carrying out the ¹H-NMR measurement, it was verified that the obtained white solid was the compound (D1) represented by the formula (20).

Figure 5:
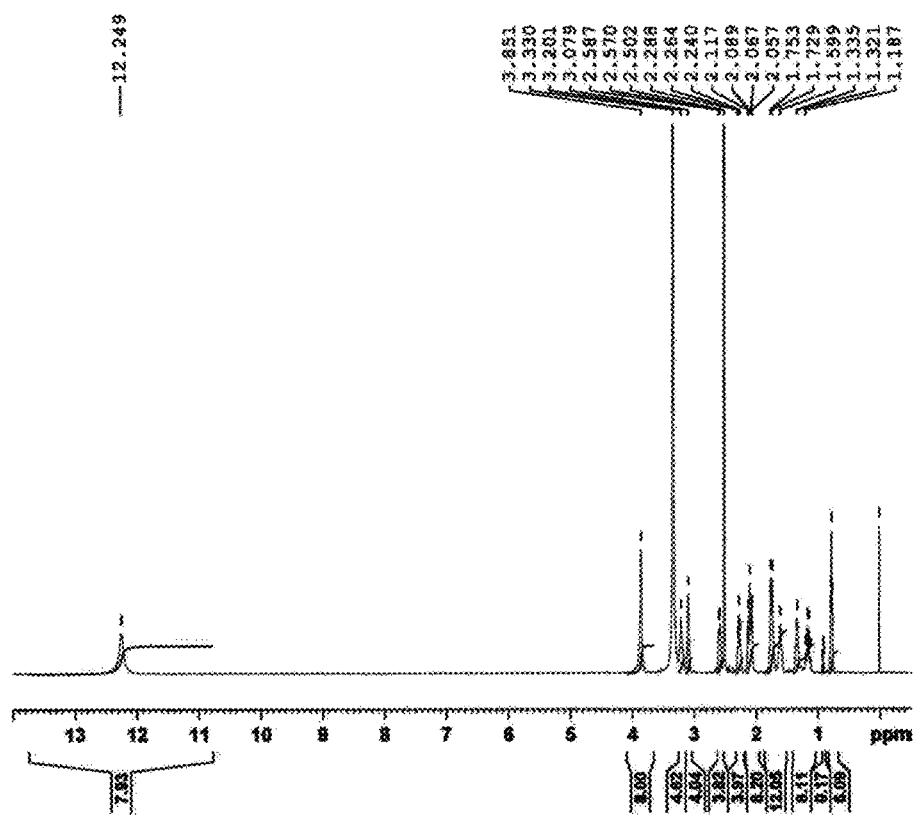
FIG. 5 shows a $^1$H-NMR chart of a compound (D1) obtained in Synthesis Example 4.

The signals of ¹H-NMR of the compound (D1) are shown below. In addition, the ¹H-NMR chart is shown in FIG. 5.

¹H-NMR (500 MHz, DMSO-d6) δ (ppm): 12.25 (s, 8H, —COOH), 3.85 (s, 8H), 3.20 (s, 4H), 3.08 (s, 4H), 2.58 (m, 4H), 2.26 (t, 4H), 2.09 (m, 8H), 1.74 (m, 8H), 1.60 (m, 4H), 1.33 (m, 4H), 1.15 (m, 4H), 0.78 (t, 6H)

The content percentage of the compound (D1) contained in the reaction solution was measured as to the above-obtained reaction solution by the following method.

To 4500 mg of THF (tetrahydrofuran), 50 mg of the reaction solution was added to prepare a sample solution. The solution was subjected to GPC measurement under conditions described below. A peak area was calculated from the obtained elution curve, and the GPC area fraction (content percentage) of each component contained in the reaction solution was calculated. The peak area was calculated from an area between the elution curve and the baseline and calculated by vertical partitioning as to an incompletely separated peak.

(Measurement Conditions)

Measurement equipment: Prominence (product name) manufactured by Shimadzu Corp.

Column: KF-801 (product name) manufactured by Showa Denko K.K., KF-802 (product name) manufactured by Showa Denko K.K., KF-803 (product name) manufactured by Showa Denko K.K., and KF-804 (product name) manufactured by Showa Denko K.K.

Flow rate: 1 mL/min

Column temperature: 40° C.

Detector: RI (refractive index) detector

As a result of the GPC measurement, the content percentage of the compound (D1) contained in the reaction solution was 88%.

[Evaluation of Raw Material]
[Transmittance and Absorbance]

As the bismaleimide compound (A), MIZ-001 (product name, mass average molecular weight (Mw): 3000) manufactured by Nippon Kayaku Co., Ltd. was used to prepare a chloroform solution containing this MIZ-001 (product name) at 1% by mass, and measurement of the transmittance at 405 nm was carried out using an UV-vis measuring apparatus (Hitachi Spectrophotometer U-4100 (product name) manufactured by Hitachi High-Technologies Corporation).

In the same manner, measurement of the transmittance at 405 nm was carried out as to the compound (TMDM) represented by the formula (24) which was obtained in Synthesis Example 3, and a compound represented by the formula (25) (BCPH13 (product name) manufactured by Gunei Chemical Industry Co., Ltd.) as the maleimide compounds (D).

As the photo initiator (B1), the photo initiator (B1A) obtained in Synthesis Example 1 was used to prepare a chloroform solution containing this photo initiator (B1A) at 0.01% by mass, and measurement of the absorbance at 405 nm was carried out using an UV-vis measuring apparatus (U-4100 (product name)).

In the same manner, as the photo initiator (B2), the photo initiator (B2A) obtained in Synthesis Example 2, and as the photo initiator (C), bis(2,4,6-trimethylbenzoyl)-phenylphosphine oxide (Omnirad (registered trademark) 819 (product name) manufactured by IGM Resins B.V.), 1,2-octanedione, 1-[4-(phenylthio)-, 2-(O-benzyloxime)] (Irgacure (registered trademark) OXE01 (product name) manufactured by BASF Japan Ltd.), and ethanone, 1-[9-ethyl-6-(2-methylbenzoyl)-9H-carbazol-3-yl]-, 1-(O-acetyloxime) (Irgacure (registered trademark) OXE02 (product name) manufactured by BASF Japan Ltd.) were used, and measurement of the absorbance at 405 nm was carried out.

As the compound (D), the compound (D1) obtained in Synthesis Example 4 was used to prepare a N-methylpyrrolidone solution containing this compound (D1) at 1% by mass, and measurement of the transmittance at 405 nm was carried out using an UV-vis measuring apparatus (Hitachi Spectrophotometer U-4100 manufactured by Hitachi High-Technologies Corporation).

In the same manner, cis,cis-1,2,4-cyclohexanetricarboxylic acid-1,2-anhydride (H-TMAn-S (product name) manufactured by Mitsubishi Gas Chemical Company, Inc.) was used as the compound (C), and measurement of the transmittance at 405 nm was carried out.

These results are shown in Table 1.

TABLE 1

| | | Transmittance at 405 nm [%] | Absorbance at 405 nm [—] |
|---|---|---|---|
| Bismaleimide compound (A) | MIZ-001 | 96 | — |
| Compound (E) | TMDM | 0 | — |
| | BCPH01 | 13 | — |
| Photo initiator (B) | B1A | — | 0.047 |
| | B2A | — | 0.033 |
| Photo initiator (C) | Omnirad819 | — | 0.175 |
| Photo initiator | Irgacure OXE01 | — | 0.049 |
| | Irgacure OXE02 | — | 0.001 |
| Compound (D) | Compound (D1) | 79 | — |
| | H-TMAn-S | 100 | — |

Example 1

(Fabrication of Resin Composition and Resin Sheet)

60 parts by mass of MIZ-001 (product name, mass average molecular weight (Mw): 3000) manufactured by Nippon Kayaku Co., Ltd. as the bismaleimide compound (A), 1.30 parts by mass of the compound (B1A) as the photo initiator (B1), 3.70 parts by mass of bis(2,4,6-trimethylbenzoyl)-phenylphosphine oxide (Omnirad (registered trademark) 819 (product name) manufactured by IGM Resins B.V.) as the photo initiator (C), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 212.3 parts by mass of methyl ethyl ketone (MEK) were added thereto, and the mixture was heated on a hot plate heated to 90° C., thereby obtaining a varnish (resin composition). This varnish was added dropwise onto a PET film with a thickness of 25 μm (Unipeel (registered trademark) TR1-25 (product name) manufactured by UNITIKA LTD.), and a coating film was formed by spin coating (at 500 rpm for 10 seconds, and thereafter, at 1000 rpm for 30 seconds). The obtained coating film was dried at 90° C. for 5 minutes to obtain a resin sheet in which the PET film was used as a support and the thickness of the resin layer was 5 μm.

(Fabrication of Laminate for Evaluation)

The obtained resin sheet was placed such that the resin surface of the resin sheet faced the oxide film side of a silicon wafer (manufactured by Advantec Co., Ltd., thickness: 625 μm, with an oxide film (thickness: 1 μm)). A vacuum laminator (manufactured by Nikko-Materials Co., Ltd.) was used to perform vacuum drawing (5.0 hPa or less) for 30 seconds. Thereafter, lamination molding was performed at a pressure of 10 kgf/cm² and a temperature of 100°

C. for 30 seconds. Furthermore, by performing lamination molding at a pressure of 7 kgf/cm$^2$ and a temperature of 100° C. for 60 seconds, a laminate for evaluation in which the silicon wafer, the resin layer, and the support were laminated was obtained.

Example 2

60 parts by mass of MIZ-001 (product name, mass average molecular weight (Mw): 3000) manufactured by Nippon Kayaku Co., Ltd. as the bismaleimide compound (A), 4.25 parts by mass of the compound (B1A) as the photo initiator (B1), 0.75 parts by mass of bis(2,4,6-trimethylbenzoyl)-phenylphosphine oxide (Omnirad (registered trademark) 819 (product name) manufactured by IGM Resins B.V.) as the photo initiator (C), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 212.3 parts by mass of methyl ethyl ketone (MEK) were added thereto, and the mixture was heated on a hot plate heated to 90° C., thereby obtaining a varnish (resin composition).

Using the obtained varnish, a resin sheet and a laminate for evaluation were obtained in the same manner as in Example 1.

Example 3

60 parts by mass of MIZ-001 (product name, mass average molecular weight (Mw): 3000) manufactured by Nippon Kayaku Co., Ltd. as the bismaleimide compound (A), 6.38 parts by mass of the compound (B1A) as the photo initiator (B1), 1.12 parts by mass of bis(2,4,6-trimethylbenzoyl)-phenylphosphine oxide (Omnirad (registered trademark) 819 (product name) manufactured by IGM Resins B.V.) as the photo initiator (C), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 217.0 parts by mass of methyl ethyl ketone (MEK) were added thereto, and the mixture was heated on a hot plate heated to 90° C., thereby obtaining a varnish (resin composition).

Using the obtained varnish, a resin sheet and a laminate for evaluation were obtained in the same manner as in Example 1.

Example 4

60 parts by mass of MIZ-001 (product name, mass average molecular weight (Mw): 3000) manufactured by Nippon Kayaku Co., Ltd. as the bismaleimide compound (A), 7.40 parts by mass of the compound (B1A) as the photo initiator (B1), 2.60 parts by mass of bis(2,4,6-trimethylbenzoyl)-phenylphosphine oxide (Omnirad (registered trademark) 819 (product name) manufactured by IGM Resins B.V.) as the photo initiator (C), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 221.6 parts by mass of methyl ethyl ketone (MEK) were added thereto, and the mixture was heated on a hot plate heated to 90° C., thereby obtaining a varnish (resin composition).

Using the obtained varnish, a resin sheet and a laminate for evaluation were obtained in the same manner as in Example 1.

Example 5

60 parts by mass of MIZ-001 (product name, mass average molecular weight (Mw): 3000) manufactured by Nippon Kayaku Co., Ltd. as the bismaleimide compound (A), 6.38 parts by mass of the compound (B2A) as the photo initiator (B2), 1.12 parts by mass of bis(2,4,6-trimethylbenzoyl)-phenylphosphine oxide (Omnirad (registered trademark) 819 (product name) manufactured by IGM Resins B.V.) as the photo initiator (C), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 217.0 parts by mass of methyl ethyl ketone (MEK) were added thereto, and the mixture was heated on a hot plate heated to 90° C., thereby obtaining a varnish (resin composition).

Using the obtained varnish, a resin sheet and a laminate for evaluation were obtained in the same manner as in Example 1.

Comparative Example 1

60 parts by mass of MIZ-001 (product name, mass average molecular weight (Mw): 3000) manufactured by Nippon Kayaku Co., Ltd. as the bismaleimide compound (A), 3.70 parts by mass of bis(2,4,6-trimethylbenzoyl)-phenylphosphine oxide (Omnirad (registered trademark) 819 (product name) manufactured by IGM Resins B.V.) as the photo initiator (C), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 1.30 parts by mass of ethanone, 1-[9-ethyl-6-(2-methylbenzoyl)-9H-carbazol-3-yl]-, 1-(O-acetyloxime) (Irgacure (registered trademark) OXE02 (product name) manufactured by BASF Japan Ltd.) as a photo initiator, 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 212.3 parts by mass of methyl ethyl ketone (MEK) were added thereto, and the mixture was heated on a hot plate heated to 90° C., thereby obtaining a varnish (resin composition).

Using the obtained varnish, a resin sheet and a laminate for evaluation were obtained in the same manner as in Example 1.

Comparative Example 2

60 parts by mass of MIZ-001 (product name, mass average molecular weight (Mw): 3000) manufactured by Nippon Kayaku Co., Ltd. as the bismaleimide compound (A), 5.00 parts by mass of bis(2,4,6-trimethylbenzoyl)-phenylphosphine oxide (Omnirad (registered trademark) 819 (product name) manufactured by IGM Resins B.V.) as the photo initiator (C), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 212.3 parts by mass of methyl ethyl ketone (MEK) were added thereto, and the mixture was heated on a hot plate heated to 90° C., thereby obtaining a varnish (resin composition).

Using the obtained varnish, a resin sheet and a laminate for evaluation were obtained in the same manner as in Example 1.

Comparative Example 3

60 parts by mass of MIZ-001 (product name, mass average molecular weight (Mw): 3000) manufactured by Nippon Kayaku Co., Ltd. as the bismaleimide compound (A), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 5.00 parts by mass of 1,2-octanedione, 1-[4-(phenylthio)-, 2-(O-benzoyloxime)] (Irgacure (registered trademark) OXE01 (product name) manufactured by BASF Japan Ltd.) as a photo initiator, 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 212.3 parts by mass of methyl ethyl ketone (MEK) were added thereto, and the mixture was heated on a hot plate heated to 90° C., thereby obtaining a varnish (resin composition).

Using the obtained varnish, a resin sheet and a laminate for evaluation were obtained in the same manner as in Example 1.

Comparative Example 4

60 parts by mass of MIZ-001 (product name, mass average molecular weight (Mw): 3000) manufactured by Nippon Kayaku Co., Ltd. as the bismaleimide compound (A), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 5.00 parts by mass of ethanone, 1-[9-ethyl-6-(2-methylbenzoyl)-9H-carbazol-3-yl]-, 1-(O-acetyloxime) (Irgacure (registered trademark) OXE02 (product name) manufactured by BASF Japan Ltd.) as a photo initiator, 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 212.3 parts by mass of methyl ethyl ketone (MEK) were added thereto, and the mixture was heated on a hot plate heated to 90° C., thereby obtaining a varnish (resin composition).

Using the obtained varnish, a resin sheet and a laminate for evaluation were obtained in the same manner as in Example 1.

Comparative Example 5

60 parts by mass of MIZ-001 (product name, mass average molecular weight (Mw): 3000) manufactured by Nippon Kayaku Co., Ltd. as the bismaleimide compound (A), 7.40 parts by mass of the compound (B2A) as the photo initiator (B2), 5.25 parts by mass of the compound (D1) represented by the formula (20) as the compound (D), 25 parts by mass of the compound represented by the formula (25) (BCPH01 (product name) manufactured by Gunei Chemical Industry Co., Ltd.) as the maleimide compound (E), 15 parts by mass of the compound represented by the formula (24) (TMDM) as the maleimide compound (E), 1.08 parts by mass of cis,cis-cyclohexane-1,2,4-tricarboxylic acid-1,2-anhydride (H-TMAn-S (product name) manufactured by Mitsubishi Gas Chemical Company, Inc.) as the compound (D), and 3.00 parts by mass of N-phenyl-3-aminopropyltrimethoxysilane (manufactured by Tokyo Kasei Kogyo Co., Ltd.), were mixed, 216.8 parts by mass of methyl ethyl ketone (MEK) were added thereto, and the mixture was heated on a hot plate heated to 90° C., thereby obtaining a varnish (resin composition).

Using the obtained varnish, a resin sheet and a laminate for evaluation were obtained in the same manner as in Example 1.

[Evaluation]

The resin sheets and the laminates for evaluations were measured and evaluated in accordance with the following methods. The results are shown in Table 2.

<Photocurability>

By using a photo DSC (DSC-2500 (brand name) manufactured by TA Instruments Japan Inc.) equipped with a light source (Omnicure (registered trademark) S2000 (product name) manufactured by U-VIX Corporation) that is capable of being irradiated with an active energy ray including a wavelength of 200 to 600 nm, and an optical filter (manufactured by Lumen Dynamics Group Inc., extraction wavelength: 400 nm to 460 nm), the obtained resin sheet was irradiated with an active energy ray including a wavelength of 405 nm at an illuminance of 30 mW and for an exposure time of 3.5 minutes, thereby obtaining a graph of time (sec) on the horizontal axis and heat flow (mW) on the vertical axis.

In each graph, the enthalpy (J/g) was defined as the peak area when a line was drawn horizontally from the endpoint of the graph. The curability was evaluated in accordance with the following criteria.

"AA": enthalpy was 1 (J/g) or more.
"CC": enthalpy was less than 1 (J/g).

extraction wavelength: 401 nm to 409 nm), the obtained laminate for evaluation was irradiated with an active energy ray including a wavelength of 405 nm from above the support via a chromium mask having a via pattern (via diameter: 20 μm) at an illuminance of 3 mW and an irradiation amount of 200 mJ/cm$^2$. Thereafter, the laminate was heated at 90° C. for 60 seconds from the silicon wafer surface using a hot plate heated to 90° C. Thereafter, the laminate was cooled to room temperature. Thereafter, the support (PET film) was peeled, and the laminate was shaken in aqueous 2.38% TMAH (tetramethylammonium hydroxide) solution (developing solution, manufactured by Tokuyama Corporation) of 35° C. for 180 seconds.

Thereafter, the via pattern was observed under an optical microscope, and the alkaline developability was evaluated in accordance with the following criteria.

"AA": a via of less than φ20 μm can be formed after development.

"CC": a via of less than φ20 μm cannot be formed after development.

TABLE 2

| | | Example 1 | Example 2 | Example 3 | Example 4 | Example 5 | Comparative Example 1 | Comparative Example 2 | Comparative Example 3 | Comparative Example 4 | Comparative Example 5 |
|---|---|---|---|---|---|---|---|---|---|---|---|
| Evaluation items | Photocurability (405 nm) | AA | AA | AA | AA | AA | CC | CC | CC | CC | AA |
| | Adhesiveness after development | AA | AA | AA | AA | AA | CC | CC | CC | CC | AA |
| | Alkaline developability | AA | AA | AA | AA | AA | CC | CC | CC | CC | CC |

Note that an enthalpy of 1 (J/g) or more means that the curing of the resin is sufficiently advanced by exposure at a predetermined wavelength.

<Adhesiveness after Development>

Using a light source capable of applying an active energy ray including a wavelength of 200 to 600 nm (MA-20 (product name) manufactured by MIKASA CO., LTD), and an optical filter (manufactured by MIKASA CO., LTD, extraction wavelength: 401 nm to 409 nm), the obtained laminate for evaluation was irradiated from above the support with an active energy ray including a wavelength of 405 nm at an illuminance of 3 mW and an irradiation amount of 200 mJ/cm$^2$. Thereafter, the laminate was heated at 90° C. for 60 seconds from the silicon wafer surface using a hot plate heated to 90° C. Thereafter, the laminate was cooled to room temperature. Thereafter, the support (PET film) was peeled, and the laminate was shaken in aqueous 2.38% TMAH (tetramethylammonium hydroxide) solution (developing solution, manufactured by Tokuyama Corporation) of 35° C. for 180 seconds. The adhesiveness was visually evaluated in accordance with the following criteria.

The adhesiveness after development was visually evaluated in accordance with the following criteria.

"AA": peeling of the exposed resin layer does not occur after development.

"CC": peeling of the exposed resin layer occurs after development.

<Alkaline Developability>

Using a light source capable of applying an active energy ray including a wavelength of 200 to 600 nm (MA-20 (product name) manufactured by MIKASA CO., LTD), and an optical filter (manufactured by MIKASA CO., LTD, Table 2 reveals that according to the present embodiment, the resin composition is properly light-sensitive and can be photocured when exposed with various active energy rays, in particular, an active energy ray including a wavelength of 405 nm (h-line). According to the present embodiment, a cured product having excellent alkaline developability can be obtained.

The present application is based on Japanese Patent Application No. 2021-099110 filed on Jun. 15, 2021, the contents of which are incorporated herein by reference.

INDUSTRIAL APPLICABILITY

The resin composition of the present embodiment has excellent photocurability for various active energy rays, in particular, a wavelength of 405 nm (h-line) in an exposure step, and can confer excellent alkaline developability in a development step, in the fabrication of a multilayer printed wiring board, and is therefore industrially useful, and can be used for applications including, a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin.

The invention claimed is:
1. A resin composition comprising:
a maleimide compound (A) comprising a constituent unit represented by the following formula (1), and maleimide groups at both ends of the molecular chain;

a photo initiator (B1) represented by the following formula (2) and/or a photo initiator (B2) represented by the following formula (3); and a photo initiator (C) represented by the following formula (4):

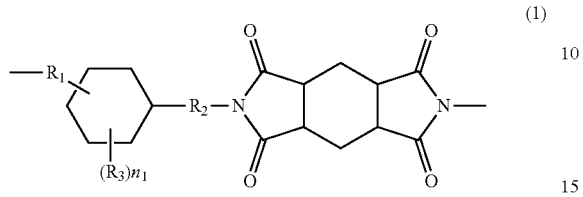

(1)

wherein $R_1$ represents a linear or branched alkylene group having 1 to 16 carbon atoms, or a linear or branched alkenylene group having 2 to 16 carbon atoms; $R_2$ represents a linear or branched alkylene group having 1 to 16 carbon atoms, or a linear or branched alkenylene group having 2 to 16 carbon atoms; each $R_3$ independently represents a hydrogen atom, a linear or branched alkyl group having 1 to 16 carbon atoms, or a linear or branched alkenyl group having 2 to 16 carbon atoms; and each $n_1$ independently represents an integer of 1 to 10,

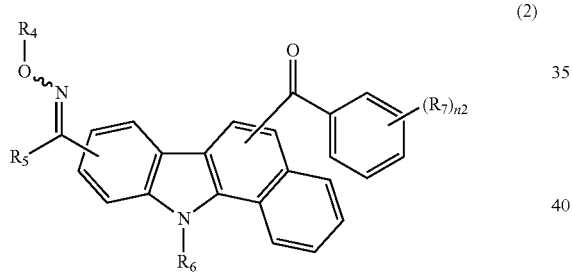

(2)

wherein $R_4$ represents an acetyl group or a benzoyl group; $R_5$ represents a phenyl group or naphthyl group optionally having a substituent; $R_6$ represents a hydrogen atom, or a linear or branched alkyl group having 1 to 16 carbon atoms and optionally having a substituent; each $R_7$ independently represents a hydrogen atom, or a linear or branched alkyl group having 1 to 6 carbon atoms and optionally having a substituent; and each $n_2$ independently represents an integer of 1 to 5,

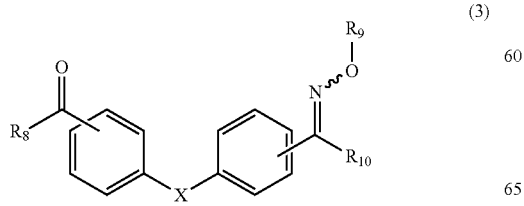

(3)

wherein $R_8$ represents an aryl group having 6 to 24 carbon atoms and optionally having a substituent, or a heteroaryl group having 3 to 24 carbon atoms and optionally having a substituent; $R_9$ represents an acetyl group or a benzoyl group; $R_{10}$ represents a hydrogen atom, or a linear or branched alkyl group having 1 to 16 carbon atoms and optionally having a substituent; and X represents an oxygen atom or a sulfur atom,

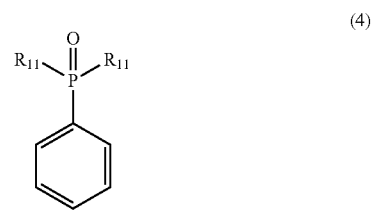

(4)

wherein each $R_{11}$ independently represents a group represented by the following formula (5) or a phenyl group:

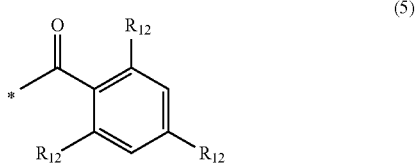

(5)

wherein —* represents a bonding site, and each $R_{12}$ independently represents a hydrogen atom or a methyl group.

2. The resin composition according to claim 1, further comprising a compound (D) comprising one or more carboxy groups.

3. The resin composition according to claim 2, wherein the compound (D) comprising one or more carboxy groups comprises a compound represented by the following formula (6):

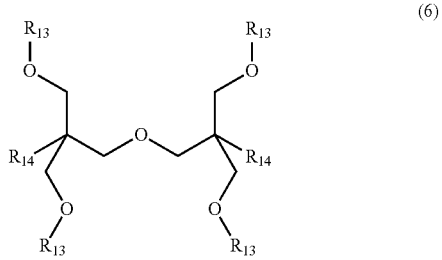

(6)

wherein each $R_{13}$ independently represents a group represented by the following formula (7) or a hydrogen atom; and each $R_{14}$ independently represents a hydrogen atom, or a linear or branched alkyl group having 1 to 6 carbon atoms, provided that at least one $R_{13}$ is a group represented by the following formula (7):

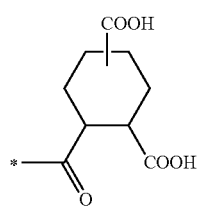

(7)

wherein —* represents a bonding site.

4. The resin composition according to claim 1, further comprising at least one maleimide compound (E) selected from the group consisting of a compound represented by the following formula (8), a compound represented by the following formula (9), a compound represented by the following formula (10), a compound represented by the following formula (11), a compound represented by the following formula (12), and a compound represented by the following formula (13):

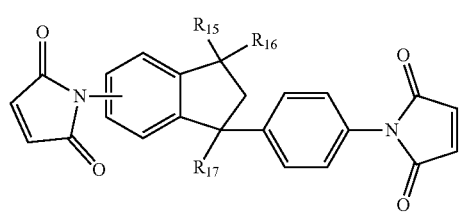

(8)

wherein each of $R_{15}$, $R_{16}$, and $R_{17}$ independently represents a hydrogen atom, or a linear or branched alkyl group having 1 to 8 carbon atoms and optionally having a substituent,

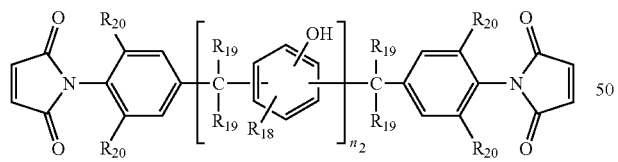

(9)

wherein each of $R_{18}$, $R_{19}$, and $R_{20}$ independently represents a hydrogen atom, a hydroxy group, or a linear or branched alkyl group having 1 to 6 carbon atoms and optionally having a substituent; and $n_2$ represents an integer of 1 to 10,

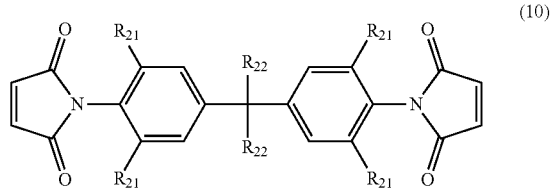

(10)

wherein each $R_{21}$ independently represents a hydrogen atom, a methyl group, or an ethyl group; and each $R_{22}$ independently represents a hydrogen atom or a methyl group,

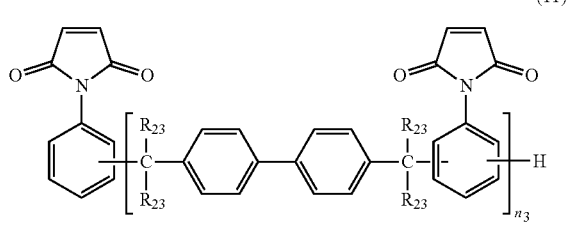

(11)

wherein each $R_{23}$ independently represents a hydrogen atom or a methyl group; and $n_3$ represents an integer of 1 to 10,

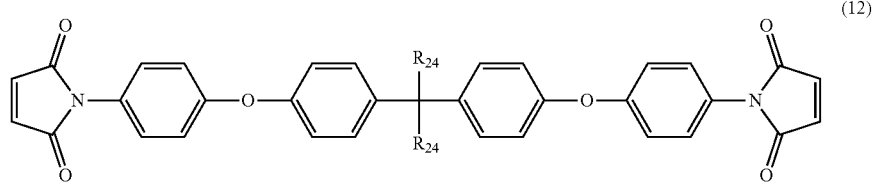

(12)

wherein each $R_{24}$ independently represents a hydrogen atom, a methyl group, or an ethyl group,

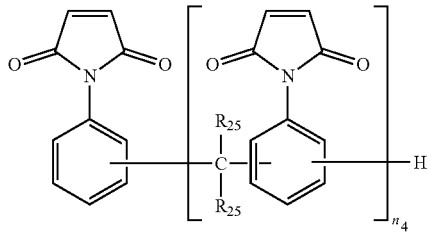

(13)

wherein each $R_{25}$ independently represents a hydrogen atom or a methyl group; and $n_4$ represents an integer of 1 to 10.

5. A resin sheet comprising:
   a support; and
   a resin layer disposed on one surface or both surfaces of the support,
   wherein the resin layer comprises the resin composition according to claim 1.

6. The resin sheet according to claim 5, wherein the resin layer has a thickness of 1 to 50 μm.

7. A multilayer printed wiring board comprising:
   an insulation layer; and
   a conductor layer formed on one surface or both surfaces of the insulation layer,
   wherein the insulation layer comprises the resin composition according to claim 1.

8. A semiconductor device comprising the resin composition according to claim 1.

* * * * *